US010062023B2

(12) United States Patent
Nishizaki

(10) Patent No.: US 10,062,023 B2
(45) Date of Patent: Aug. 28, 2018

(54) METHOD FOR CONCEALING HIDDEN-OBJECT INFORMATION, DEVICE AND PROGRAM FOR CONCEALING HIDDEN-OBJECT INFORMATION, METHOD FOR EXTRACTING HIDDEN-OBJECT INFORMATION, AND DEVICE FOR EXTRACTING HIDDEN-OBJECT INFORMATION

(71) Applicant: TOPPAN TDK LABEL CO., LTD., Tokyo (JP)

(72) Inventor: Tsutao Nishizaki, Kawasaki (JP)

(73) Assignee: Toppan TDK Label Co., Ltd., Tokyo (JP)

( * ) Notice: Subject to any disclaimer, the term of this patent is extended or adjusted under 35 U.S.C. 154(b) by 0 days.

(21) Appl. No.: 15/319,200

(22) PCT Filed: May 19, 2015

(86) PCT No.: PCT/JP2015/064335
§ 371 (c)(1),
(2) Date: Dec. 15, 2016

(87) PCT Pub. No.: WO2015/194298
PCT Pub. Date: Dec. 23, 2015

(65) Prior Publication Data
US 2017/0124442 A1    May 4, 2017

(30) Foreign Application Priority Data

Jun. 16, 2014 (JP) ................................. 2014-123332

(51) Int. Cl.
*G06K 19/06*    (2006.01)
*G06K 5/00*    (2006.01)
(Continued)

(52) U.S. Cl.
CPC . *G06K 19/06056* (2013.01); *G06K 19/06037* (2013.01)

(58) Field of Classification Search
CPC ............ G06K 19/06; G06K 5/00; G06K 7/01; G06K 7/10
(Continued)

(56) References Cited

U.S. PATENT DOCUMENTS 5,814,806 A    9/1998    Tanaka et al.
2005/0092844 A1    5/2005    Zhang et al.

FOREIGN PATENT DOCUMENTS

JP    H07-141477 A    6/1995
JP    2004-147006    5/2004
(Continued)

OTHER PUBLICATIONS

Masaki Kuramoto et al., "Secret Sharing Scheme in QR Code Considering the Size of Shares", IEICE Technical Report, Sep. 5, 2013 (Sep. 5, 2013), vol. 212, No. 212, pp. 25-30.
(Continued)

*Primary Examiner* — Daniel Hess
(74) *Attorney, Agent, or Firm* — Harness, Dickey & Pierce, P.L.C.

(57) ABSTRACT

A method for concealing hidden-object information using a first 2D barcode and a second 2D barcode, the first 2D barcode containing at least first closed information, the second 2D barcode containing at least second closed information, the method, including: generating the first 2D barcode, the first closed information of the first 2D barcode containing protection-encoding data ID, the protection-encoding data ID being for identifying protection-encoding data, the protection-encoding data being for protection-encoding the second 2D barcode; and generating a protection-encoded second 2D barcode by applying the protection-encoding data to at least a part of the second 2D barcode, the second closed information of the second 2D barcode containing the hidden-object information.

22 Claims, 34 Drawing Sheets

(51) Int. Cl.
*G06K 7/01* (2006.01)
*G06K 7/10* (2006.01)

(58) Field of Classification Search
USPC .................................................. 235/494, 437
See application file for complete search history.

(56) References Cited

FOREIGN PATENT DOCUMENTS

| JP | 2009-031969 | 2/2009 |
|---|---|---|
| JP | 2009-093443 A | 4/2009 |
| JP | 2010-061468 A | 3/2010 |

OTHER PUBLICATIONS

International Search Report (Japanese and English) for PCT/JP2015/064335, ISA/JP, Tokyo, dated Aug. 18, 2015.
Written Opinion of the ISA (Japanese) for PCT/JP2015/064335, ISA/JP, Tokyo, dated Aug. 18, 2015.
Supplementary European Search Report for corresponding European application EP 15809578, EPO, Munich, dated Jan. 19, 2018.
Talha Naqash et al, "Mutual authentication protocol for LTE based mobile networks", Open Source Systems and Technologies (ICOSST), 2012 International Conference on, IEEE, Dec. 20, 2012 (Dec. 20, 2012), pp. 1-4, XP032338704, DOI: 10.1109/ICOSST.2012.6472836 ISBN: 978-1-4673-3094-7.
Ferreira Ana et al: "Envisioning secure and usable access control for patients", 2014 IEEE 3rd International Conference on Serious Games and Applications for Health (SEGAH), IEEE, May 14, 2014 (May 14, 2014), pp. 1-8, XP032753052, DOI: 10.1109/SEGAH.2014.7067093 [retrieved on Mar. 24, 2015].

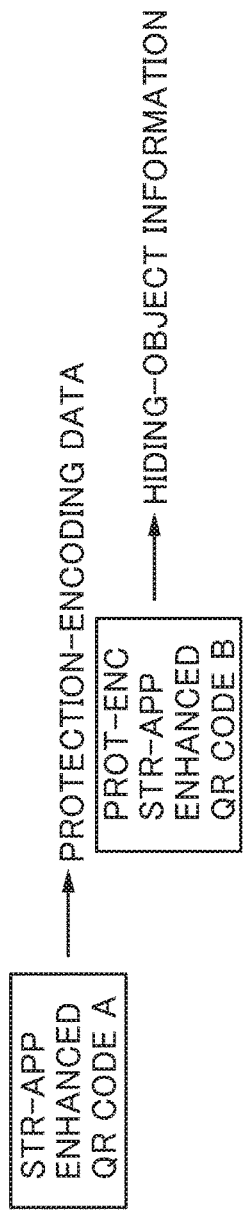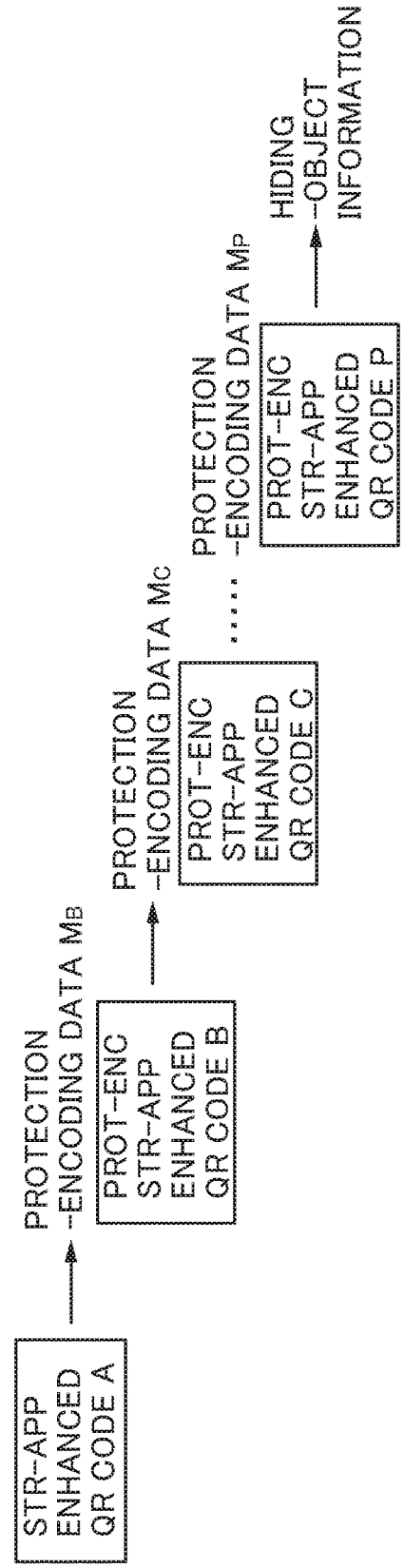
FIG. 15A
FIG. 15B

FIG. 20

METHOD FOR CONCEALING HIDDEN-OBJECT INFORMATION, DEVICE AND PROGRAM FOR CONCEALING HIDDEN-OBJECT INFORMATION, METHOD FOR EXTRACTING HIDDEN-OBJECT INFORMATION, AND DEVICE FOR EXTRACTING HIDDEN-OBJECT INFORMATION

CROSS-REFERENCE TO RELATED APPLICATIONS

This application is a 371 U.S. National Stage of International Application No. PCT/JP2015/064335, filed May 19, 2015, which claims the benefit of and priority to Japanese Patent Application No. 2014-123332, filed Jun. 16, 2014. The disclosures of the above applications are incorporated herein by reference.

TECHNICAL FIELD

The invention relates generally to information hiding. More particularly the invention relates to a method for concealing hidden-object information, a device and a program for concealing hidden-object information, a method for extracting hidden-object information and a device for extracting hidden-object information.

BACKGROUND ART

Japanese Industrial Standards (JIS) X 0510:2004 "Two dimensional symbol—QR code—" describes a technique of a two-dimensional (2D) barcode, by which a graphic code is read and information contained in the code is retrieved. There is also a technique for concealing hidden-object information (representing information not to be displayed) in such a 2D barcode. Concealing hidden-object information in a 2D barcode otherwise having a standard appearance can support applications in industries that handle cryptographic key information or personal information.

Patent Literature 1 discloses transmitting information using a 2D barcode. Patent Literature 2 discloses a delivery management system which can protect the personal information of a sender or a receiver.

CITATION LIST

Patent Literature

[Patent Literature 1] Japanese Unexamined Patent Application Publication No. 2004-147006
[Patent Literature 2] Japanese Unexamined Patent Application Publication No. 2009-31969

SUMMARY OF INVENTION

Technical Problem

Encrypting information codewords themselves represents one method for concealing hidden-object information. However, in such case, it is possible to at least read the 2D barcode containing the encrypted information codewords. Thus, there is a possibility that, after a plurality of 2D barcodes have been read, the encrypted information codewords can be obtained and decoded through cryptanalysis. In other words, there is a possibility that a third party can still extract the content of the information codewords and thereby read the hidden-object information. Accordingly, there remains a demand for appropriately protecting hidden-object information using a 2D barcode.

An aspect and advantage of the present invention is to appropriately protect hidden-object information using a 2D barcode.

Solution to Problem

As used herein, the term "open information" refers to information that is revealed or disclosed; the term "closed information" refers to information that is not revealed (i.e., secret information that is not disclosed). The term "hidden-objection information" refers to information that is masked or concealed. In order to achieve the above advantage, a method for concealing hidden-object information according to the present invention is a method for concealing hidden-object information using a first 2D barcode and a second 2D barcode,
the first 2D barcode containing at least first closed information,
the second 2D barcode containing at least second closed information,
the method, including:
generating the first 2D barcode,
the first closed information of the first 2D barcode containing protection-encoding data ID,
the protection-encoding data ID being for identifying protection-encoding data,
the protection-encoding data being for protection-encoding the second 2D barcode; and
generating a protection-encoded second 2D barcode by applying the protection-encoding data to at least a part of the second 2D barcode,
the second closed information of the second 2D barcode containing the hidden-object information.

In order to achieve the above advantage, a device for concealing hidden-object information according to the present invention is a device for concealing the hidden-object information using a first 2D barcode and a second 2D barcode,
the first 2D barcode containing at least first closed information,
the second 2D barcode containing at least second closed information,
the device, including:
generating the first 2D barcode,
the first closed information of the first 2D barcode containing protection-encoding data ID,
the protection-encoding data ID being for identifying protection-encoding data,
the protection-encoding data being for protection-encoding the second 2D barcode; and
generating a protection-encoded second 2D barcode by applying the protection-encoding data to at least a part of the second 2D barcode,
the second closed information of the second 2D barcode containing the hidden-object information.

In order to achieve the above advantage, a program according to the present invention is a program causing a computer to perform a method for concealing hidden-object information using a first 2D barcode and a second 2D barcode,
the first 2D barcode containing at least first closed information,
the second 2D barcode containing at least second closed information, the program causing a computer to perform the following processes:
  generating the first 2D barcode,
    the first closed information of the first 2D barcode containing protection-encoding data ID,
    the protection-encoding data ID being for identifying protection-encoding data,
    the protection-encoding data being for protection-encoding the second 2D barcode; and
  generating a protection-encoded second 2D barcode by applying the protection-encoding data to at least a part of the second 2D barcode,
    the second closed information of the second 2D barcode containing the hidden-object information.

In order to achieve the above advantage, a method for extracting hidden-object information according to the present invention is a method for extracting the hidden-object information from a first 2D barcode and a protection-encoded second 2D barcode,
  the first 2D barcode containing at least first closed information,
    the first closed information containing protection-encoding data ID,
  the protection-encoded second 2D barcode having been protection-encoded by applying protection-encoding data to a second 2D barcode,
    the second 2D barcode containing at least second closed information,
      the second closed information containing hidden-object information,
    the protection-encoding data being identified by the protection-encoding data ID,
  the method including:
    reading the first 2D barcode and the protection-encoded second 2D barcode;
    identifying the protection-encoding data based on the protection-encoding data ID;
    protection-decoding a protection-encoded codeword of the protection-encoded second 2D barcode using the protection-encoding data; and
    extracting the hidden-object information from the second 2D barcode that has been obtained by protection-decoding the protection-encoded codeword.

In order to achieve the above advantage, a device for extracting hidden-object information according to the present invention is a device for extracting the hidden-object information from a first 2D barcode and a protection-encoded second 2D barcode,
  the first 2D barcode containing at least first closed information,
    the first closed information containing protection-encoding data ID,
  the protection-encoded second 2D barcode having been protection-encoded by applying protection-encoding data to a second 2D barcode,
    the second 2D barcode containing at least second closed information,
      the second closed information containing hidden-object information,
    the protection-encoding data being identified by the protection-encoding data ID,
  the device including:
    reading the first 2D barcode and the protection-encoded second 2D barcode;
    identifying the protection-encoding data based on the protection-encoding data ID;
    protection-decoding a protection-encoded codeword of the protection-encoded second 2D barcode using the protection-encoding data; and
    extracting the hidden-object information from the second 2D barcode that has been obtained by protection-decoding the protection-encoded codeword.

In order to achieve the above advantage, a program according to the present invention is a program causing a computer to perform a method for extracting the hidden-object information from a first 2D barcode and a protection-encoded second 2D barcode,
  the first 2D barcode containing at least first closed information,
    the first closed information containing protection-encoding data ID,
  the protection-encoded second 2D barcode having been protection-encoded by applying protection-encoding data to a second 2D barcode,
    the second 2D barcode containing at least second closed information,
      the second closed information containing hidden-object information,
    the protection-encoding data being identified by the protection-encoding data ID,
  the program causing a computer to perform the following processes:
    reading the first 2D barcode and the protection-encoded second 2D barcode;
    identifying the protection-encoding data based on the protection-encoding data ID;
    protection-decoding a protection-encoded codeword of the protection-encoded second 2D barcode using the protection-encoding data; and
    extracting the hidden-object information from the second 2D barcode that has been obtained by protection-decoding the protection-encoded codeword.

Advantageous Effects of Invention

According to the invention, hidden-object information is contained in a package referred to herein as second closed information, second closed information being a kind of closed information (of which there are many choices), a second 2D barcode contains the second closed information, and the second 2D barcode is protection-encoded using protection-encoding data that serves as a mask. In addition, a protection-encoding data ID, used to represent or identify the protection-encoding data and is contained in the first 2D barcode as a package referred to herein as first closed information, also a kind of closed information. This makes it possible to protect appropriately hiding-object information using a 2D barcode.

BRIEF DESCRIPTION OF DRAWINGS

FIG. 15A is a diagram illustrating a relation between a Structured-Append (Str-App) enhanced QR code A and a protection-encoded Structured-Append (prot-enc Str-App) enhanced QR code B.

FIG. 15B is a diagram illustrating relations among a plurality of protection-encoded Structured-Append (prot-enc Str-App) enhanced QR codes.

FIG. 20 is a diagram illustrating a method for reading-out original data.

DESCRIPTION OF EMBODIMENTS

Figure 1:
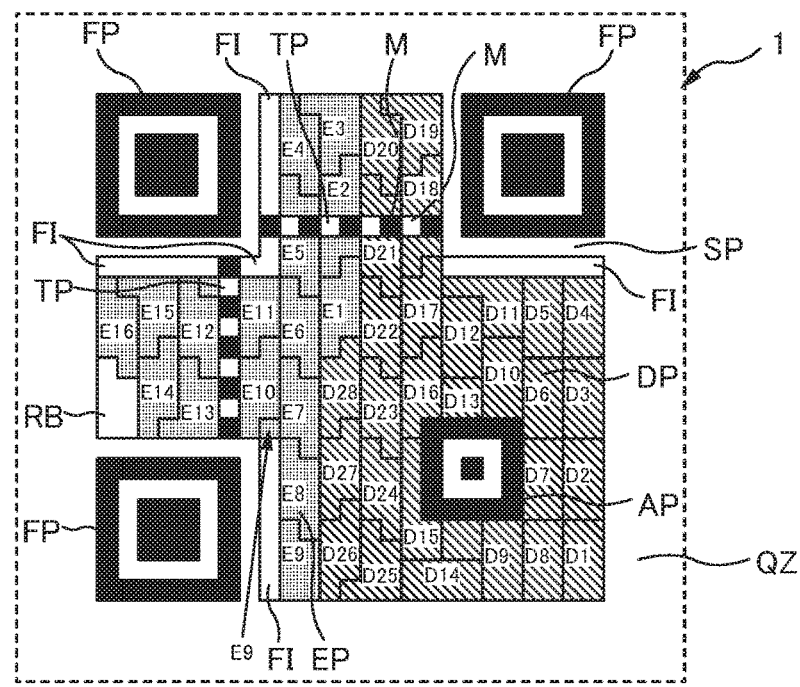
FIG. 1 is a diagram illustrating a QR code symbol 1.

With the description and the accompanied drawings, at least the following matters will be apparent.

A method for concealing hidden-object information using a first 2D barcode and a second 2D barcode,
the first 2D barcode containing at least first closed information,
the second 2D barcode containing at least second closed information,
the method, including:
generating the first 2D barcode,
the first closed information of the first 2D barcode containing protection-encoding data ID,
the protection-encoding data ID being for identifying protection-encoding data,
the protection-encoding data being for protection-encoding the second 2D barcode; and
generating a protection-encoded second 2D barcode by applying the protection-encoding data to at least a part of the second 2D barcode,
the second closed information of the second 2D barcode containing the hidden-object information.

With such a method, the hidden-object information is contained in the second closed information which is a kind of closed information, the second 2D barcode contains the second closed information, and the second 2D barcode is protection-encoded using the protection-encoding data. And, the protection-encoding data ID is for identifying the protection-encoding data and is contained in the first 2D barcode as the first closed information which is a kind of closed information. This makes it possible to protect appropriately hidden-object information using a 2D barcode.

In such a method for concealing the hidden-object information, it is preferable that applying the protection-encoding data is performed by XORing at least a part of the second 2D barcode with the protection-encoding data.

With such a method, it is possible to protection-encode at least a part of the second 2D barcode using the protection-encoding data.

Further, it is preferable that the first 2D barcode contains first open information, and that the first 2D barcode is generated based on a first replaced data block, the first replaced data block being obtained by replacing a part of a data block with a first closed data codeword, the data block containing a first open data codeword and a first correction codeword, the first closed data codeword containing the first closed information, the first open data codeword containing the first open information, the first correction codeword being capable of correcting an error of the first open data codeword.

In such a case, though the first open data codeword and the first correction codeword are replaced with the first closed data codeword, the first open data codeword can be corrected and recovered using the first correction codeword. The first open data codeword can be appropriately read-out. The first closed data codeword can be extracted from the first replaced data block, the first replaced data block having not undergone error correction and being obtained by directly reading the first 2D barcode.

Further, it is preferable that the number of the first closed data codewords is not greater than the number of words that are corrected with the first correction codewords.

With such a method, correction is made using the first correction codewords, and therefore the first open data codewords can be appropriately read-out.

Further, it is preferable that the first open data codeword contains first parity information, the second 2D barcode contains second open information, and the first parity information is parity information of information in which the first open information and the second open information are concatenated in a predetermined method.

With such a method, the first parity information is the parity information of information in which the first open information contained in the first 2D barcode and the second open information contained in the second 2D barcode are concatenated in the predetermined method. Accordingly, it is possible to use the first parity information in order to determine a relation between the first 2D barcode and the second 2D barcode.

Further, it is preferable that the second 2D barcode is generated based on a second replaced data block, the second replaced data block being obtained by replacing a part of a data block with a second closed data codeword, the data block containing a second open data codeword and a second correction codeword, the second closed data codeword containing the second closed information, the second open data codeword containing the second open information, the second correction codeword being capable of correcting an error of the second open data codeword.

In such a case, though the second open data codeword and the second correction codeword are replaced with the second closed data codeword, the second open data codeword can be corrected and recovered using the second correction codeword. The second open data codeword can be appropriately read-out. The second closed data codeword can be extracted from the second replaced data block, the second replaced data block having not undergone error correction and being obtained by directly reading the second 2D barcode.

Further, it is preferable that the number of the second closed data codewords is not greater than the number of words that are corrected with the second correction codewords.

With such a method, correction is made using the second correction codewords, and therefore the second open data codewords can be appropriately read-out.

Further, it is preferable that the second open data codeword contains second parity information, and that the second parity information is parity information of information in which the first open information and the second open information are concatenated in the predetermined method.

With such a method, the second parity information is the parity information of information in which the first open information contained in the first 2D barcode and the second open information contained in the second 2D barcode are concatenated in the predetermined method. Accordingly, it is possible to use the second parity information in order to determine a relation between the first 2D barcode and the second 2D barcode.

Further, it is preferable that the method further comprises: printing the first 2D barcode with a first ink; and printing the protection-encoded second 2D barcode with a second ink, the first ink and the second ink having different optical properties, and that the printings are performed so that either one of the first 2D barcode and the protection-encoded second 2D barcode is superposed on the other 2D barcode.

With such a method, For example, a colorless, infrared absorbing ink can be used as the first ink, and a colored ink which does not contain carbon black can be used as the second ink. This makes it difficult to specify the protection-encoding data from the first 2D barcode. This can makes more difficult to extract the hidden-object information from the protection-encoded second 2D barcode.

With the description and the accompanied drawings, at least the following matters will be apparent.

A device for concealing hidden-object information using a first 2D barcode and a second 2D barcode,
the first 2D barcode containing at least first closed information,
the second 2D barcode containing at least second closed information,
the device, including:
generating the first 2D barcode,
the first closed information of the first 2D barcode containing protection-encoding data ID,
the protection-encoding data ID being for identifying protection-encoding data,
the protection-encoding data being for protection-encoding the second 2D barcode; and
generating a protection-encoded second 2D barcode by applying the protection-encoding data to at least a part of the second 2D barcode,
the second closed information of the second 2D barcode containing the hidden-object information.

With such a device, the hidden-object information is contained in the second closed information which is a kind of closed information, the second 2D barcode contains the second closed information, and the second 2D barcode is protection-encoded using the protection-encoding data. And, the protection-encoding data ID is for identifying the protection-encoding data and is contained in the first 2D barcode as the first closed information which is a kind of closed information. This makes it possible to protect appropriately the hidden-object information using the 2D barcode.

With the description and the accompanied drawings, at least the following matters will be apparent.

A program causing a computer to perform a method for concealing hidden-object information using a first 2D barcode and a second 2D barcode,
the first 2D barcode containing at least first closed information,
the second 2D barcode containing at least second closed information,
the program causing a computer to perform the following processes:
generating the first 2D barcode,
the first closed information of the first 2D barcode containing protection-encoding data ID,
the protection-encoding data ID being for identifying protection-encoding data,
the protection-encoding data being for protection-encoding the second 2D barcode; and
generating a protection-encoded second 2D barcode by applying the protection-encoding data to at least a part of the second 2D barcode,
the second closed information of the second 2D barcode containing the hidden-object information.

With such a program, the hidden-object information is contained in the second closed information which is a kind of closed information, the second 2D barcode contains the second closed information, and the second 2D barcode is protection-encoded using the protection-encoding data. And, the protection-encoding data ID is for identifying the protection-encoding data and is contained in the first 2D barcode as the first closed information which is a kind of closed information. This makes it possible to protect appropriately the hidden-object information using the 2D barcode.

With the description and the accompanied drawings, at least the following matters will be apparent.

A method for extracting hidden-object information for extracting the hidden-object information from a first 2D barcode and a protection-encoded second 2D barcode, the first 2D barcode containing at least first closed information, the first closed information containing protection-encoding data ID, the protection-encoded second 2D barcode having been protection-encoded by applying protection-encoding data to a second 2D barcode, the second 2D barcode containing at least second closed information, the second closed information containing hidden-object information, the protection-encoding data being identified by the protection-encoding data ID, the method including:

reading the first 2D barcode and the protection-encoded second 2D barcode;

identifying the protection-encoding data based on the protection-encoding data ID;

protection-decoding a protection-encoded codeword of the protection-encoded second 2D barcode using the protection-encoding data; and extracting the hidden-object information from the second 2D barcode that has been obtained by protection-decoding the protection-encoded codeword.

With such a method, in order to extract the hidden-object information, the following steps are required: extracting the protection-encoding data ID from the first closed information of the first 2D barcode; protection-decoding the protection-encoded codeword of the protection-encoded second 2D barcode using the protection-encoding data, the protection-encoding data being identified by protection-encoding data ID; and extracting the hidden-object information from the second 2D barcode that has been obtained by protection-decoding the protection-encoded codeword, the hidden-object information being contained in the second closed information. This makes it possible to protect appropriately the hidden-object information using the 2D barcode.

Further, it is preferable that protection-decoding the protection-encoded codeword is performed by XORing at least a part of the protection-encoded second 2D barcode with the protection-encoding data.

With such a method, it is possible to protection-decode the protection-encoded codeword at least a part of the second 2D barcode using the protection-encoding data.

Further, it is preferable that the first 2D barcode contains first parity information, that the second 2D barcode contains second parity information, and that, under a condition that the first parity information coincides with the second parity information, the hidden-object information contained in the second closed information is extracted from the second 2D barcode which has been obtained by protection-decoding the protection-encoded codeword.

With such a method, a relation between the first 2D barcode and the second 2D barcode can be determined based on whether the first parity information contained in the first 2D barcode coincides with the second parity information contained in the second 2D barcode. The hidden-object information can be extracted after it has been confirmed that these pieces of parity information coincide and that they are related to each other.

Further, it is preferable that the first 2D barcode contains first open information, the second 2D barcode contains second open information, and that both of the first parity information and the second parity information are parity information of information in which the first open information and the second open information are concatenated in a predetermined method.

With such a method, the first parity information and the second parity information can be common parity information which has been generated based on common information in which the first open information and the second open information are concatenated in the predetermined method.

Further, it is preferable that the first 2D barcode is generated based on a first replaced data block, the first replaced data block being obtained by replacing a part of a data block with a first closed data codeword, the data block containing a first open data codeword and a first correction codeword, the first closed data codeword containing the first closed information, the first open data codeword containing the first open information, the first correction codeword being capable of detecting and correcting an error of the first open data codeword.

In such a case, though the first open data codeword and the first correction codeword are replaced with the first closed data codeword, the first open data codeword can be corrected and recovered using the first correction codeword. The first open data codeword can be appropriately read-out. The first closed data codeword can be extracted from the first replaced data block, the first replaced data block having not undergone error correction and being obtained by directly reading the first 2D barcode.

Further, it is preferable that concerning identifying the protection-encoding data that is applied to the second 2D barcode based on the first closed information contained in the first 2D barcode, the identifying further comprises: extracting the first closed data codeword from a predetermined position in the first replaced data block; and identifying the protection-encoding data based on the protection-encoding data ID contained in the first closed data codeword.

With such a method, the protection-encoding data that is applied to the second 2D barcode can be appropriately identified based on the first closed information contained in the first 2D barcode.

Further, it is preferable that the number of the first closed data codewords is not greater than the number of words that are corrected with the first correction codewords.

With such a method, correction is made using the first correction codewords, and therefore the first open data codewords can be appropriately read-out.

Further, it is preferable that the second 2D barcode is generated based on a second replaced data block, the second replaced data block being obtained by replacing a part of a data block with a second closed data codeword, the data block containing a second open data codeword and a second correction codeword, the second closed data codeword containing the second closed information, the second open data codeword containing the second open information, the second correction codeword being capable of detecting and correcting an error of the second open data codeword.

In such a case, though the second open data codeword and the second correction codeword are replaced with the second closed data codeword, the second open data codeword can be corrected and recovered using the second correction codeword. The second open data codeword can be appropriately read-out. The second closed data codeword can be extracted from the second replaced data block, the second replaced data block having not undergone error correction and being obtained by directly reading the second 2D barcode.

Further, it is preferable that concerning extracting the hidden-object information from the second 2D barcode that has been obtained by protection-decoding the protection-encoded codeword, the hidden-object information being contained in the second closed information, the extracting further comprises: extracting the second closed data codeword from a predetermined position in the second replaced data block; and extracting the hidden-object information contained in the second closed data codeword.

This makes it possible to appropriately extract the hidden-object information from the second 2D barcode which has been obtained by protection-decoding the protection-encoded codeword, the hidden-object information being contained in the second closed information.

Further, it is preferable that the number of the second closed data codewords is not greater than the number of words that are corrected with the second correction codewords.

With such a method, correction is made using the second correction codewords, and therefore the second open data codewords can be appropriately read-out.

Further, it is preferable that when the first 2D barcode and the protection-encoded second 2D barcode are printed so that either one of the first 2D barcode and the protection-encoded second 2D barcode is superposed on the other 2D barcode, and when the first 2D barcode is printed with a first ink and the protection-encoded second 2D barcode is printed with a second ink, the first ink and the second ink having different optical properties, the first 2D barcode is read using a first light source that is for reading a subject printed with the first ink, and the protection-encoded second 2D barcode is read using a second light source that is for reading a subject printed with the second ink.

With such a method, it is possible to appropriately read each of the first 2D barcode and the protection-encoded second 2D barcode even if colorless infrared absorbing ink is used as the first ink and a colored ink which does not contain carbon black is used as the second ink, for example. It is possible to extract the hidden-object information from the protection-encoded second 2D barcode.

With the description and the accompanied drawings, at least the following matters will be apparent.

A device for extracting the hidden-object information from a first 2D barcode and a protection-encoded second 2D barcode, the first 2D barcode containing at least first closed information,
the first closed information containing protection-encoding data ID,
the protection-encoded second 2D barcode having been protection-encoded by applying protection-encoding data to a second 2D barcode,
the second 2D barcode containing at least second closed information,
the second closed information containing hidden-object information,
the protection-encoding data being identified by the protection-encoding data ID,
the device including:
reading the first 2D barcode and the protection-encoded second 2D barcode;
identifying the protection-encoding data based on the protection-encoding data ID;
protection-decoding a protection-encoded codeword of the protection-encoded second 2D barcode using the protection-encoding data; and
extracting the hidden-object information from the second 2D barcode that has been obtained by protection-decoding the protection-encoded codeword.

With such a device, in order to extract the hidden-object information, the following steps are required: extracting the protection-encoding data ID from the first closed information of the first 2D barcode; protection-decoding the protection-encoded codeword of the protection-encoded second 2D barcode using the protection-encoding data, the protection-encoding data being identified by protection-encoding data ID; and extracting the hidden-object information from the second 2D barcode that has been obtained by protection-decoding the protection-encoded codeword, the hidden-object information being contained in the second closed information. This makes it possible to protect appropriately the hidden-object information using the 2D barcode.

With the description and the accompanied drawings, at least the following matters will be apparent.

A program causing a computer to perform a method for extracting the hidden-object information from a first 2D barcode and a protection-encoded second 2D barcode, the first 2D barcode containing at least first closed information,
the first closed information containing protection-encoding data ID,
the protection-encoded second 2D barcode having been protection-encoded by applying protection-encoding data to a second 2D barcode,
the second 2D barcode containing at least second closed information,
the second closed information containing hidden-object information,
the protection-encoding data being identified by the protection-encoding data ID,
the program causing a computer to perform the following processes:
reading the first 2D barcode and the protection-encoded second 2D barcode;
identifying the protection-encoding data based on the protection-encoding data ID;
protection-decoding a protection-encoded codeword of the protection-encoded second 2D barcode using the protection-encoding data; and
extracting the hidden-object information from the second 2D barcode that has been obtained by protection-decoding the protection-encoded codeword.

With such a program, in order to extract the hidden-object information, the following steps are required: extracting the protection-encoding data ID from the first closed information of the first 2D barcode; protection-decoding the protection-encoded codeword of the protection-encoded second 2D barcode using the protection-encoding data, the protection-encoding data being identified by protection-encoding data ID; and extracting the hidden-object information from the second 2D barcode that has been obtained by protection-decoding the protection-encoded codeword, the hidden-object information being contained in the second closed information. This makes it possible to protect appropriately the hidden-object information using the 2D barcode.

First Embodiment

A 2D barcode used in the first embodiment will be described below. Unless otherwise stated, the following description is in conformance with Japanese Industrial Standards X 0510:2004 "Two dimensional symbol—QR code—" (hereinafter merely referred to as "JIS"). An encoder in conformance with JIS is referred to as a standard encoder, and a decoder in conformance with JIS is referred to as a standard decoder. An encoder which can handle closed information according to the first embodiment is referred to as an enhanced encoder, and such a decoder is referred to as an enhanced decoder. These apparatuses will be distinguished below.

Definitions

As used in this disclosure, the expression of "to obtain black and white pattern of a QR code (R) as graphics", the wording "to read" is used. For the expression of "to obtain data codewords from the obtained QR code", the wording "to read-out" is used; the data codewords including the data codewords of a replaced RS block (to be described later) and the data codewords of an unreplaced RS block. For the expression of "to obtain certain information by the foregoing data codewords using any processing other than the processings in conformance with JIS", the wording "to extract" is used. In other words, for the expression of "to obtain closed information of an enhanced QR code" or for the expression of "to obtain information by further processing that closed information", the wording "to extract" is used in the description below. For example, in some cases, for the expression of "to obtain a 'protection-encoding data ID' (to be described later)", the wording "to extract" is used. For example, in some cases, for the expression of "to obtain 'hidden-object information obtained by protection-decoding protection-encoded codewords' (to be described later)", the wording "to extract" is used. Concerning "protection-encoded hidden-object information", its protection-encoded codewords are not protection-decoded and cannot be either "read-out". Therefore, in some cases, the wording "to extract" is not used. In the description below, information obtained by protection-decoding protection-encoded codewords is referred to as "hidden-object information".

In some cases, information words directly represented by a QR code which has been read (the information words are not subject to any processing such as sorting) are referred to as symbol codewords. A QR code as graphics can be seen as a code obtained by adding a function pattern to the symbol codewords and changing it into a form of a graphic symbol. Thus, a QR code is substantially identical to a set of symbol codewords. Accordingly, for the expression of "to obtain symbol codewords", the wording "to read" is used.

In the description below, "protection-encoding data" is a so-called protection mask pattern which is used in a protection-encoding for preventing reading-out through the XOR operation. And, the protection-encoding data is different from a standard mask pattern in conformance with JIS. The mask patterns set forth in JIS are referred to as "standard mask patterns" in order to distinguish them from the "protection-encoding data".

In the following description, a "codeword" is eight bits long. But, the bit length of a "codeword" may be different such as 16 bits, one bit, or the like, depending on a system.

FIG. 1 is a diagram illustrating a QR code symbol 1. The QR code symbol 1 (hereinafter also merely referred to as "QR CODE") has various sizes which range from version 1 to version 40, but functions of version "2" QR code will be described in this example.

The QR code symbol 1 has a function pattern and an encoding region. The function pattern is a pattern required to locate the position of the QR code symbol and to identify the characteristics of the same; the locating and the identifying are necessary to assist in decoding the modules of the QR code. The encoding region is a region in which necessary information is written.

The function pattern includes finder patterns FP, separators SP, timing patterns TP, alignment patterns AP and a quiet zone QZ.

The finder patterns FP are respectively placed at least at three corners of a QR code symbol. At the time of reading, identifying three finder patterns FP allows the orientation and position of the QR code symbol 1 to be exactly specified.

The separators SP are each light modules of one module width, and are each located around each finder pattern FP. This makes it possible to separate the finder patterns FP from the rest of the QR code symbol 1.

The module M is a unit cell constituting the QR code symbol 1. In principle, one bit is equivalent to one module.

The timing patterns TP are each a pattern in which dark and light modules are placed in line alternately one by one. With the timing patterns TP, it is possible to identify the number of the modules of the QR code symbol 1. Accordingly, the version of the QR code can be identified.

The alignment patterns AP are patterns placed in the defined locations according to the version of the QR code. In a case of large modules, the alignment patterns AP assist in locating the position of the QR code symbol 1.

The quiet zone QZ is a light module zone of at least 4 modules width, and is located around the QR code.

The encoding region includes data, error correction codewords (hereinafter also merely referred to as "correction codewords"), and format information FI. And, an encoding region having a large version number includes version information VI. The format information FI contains information of error correction level and information of the standard mask pattern. Protection-encoding using a standard mask pattern or protection-encoding data (this process will be described later) is applied to only an area within the encoding region, except for the format information FI and the version information VI.

In this example, the data is actual data, and the error correction codewords are those for correcting an error which is caused when the data have not been able to be read-out. The format information contains information on the error correction level applied to the QR code symbol 1 and information on the standard mask pattern used to the QR code symbol 1. The format information FI is an encode pattern which is required to decode the encoding region.

Figure 2:
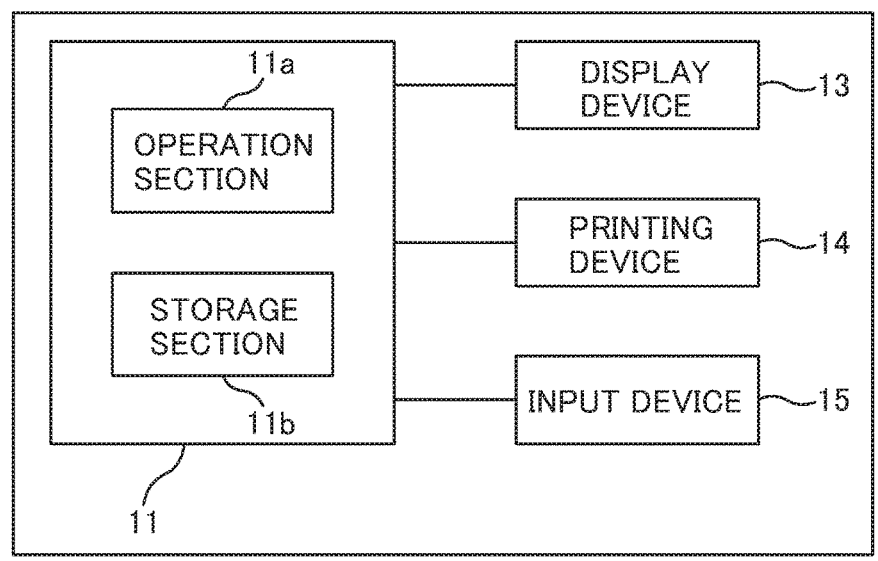
FIG. 2 is a block diagram of an enhanced encoder 10.

FIG. 2 is a block diagram of an enhanced encoder 10 according to the first embodiment. The enhanced encoder 10 is an apparatus that converts, to the QR code symbol 1, information containing both of open information and closed information. In addition, the enhanced encoder 10 has a function to protection-encode a replaced RS block (to be described later) using protection-encoding data for preventing reading-out. The enhanced encoder 10 includes a control section 11, a display device 13, a printing device 14 and an input device 15.

The control section 11 includes an operation section 11a and a storage section 11b. The operation section 11a is composed of units such as a Central Processing Unit, and serves as executing programs and performing various operations. The storage section 11b stores data necessary to execute programs. In particular, the storage section 11b stores a program for executing a concealing process of hidden-object information (to be described later).

The display device 13 has a display function necessary at the time of inputting data or the like. The display device 13 outputs by displaying a generated QR code symbol 1. And, the printing device 14 also outputs by printing a generated QR code symbol 1. The input device 15 is used for inputting data and is also used for operating the enhanced encoder 10.

The configuration of the enhanced encoder 10 can be realized by installing a program to a common device like a computer, a mobile phone or a smartphone, the program being for executing a program for executing a concealing process of hidden-object information (to be described later).

Figure 3:
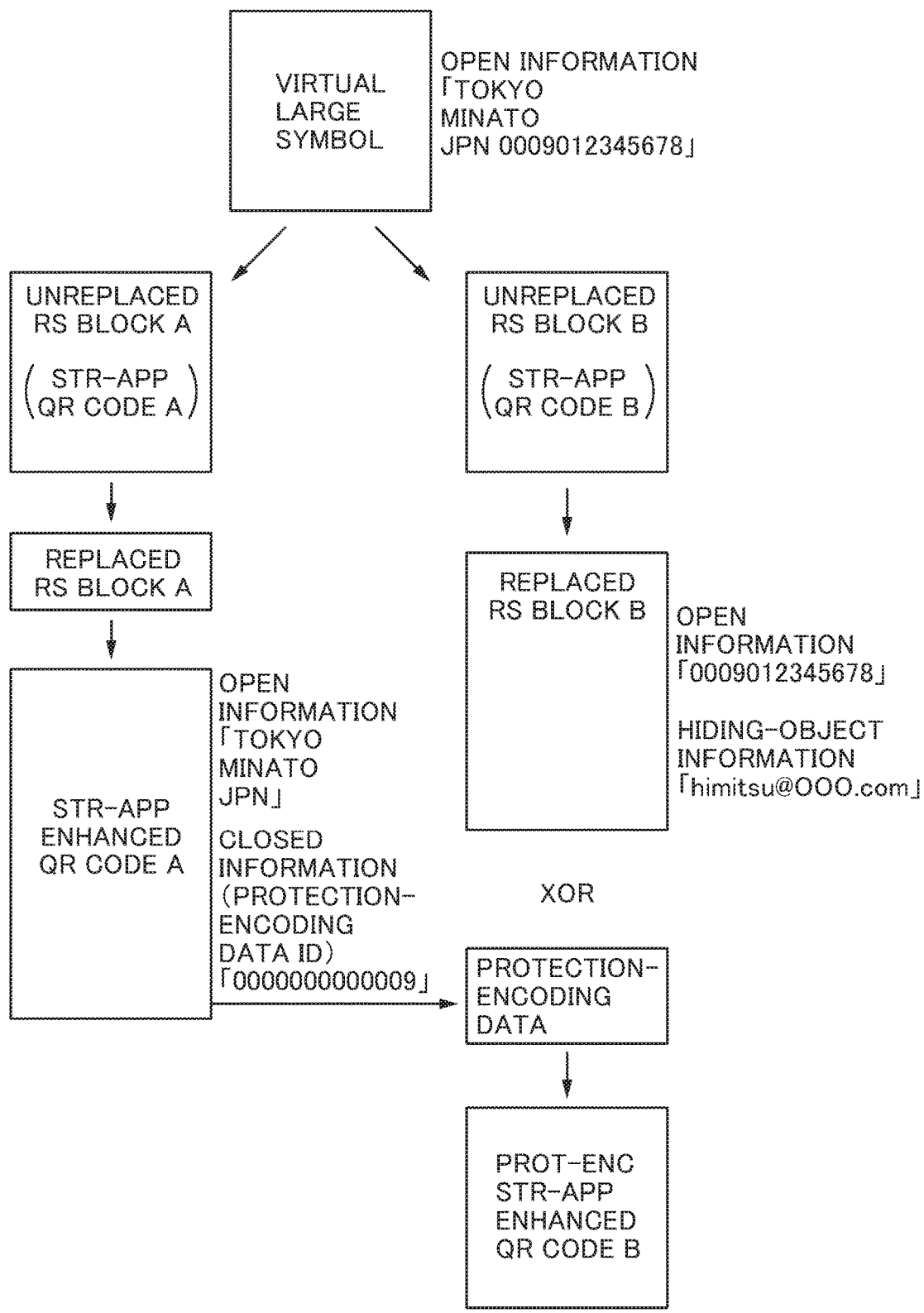
FIG. 3 is a conceptual diagram of a process for concealing hidden-object information.
Figure 4:
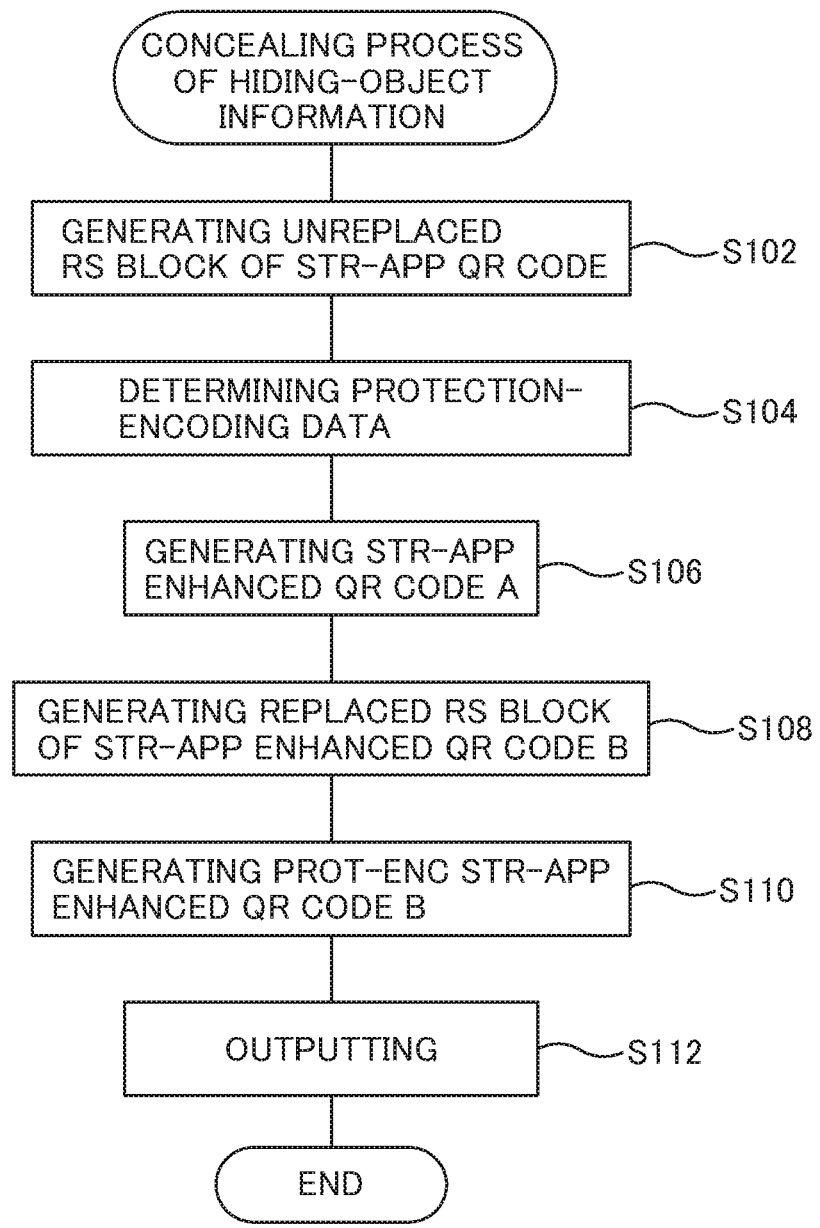
FIG. 4 is a flow chart of the process for concealing hidden-object information.

FIG. 3 is a conceptual diagram of a process for concealing hidden-object information. FIG. 4 is a flow chart of a process for concealing hidden-object information. With reference to the figures, a procedure for generating a Structured-Append enhanced QR code according to the first embodiment will be described below. Masking using standard mask patterns (this process will be described later) is performed in conformance with JIS, and is therefore omitted in FIGS. 3 and 4.

In FIG. 3, a Structured-Append QR code A with brackets is shown as well as an unreplaced RS block A. This means that, if the unreplaced RS block A is converted in a form of a QR code, the unreplaced RS block A becomes the Structured-Append QR code A. Similarly, a Structured-Append QR code B with brackets is shown as well as an unreplaced RS block B. This means that, if the unreplaced RS block B is converted in a form of a QR code, the unreplaced RS block B becomes the Structured-Append QR code B.

Herein, a QR code in the Structured Append format is used. The QR code in the Structured Append format is a QR code in which its own code information is embedded in such a manner that it can be recognized that its own code information is one of divided portions of certain code information which are related to one another. That is, using the Structured Append format, a virtual large symbol can be divided into a plurality of small symbols related to one another. According to JIS, one large symbol can be divided into 16 small symbols at the maximum. Each small symbol contains a Structured-Append header block indicating that the symbol is in the Structured Append format. The Structured-Append header block includes a mode indicator, a symbol sequence indicator and parity data, according to JIS. Such a QR code in the Structured Append format is hereinafter referred to as a Structured-Append QR code.

A QR code used herein assumes that a 2D barcode can record open information and closed information. The open information is information which can be read-out with a decoder in conformance with JIS (hereinafter also referred to as a "standard decoder"). On the other hand, the closed information is information which cannot be read-out with such a standard decoder but which can be extracted an enhanced decoder 20 (to be described later).

Such a QR code which can also record the foregoing closed information is a QR code whose functions are expanded as mentioned above, and is also referred to as an "enhanced QR code" (or "enhanced QR code symbol") in the description below. An enhanced QR code in the Structured Append format is also referred to as "Structured-Append enhanced QR code".

First, from the content of a virtual large symbol, generated are the data codewords of the encoding regions which constitute a Structured-Append QR code A and a Structured-Append QR code B (S102). The generation is performed according to JIS. As a result, generated are the unreplaced RS block A of the Structured-Append QR code A and the unreplaced RS block B of the Structured-Append QR code B. At once, parity data contained in the Structured-Append header block is also obtained. The parity data is obtained by applying an operation to parity of the open information of the virtual large symbol.

In this example, the virtual large symbol contains "TOKYO<cr>MINATO<cr>JPN0009012345678" as open information. The term "<cr>" means the carriage return.

The open information of the virtual large symbol can be divided in any manner. In this example, of the open information of the large symbol, "TOKYO<cr>MINATO<cr>JPN" is contained in an open information part of the Structured-Append QR code A. And, "0009012345678" is contained in an open information part of the Structured-Append QR code B.

Next, protection-encoding data which is to be used later is determined (S104). The protection-encoding data is a so-called protection mask pattern which is used in a protection-encoding for preventing reading-out through the XOR operation, as mentioned above. And, the protection-encoding data is different from a standard mask pattern in conformance with JIS. The protection-encoding data can be selected arbitrarily. It is possible to determine the protection-encoding data using a method to be described later.

Next, data codewords constituting a Structured-Append enhanced QR code A are generated; the Structured-Append enhanced QR code A is a Structured-Append QR code A in which a protection-encoding data ID is embedded as closed information (S106). The protection-encoding data ID is an ID for identifying the protection-encoding data which has been determined in step S104. In this example, the protection-encoding data ID is a value "000000000009". The "protection-encoding data ID" corresponds to the "protection-encoding data information". The "protection-encoding data information" may be any kind of information for retrieving "protection-encoding data", and is not limited to a protection-encoding data ID number as illustrated in this example.

Figure 5:
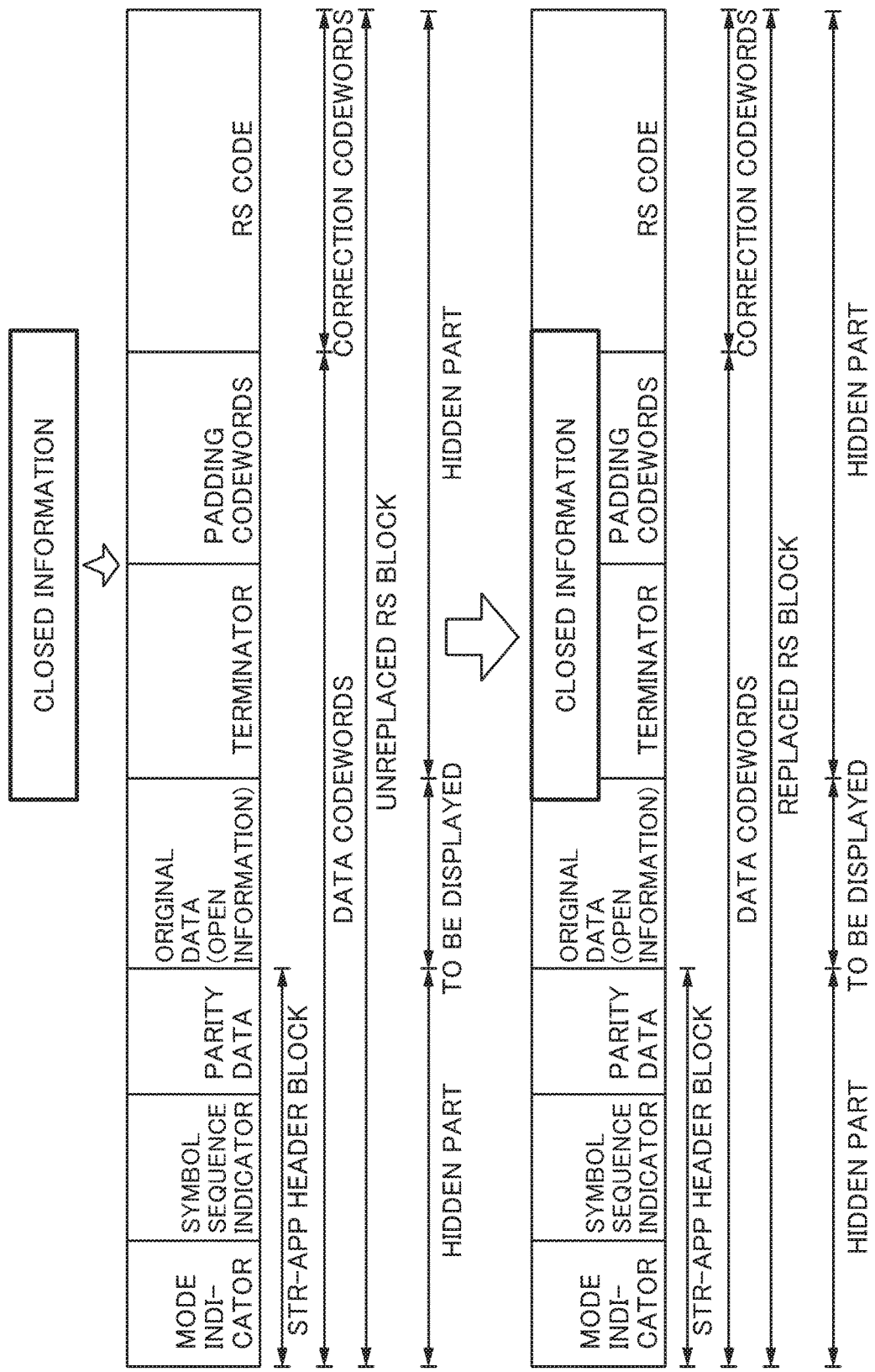
FIG. 5 is a schematic diagram of RS block.

FIG. 5 is a schematic diagram of a RS block. First, the data format of a QR code according to the first embodiment and a method for embedding closed information (the protection-encoding data ID in this example) will be briefly described with reference to FIG. 5. FIG. 5 shows a Reed-Solomon (RS) block, which serves as a unit for error correction. Each QR code symbol 1 contains one or multiple of RS blocks. A single RS block is a unit for error correction.

In the embodiment described herein, since error correction using a Reed-Solomon (RS) code is employed, the "RS block" is described as an example of a unit block for operation of detecting and correcting an error.

An unreplaced RS block contains data codewords composed of a Structured-Append header block (a hidden part), original data (corresponding to the open information) to be displayed, a terminator (a hidden part), and padding codewords (hidden parts). It should be noted that, since there is a replaced RS block to be described later, the unreplaced RS block and the replaced RS block are distinguished from each other. The unreplaced RS block also contains a Reed-Solomon (RS) code (a hidden part), which serves as correction codewords. The original data is a piece of information which can be decoded and be displayed by the standard decoder when the QR code symbol 1 is read. The terminator is a code indicating the end of the original data. The padding codewords are provisional codewords used to fill empty positions of codewords when the total number of the codewords of the original data does not reach the capacity of the QR code symbol 1. The RS code is a code added for the purpose of error correction to a RS block, which is a unit of error correction.

The QR code symbol 1 used in this example is a QR code in the Structured Append format. And, at the beginning of the data codewords the mode indicator is placed, and subsequently the symbol sequence indicator and the parity data are placed.

The symbol sequence indicator indicates the position of the QR code within the set of QR code symbols in the Structured Append format (in the form m of n symbols). For example, the symbol sequence indicator of a Structured-Append enhanced QR code A (to be described later) indicates the first symbol of a set of two QR codes in the Structured Append format. And, the symbol sequence indicator of a protection-encoded Structured-Append enhanced QR code B indicates the second symbol of a set of two QR codes in the Structured Append format.

The parity data is that of the open information of the foregoing virtual large symbol. That is, the parity data is that of information in which the open information of the Structured-Append QR code A and the open information of Structured-Append QR code B are properly concatenated according to the symbol sequence indicators. The parity data is common to the Structured-Append QR codes which have been divided from the virtual large symbol (in this example, common to the Structured-Append QR code A and the Structured-Append QR code B). Based on whether the parity data of the QR code A coincides with the parity data of the QR code B, it is judged whether or not these QR codes are in the Structured Append format. That is, that these QR codes are in the Structured Append format can be determined as follows: concerning information words in which the open information of the Structured-Append QR code A and the open information of the Structured-Append QR code B are reconstructed in a predetermined method, the parity of the information words coincides with the parity data of the open information of the virtual large symbol and the parity of the information words coincides with the parity data common to the Structured-Append QR code A and the Structured-Append QR code B.

The error correction level of the QR code can be selected from the following four levels: "level L", "level M", "level Q" and "level H". In "level L", this type of error correction allows to correct up to approximately 7% of whole codewords. For example, the error correction capability allows recovery of approximately 7% of the whole codewords of a RS block. In "level M", this type of error correction allows to correct up to approximately 15% of the whole codewords. In "level Q", this type of error correction allows to correct up to approximately 25% of the whole codewords. In "level H", this type of error correction allows to correct up to approximately 30% of the whole codewords. In the first embodiment, closed information is concealed within a QR code, for example, using "level H", which has the highest error correction capability. It should be noted that the error correction level may be changed depending on the number of closed-information words to be concealed.

The concept of a procedure for concealing information within a QR code is as follow. FIG. 5 shows closed information. Here, a part of a RS block is replaced with closed information (hereinafter this "replace" is also referred to as "overwrite"). Even if a part of a RS block is replaced, the standard decoder can correct, using a RS code, an original-data section which has been replaced. And, it is possible to read-out and display the corrected original-data section. On the other hand, since the closed-information words are information which is corrected with the RS code and is discarded, the closed-information words will not be displayed by the standard decoder.

On the other hand, an enhanced decoder 20 extracts the closed-information words from the replaced RS block, as described later. Thereafter, correction is made using the RS code, and the original-data section is read-out. According to the foregoing principle, information can be concealed in the QR code symbol 1. A method for replacing a part of a RS block with closed-information words will be described later in detail.

Based on such a principle, the protection-encoding data ID is embedded as closed information. That is, a part of the unreplaced RS block A is replaced with the protection-encoding data ID (closed information) and as a result a replaced RS block A is generated. By generating a QR code based on the replaced RS block A (corresponding to the replaced data block), the Structured-Append enhanced QR code A is generated.

Next, generated is the replaced RS block B having closed information which contains hidden-object information (S108). The replaced RS block B is generated by replacing a part of the foregoing unreplaced RS block B with closed information. The "hidden-object information" is information which is most needed to be hidden, and is "himitsu@OOO.com" in this example.

Each bit of the replaced RS block which has been generated in the foregoing manner is placed in the encoding region of a QR code, and therefore it is possible to generate the data codewords of the QR code; the data codewords have not been protection-encoded using protection-encoding data (to be described later) and have not been masked using a standard mask pattern. Thus, the generation of the replaced RS block B corresponds to generation of the data codewords of a second 2D barcode to which protection-encoding data and a standard mask pattern are not applied.

Next, the replaced RS block B is XORed with the protection-encoding data, and obtained is a protection-encoded Structured-Append enhanced QR code B (corresponding to protection-encoded second 2D barcode) (S110).

Figure 6:
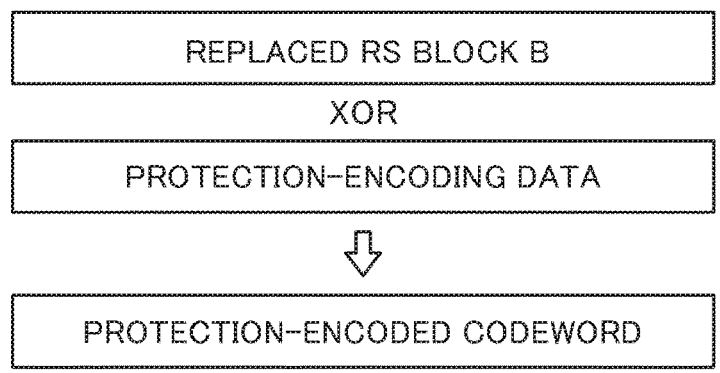
FIG. 6 is a diagram illustrating how to apply protection-encoding data.

FIG. 6 is a diagram illustrating how to apply the protection-encoding data. The figure shows a replaced RS block B, protection-encoding data, and protection-encoded codewords. As shown in FIG. 6, the protection-encoded codewords are obtained by XORing the RS block B with the protection-encoding data on a bit-by-bit basis. Thus, obtained are the protection-encoded codewords in which the whole part of the replaced RS block B is protection-encoded using the protection-encoding data. Since the conversion is made on a bit-by-bit basis as mentioned above, each conversion becomes local. Accordingly, even if a read-out error occurs to a protection-encoded pattern, on a bit-by-bit basis remains a read-out error of the information words which the protection-encoded codewords of the pattern are protection-decoded on a bit-by-bit basis. The read-out error which remains on a bit-by-bit basis can be appropriately corrected by error correction. With such a XORing on a bit-by-bit basis, even if a read-out error occurs, it is possible to appropriately correct the error afterwards. This effect cannot be expected to occur in a case of byte-by-byte basis conversion and block-by-block basis conversion. This protection-encoding process will be described in detail later.

In this example, the replaced RS block B is XORed with the protection-encoding data on a bit-by-bit basis. This is equivalent to a method in which, after the replaced RS block B is converted into a QR code, XORing with the protection-encoding data is performed on a bit-by-bit basis while taking into consideration the arrangement of the modules in the encoding region of the QR code. That is, though a QR code is not shown in FIG. 6, this is equivalent to protection-encoding the other parts of a QR code except for the function pattern, the format information (FI) and the version information (VI).

Figure 7:
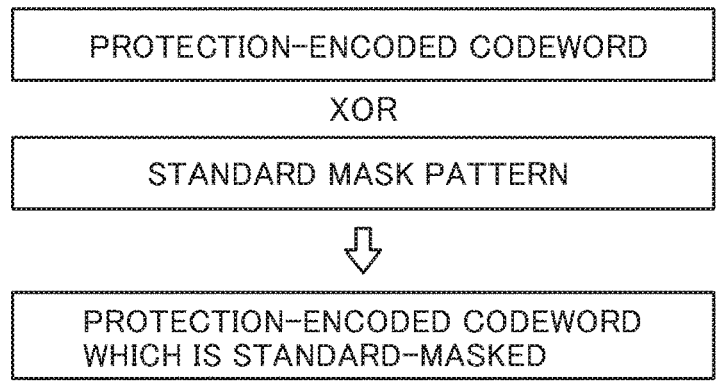
FIG. 7 is a diagram illustrating how to apply a standard mask pattern.

FIG. 7 is a diagram illustrating how to apply a standard mask pattern. According to JIS, a QR code is masked with a standard mask pattern in its generating step, and the masking is performed by XORing the QR code with a standard mask pattern which is identified by a mask pattern reference. Accordingly, a standard mask pattern is also applied to protection-encoded codewords (XORing) as well as the foregoing process, and the protection-encoded codewords which have been masked with the standard mask pattern is obtained.

As mentioned above, the standard mask pattern is applied (XORed) after obtaining the protection-encoded codewords, not before obtaining the protection-encoded codewords. This is because the standard mask pattern has a function to balance of dark/light modules of the QR code symbol. Accordingly, since the XOR operation follows the commutative law, the operations (the XOR operations: protection-encoding; and masking with the standard mask pattern) can be performed in any order. However, the XOR operation with the standard mask pattern should be performed as at a late stage as possible.

A QR code is generated using the masked protection-encoded codewords which have been generated as mentioned above. And, generated is a protection-encoded Structured-Append enhanced QR code B which has been masked with standard mask patterns (S110). The QR code B is masked with standard mask patterns according to JIS for a QR code. Accordingly, the wording "which has been masked with standard mask patterns" is omitted, and the QR code B is also merely referred to as the "protection-encoded Structured-Append enhanced QR code B". The protection-encoded Structured-Append enhanced QR code B corresponds to the protection-encoded second 2D barcode. The protection-encoded second 2D barcode may be one to which the protection-encoding data have been applied but any standard mask pattern have not been applied.

Next outputted are the Structured-Append enhanced QR code A and the protection-encoded Structured-Append enhanced QR code B which have been obtained (S112). Concerning outputting methods, the QR codes A and B may be printed by the printing device 14, or may be displayed by the display device 13.

Concerning the Structured-Append QR code A and the protection-encoded Structured-Append enhanced QR code B which have been generated in the foregoing manner, both QR codes A and B look like common QR codes, but they actually contain hidden-object information which is hidden therein. In order to extract this hidden-object information, it is necessary to identify the protection-encoding data. In addition, in order to identify the protection-encoding data, the enhanced decoder 20 for extracting closed information is needed (to be described later). This makes it extremely difficult for any third party to extract the hidden-object information. Further, since the QR code B is protection-encoded using the protection-encoding data, the standard decoder cannot extract closed information and cannot either read-out open information.

Figure 8:
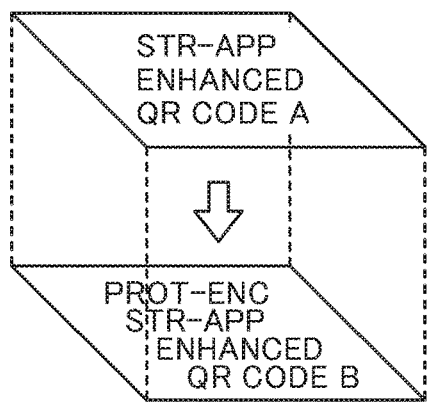
FIG. 8 is a diagram illustrating superposing a Structured-Append (Str-App) enhanced QR code A on a protection-encoded Structured-Append (prot-enc Str-App) enhanced QR code B.

FIG. 8 is a diagram illustrating superposing the Structured-Append enhanced QR code A on the protection-encoded Structured-Append enhanced QR code B. As shown in FIG. 8, the QR codes A and B which have been generated in the foregoing manner can be printed with inks whose optical properties are different so that either one of the QR codes A and B is superposed on the other QR code.

For example, the Structured-Append enhanced QR code A is printed with a first ink, and the protection-encoded Structured-Append enhanced QR code B is printed with a second ink. Concerning the first ink and the second ink, it is possible to employ inks which show different behaviors (e.g. color development, luminescence (including fluorescence), absorption of a specific band of wavelengths) depending on the wavelength of reference light illuminating for reading a QR code symbol.

Specifically speaking, a colored ink which absorbs infrared ray and does not contain carbon black can be used for printing the protection-encoded Structured-Append enhanced QR code B. On the QR code B, printed is the Structured-Append enhanced QR code A. For printing this QR code A, colorless or pale-colored, an infrared absorbing ink can be used.

In this case, it is desirable that the Structured-Append enhanced QR code A and the protection-encoded Structured-Append enhanced QR code B have the same symbol size.

This allows the Structured-Append enhanced QR code A not to be visually recognized. Accordingly, a third party who does not know that hidden-object information is concealed therein in the foregoing manner cannot read this QR code A containing its protection-encoding data ID. This makes it more difficult to extract the hidden-object information from the protection-encoded Structured-Append enhanced QR code B. Further, this QR code B is protection-encoded using the protection-encoding data, and therefore read-outing it with the standard decoder is impossible. Consequently, it is extremely difficult to extract the hidden-object information as well as the open information.

On the other hand, a person who knows that any hidden-object information is concealed in the foregoing manner can read the Structured-Append enhanced QR code A using a light source under which a subject printed with the infrared absorbing ink can be read. And, using a common light source, it is possible to read the protection-encoded Structured-Append enhanced QR code B. Using the protection-encoding data ID contained in the QR code A, it is possible to protection-decode the protection-encoded codewords of the QR code B.

As another method for superposing the Structured-Append enhanced QR code A on the protection-encoded Structured-Append enhanced QR code B, there is a method as follow. First, printed is the QR code A with an ink containing carbon black. Next, a solid printing is performed on this QR code A with a white ink which does not contain carbon black. Further, on the white solid printed subject, the QR code B is printed with a colored ink which does not contain carbon black.

This makes it difficult to read the Structured-Append enhanced QR code A under visible light, because the QR code A is concealed with the white ink. But, it is possible to read the protection-encoded Structured-Append enhanced QR code B. On the other hand, the QR code A can be read through an optical filter by referring the infrared region.

In the description above, for the purpose of explanation, an example of two QR codes, namely the Structured-Append enhanced QR code A and the protection-encoded Structured-Append enhanced QR code B has been provided. However, a plurality of protection-encoded Structured-Append enhanced QR codes may also be employed.

Figure 9:
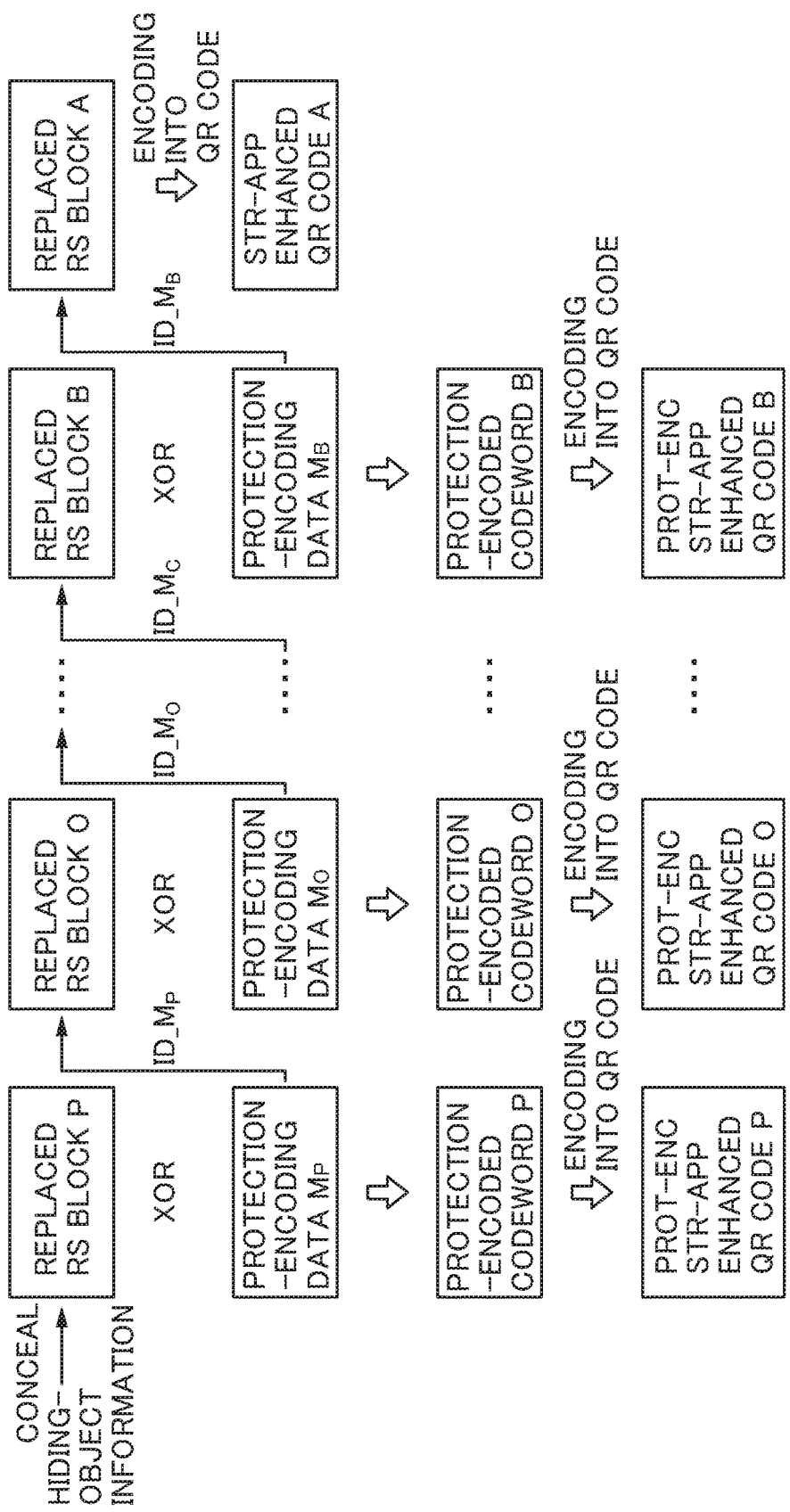
FIG. 9 is a diagram illustrating a relation between a plurality of protection-encoded Structured-Append (prot-enc Str-App) enhanced QR codes.

FIG. 9 is a diagram illustrating a relation among a plurality of protection-encoded Structured-Append enhanced QR codes. FIG. 9 shows a plurality of protection-encoded Structured-Append enhanced QR codes. In addition, there are shown a replaced RS block, protection-encoding data and a set of protection-encoded codewords; these items are for generating each protection-encoded Structured-Append enhanced QR code.

For example, the hidden-object information is embedded in the replaced RS block P as closed information, and is protection-encoded using protection-encoding data $M_P$. Then, a protection-encoding data ID ID_$M_P$, which is for identifying the protection-encoding data $M_P$, is embedded in a replaced RS block O as closed information. Next, the replaced RS block O is protection-encoded using protection-encoding data $M_O$, and protection-encoding data ID ID_$M_O$, which is for identifying the protection-encoding data $M_O$, is embedded in a replaced RS block N as closed information. The operations are repeated, and a protection-encoding data ID ID_$M_P$, for identifying protection-encoding data $M_B$, is embedded in a replaced RS block A as closed information, the protection-encoding data being for protection-encoding the replaced RS block B.

With such a method, multiple protections are made, and therefore it is possible to protect hidden-object information more firmly.

In a case where a plurality of protection-encoded Structured-Append enhanced QR codes are used as mentioned above, the following method can be employed. For example, the protection-encoding data is applied to each of the plurality of the QR codes sequentially as mentioned above. In protection-encoding a subsequent QR code, performed is the XOR operation with all of protection-encoding data which have been used in the protection-encoding processes of the previous QR codes. For example, the protection-encoded Structured-Append enhanced QR code O in FIG. 9 can be obtained by XORing the replaced RS block O with the protection-encoding data $M_P$ and the protection-encoding data $M_O$.

The following method is also acceptable. The whole parts of the following QR code are protection-encoded by XORing with the protection-encoding data which has been extracted, and all of the protection-encoding data which have ever been obtained are applied to a part of this protection-encoded QR code (the XOR operation). In addition, the following method is acceptable. A certain part of the following QR code is encoded by XORing with the protection-encoding data which has been extracted, and all of the protection-encoding data which have ever been obtained are applied to the whole parts of the protection-encoded QR code (the XOR operation).

This can achieve multiple and accumulated protections and can protect hidden-object information more securely.

Figure 10:
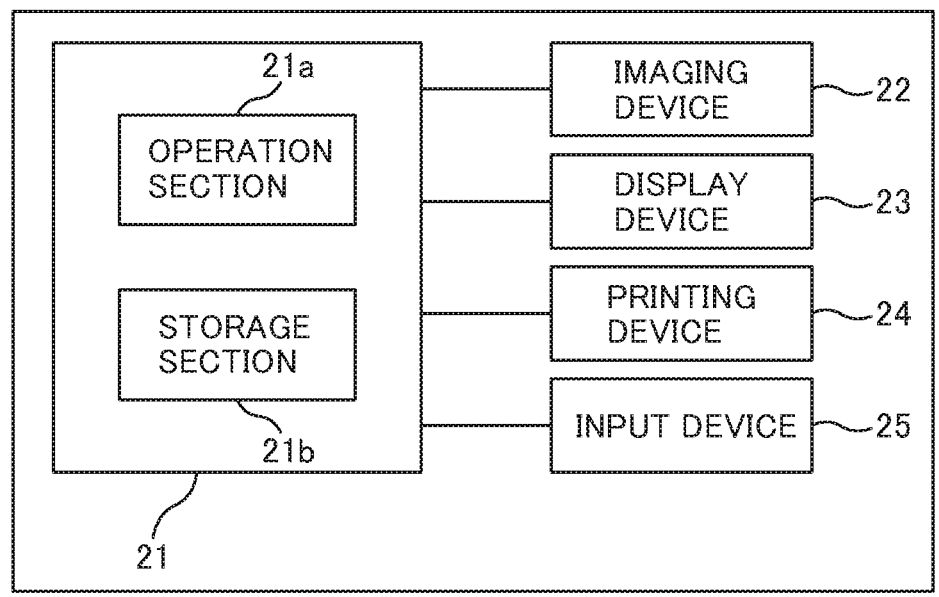
FIG. 10 is a block diagram of an enhanced decoder 20.

FIG. 10 is a block diagram of the enhanced decoder 20. The enhanced decoder 20 is an apparatus for reading the QR code symbol 1 and for extracting open information and closed information which are contained in QR code symbol 1 (including a protection-encoded Structured-Append enhanced to be described later). The enhanced decoder 20 also functions to protection-decode protection-encoded codewords of a protection-encoded Structured-Append enhanced QR code. The enhanced decoder 20 includes a control section 21, an imaging device 22, a display device 23, a printing device 24 and an input device 25.

The control section 21 includes an operation section 21a and a storage section 21b. The operation section 21a is composed of units such as Central Processing Unit, and serves as executing programs and performing various operations. The storage section 21b stores data necessary to execute programs. In particular, the storage section 21b stores a program for executing the extracting process of hidden-object information (to be described later).

The imaging device 22 is a device for imaging the QR code symbol 1 such as CCD camera or the like. The imaging device 22 may have a first light source and a second light source which have different wavelengths. The first light source can be a light source for imaging a colorless, infrared absorbing ink, and the second light source can be a light source for imaging a colored ink which does not contain carbon black. With such light sources, switching these light sources as appropriate makes it possible to read the Structured-Append enhanced QR code A and the protection-encoded Structured-Append enhanced QR code B shown in FIG. 8 mentioned above. The imaging device 22 (or an imaging device contained in the imaging device 22) may have optical filters for such light sources which have different wavelengths.

The display device 23 has a display function necessary at the time of inputting data or the like. The display device 23 outputs by displaying information expanded from a QR code. The printing device 24 outputs by printing such expanded information. The input device 25 is used for inputting data and is also used for operating the enhanced decoder 20.

The configuration of the enhanced decoder 20 can be realized by installing a program to a common device having the imaging device 22 like a computer, a mobile phone or a smartphone, the program being for executing the extracting process of hidden-object information (to be described later). The configuration can also be realized by combining the enhanced encoder 10 and the enhanced decoder 20 mentioned above.

Figure 11:
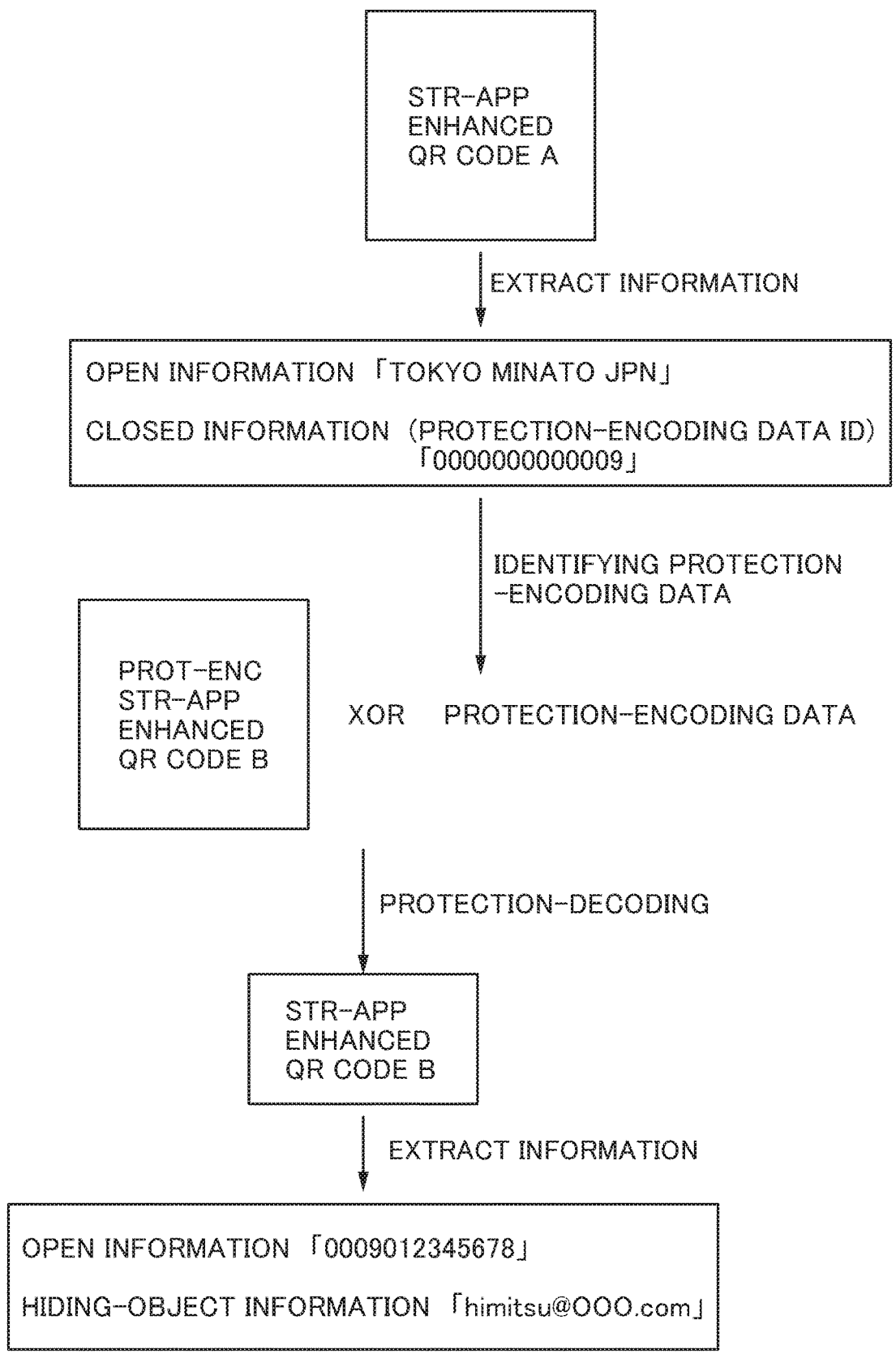
FIG. 11 is a conceptual diagram of a reading-out process for extracting hidden-object information.
Figure 12:
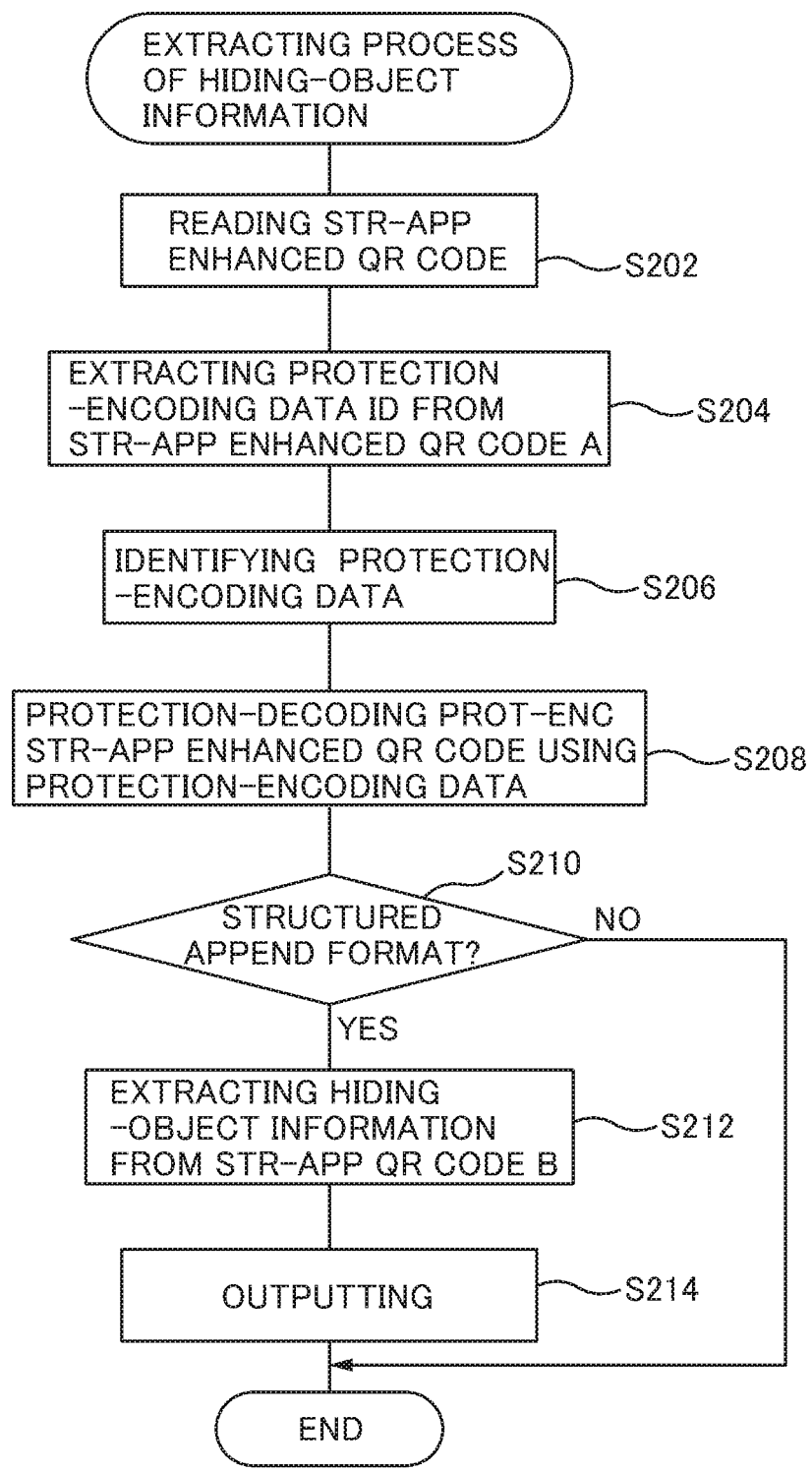
FIG. 12 is a flow chart of a reading-out process for extracting hidden-object information.

FIG. 11 is a conceptual diagram of a reading-out process for extracting hidden-object information. FIG. 12 is a flow chart of a reading-out process for extracting hidden-object information. With reference to these figures, the extracting process of hidden-object information will be described below.

First, the symbol codewords of Structured-Append enhanced QR code A and protection-encoded Structured-Append enhanced QR code B are read (S202). Then, the protection-encoding data ID which is a kind of closed information is extracted from the QR code A (S204).

In a method for reading-out closed information, a replaced RS block A is expanded from the symbol codewords which have read from the Structured-Append enhanced QR code A. The closed-information words, with which the replaced RS block A is replaced, is extracted. While extracting the closed-information words, an original-data section which has been replaced is corrected using a RS code. This makes it possible to obtain open information which is contained in the original-data section. As the open information, "TOKYO<cr>MINATO<cr>JPN" can be obtained, and as the closed information, a protection-encoding data ID ("0000000000009" in this example) can be obtained.

Concerning reading-out of such a protection-encoding data ID, even if the standard decoder (a common QR code reader) attempts to read-out the closed-information words, it is impossible to obtain them. This is because a replaced section is corrected by a RS code and is lost.

Next, based on the protection-encoding data ID, protection-encoding data is identified (S206). Using the protection-encoding data, protection-decoded is the protection-encoded codewords of the symbol codewords of protection-encoded Structured-Append enhanced QR code B (S208).

Figure 13:
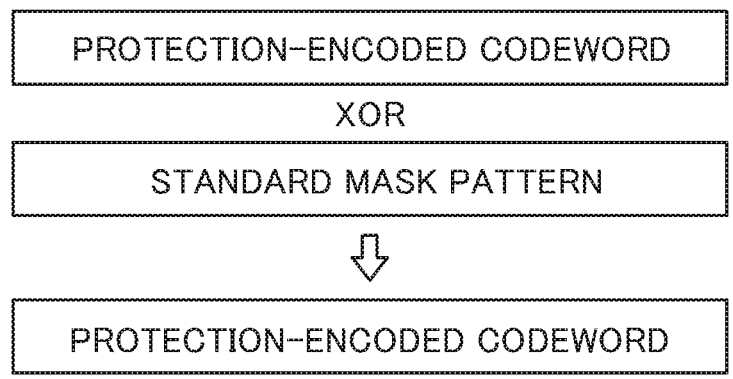
FIG. 13 is a diagram illustrating removal of a standard mask pattern.

FIG. 13 is a diagram illustrating removal of the standard mask pattern. FIG. 13 shows the protection-encoded codewords, the standard mask pattern and the protection-encoded codewords. As shown in FIG. 13, the protection-encoded codewords can be obtained by XORing the protection-encoded codewords with the standard mask pattern on a bit-by-bit basis.

Figure 14:
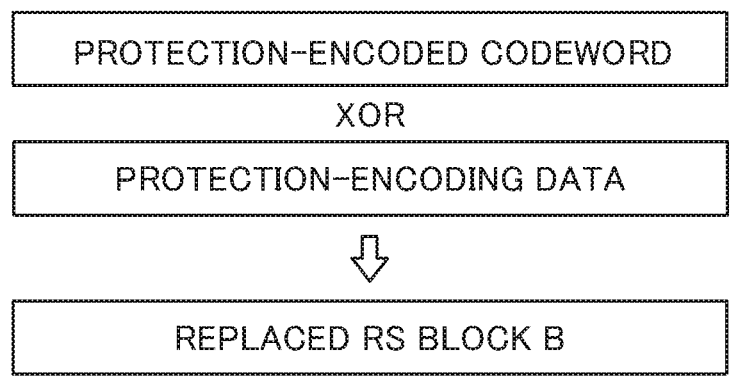
FIG. 14 is a diagram illustrating protection-decoding.

FIG. 14 is a diagram illustrating the protection-decoding process. FIG. 14 shows the protection-encoded codewords, the protection-encoding data and the RS block B. As shown in FIG. 14, the replaced RS block B can be obtained by XORing the protection-encoded codewords with the protection-encoding data on a bit-by-bit basis. This protection-decoding process will be described in detail later.

Next, it is determined whether the Structured-Append enhanced QR code A and the protection-encoded Structured-Append enhanced QR code B are in the Structured Append format (S210). As mentioned above, if the QR codes A and B are in the Structured Append format, the following conditions are satisfied: (1) the parity data in the Structured-Append header blocks of the QR codes A and B coincide; and (2) concerning the information words obtained by reconstructing the open information of the QR code A and the open information of the QR code B in a predetermined method, the parity data of the information words coincides with the foregoing parity data in the Structured-Append header blocks. This is because the parity data of the QR code A and the parity data of the QR code B are both a common parity data obtained based on the open information of the large symbol. The open information necessary to acquire the parity data can be obtained by correcting the replaced RS blocks using the RS codes of the Structured-Append enhanced QR codes. It is therefore can be determined whether the foregoing condition (1) is satisfied. Further, acquired is the parity data of the information words which has been obtained by reconstructing the open information of the QR code A and the open information of the QR code B in a predetermined method. It is therefore can be determined whether the foregoing condition (2) is satisfied.

In step S210, if it is determined that the conditions (1) and (2) are satisfied, it is determined that the QR codes A and B are in the Structured Append format. Then, the hidden-object information is extracted from the replaced RS block B (S212). The method for extracting hidden-object information from the replaced RS block B, as mentioned above, is performed by extracting the replaced closed information. The open information of the virtual large symbol can be obtained by concatenating the open information of the Structured-Append enhanced QR code A, which has been obtained for acquiring parity data, and the open information of the protection-encoded Structured-Append enhanced QR code B.

Next, outputted are the hidden-object information and the open information of the virtual large symbol which have been obtained in the foregoing manner (S214). Concerning outputting methods, they may be displayed on the display device 23 or may be printed by the printing device 24. The open information of the large symbol may be displayed or outputted only if display is needed.

On the other hand, in step S210, if it has been determined that the symbols are not in the Structured Append format, the process ends. Therefore, the hidden-object information cannot be extracted. This makes it possible to extract the hidden-object information only if the symbols are in the Structured Append format.

It is possible to embed the most important information as hidden-object information and to embed the second most important information as open information. If a symbol is not in the Structured Append format, it is impossible to read-out the open information of the protection-encoded Structured-Append enhanced QR code B. Accordingly, information which needs to be hidden in some degree can be embedded in the open information of the protection-encoded Structured-Append enhanced QR code B.

FIG. 15A is a diagram illustrating a relation between the Structured-Append enhanced QR code A and the protection-encoded Structured-Append enhanced QR code B. As shown in FIG. 15A, the protection-encoding data is identified based on the QR code A, and the hidden-object information can be obtained by applying the protection-encoding data to the QR code B.

FIG. 15B is a diagram illustrating a case of a plurality of protection-encoded Structured-Append enhanced QR codes. In the foregoing example, the hidden-object information is concealed using the Structured-Append enhanced QR code A and the protection-encoded Structured-Append enhanced QR code B. However, a plurality of protection-encoded Structured-Append enhanced QR codes may be used. In FIG. 9 mentioned above, a process of protection-encoding is described. FIG. 15B shows a decoding method of the protection-encoded Structured-Append enhanced QR codes, corresponding to FIG. 9.

As shown in FIG. 15B, the protection-encoding data ID $ID\_M_B$ is extracted from the closed-information words of the Structured-Append enhanced QR code A. And the protection-encoding data ID $ID\_M_B$ identifies the protection-encoding data $M_B$, and using the protection-encoding data $M_B$, the protection-encoded codewords of the protection-encoded Structured-Append enhanced QR code B is protection-decoded. As a result, a replaced RS block B is obtained, and from the replaced RS block B, the protection-encoding data ID $ID\_M_C$ is obtained as closed-information words. The protection-encoding data ID $ID\_M_C$ identifies the protection-encoding data $M_C$, and using the protection-encoding data $M_C$, the protection-encoded codeword of the protection-encoded Structured-Append enhanced QR code C is protection-decoded. The operations are repeated, and it is possible to finally extract hidden-object information. Accordingly, It is possible to extract hidden-object information which has been embedded in a deeper depth of the hierarchy.

For example, performing the foregoing steps in reverse order can be sufficient in a case of the protection-encoded Structured-Append enhanced QR code O in FIG. 9, which has been obtained by XORing the replaced RS block O with the protection-encoding data $M_P$ and the protection-encoding data $M_O$, as mentioned above. That is, the following protection-encoded Structured-Append enhanced QR code can be obtained by XORing the previous protection-encoded Structured-Append enhanced QR code with all of the protection-encoding data which have been ever obtained.

Assuming that the whole parts of the following QR code are protection-encoded by XORing with the protection-encoding data which has been extracted, and that all of the protection-encoding data which have ever been obtained are applied to a part of this protection-encoded QR code (the XOR operation). In this case, XORing by performing the foregoing steps in reverse order makes it possible to obtain the following protection-encoded Structured-Append enhanced QR code.

Assuming that a certain part of the following QR code is encoded by XORing with the protection-encoding data which has been extracted, and that all of the protection-encoding data which have ever been obtained are applied to the whole parts of this protection-encoded QR code (the XOR operation). In this case, XORing by performing the foregoing steps in reverse order makes it possible to obtain the following protection-encoded Structured-Append enhanced QR code.

In the foregoing embodiment, a protection-encoding data ID for identifying protection-encoding data is embedded as closed information. However, the protection-encoding data itself may be embedded as closed information.

In the foregoing embodiment, the hidden-object information is extracted under the condition that the Structured-Append enhanced QR code A, and the protection-encoded Structured-Append enhanced QR code B are in the Structured Append format. However, it is acceptable that whether the parity data of the Structured-Append header blocks of the QR codes A and B coincide is not determined. That is, the hidden-object information may be extracted even if the QR codes A and B are not in the Structured Append format. In such a case, if there is no relation between the QR codes A and B, the hidden-object information cannot be appropriately extracted; this is because there is high possibility that the protection-encoding data cannot be applied.

In the foregoing method, in the generating step of the protection-encoded Structured-Append enhanced QR code B, the format information FI and the version information VI in the encoding region are not subject to protection-encoding with the protection-encoding data. But, the format information FI may be subject to protection-encoding with the protection-encoding data (however, the format information FI is not subject to masking with standard mask patterns). In this case, before removing the standard mask pattern, it is necessary to protection-decode the protection-encoded codewords. This makes it impossible for the standard decoder to specify, even the format information FI. Accordingly, the QR code B is read and the format information FI is attempted to be specified, and then an error occurs. Therefore, more strict security can be achieved.

With the foregoing method, in the generating step of the protection-encoded Structured-Append enhanced QR code B, protection-encoding is applied to its Structured-Append header block. However, it is acceptable that protection-encoding is not applied to the Structured-Append header block. With the foregoing method, at the time of proceeding step S210 of FIG. 12, it is judged whether or not the code is in the Structured Append format. However, if the Structured-Append header block is not subject to protection-encoding, it can be judged, at an earlier stage (e.g. immediately after step S202 of FIG. 12), whether or not the code is in the Structured Append format. Accordingly, the process can end at an earlier stage if it is judged that the code is not in the Structured Append format. Therefore, security can be improved.

<Method for Selecting Protection-Encoding Data>

In the foregoing embodiment, any protection-encoding data can be employed as long as it is correlated to a protection-encoding data ID. However, the protection-encoding data may be generated or selected based on certain information in any of the following manners.

(1) Using Function

It is possible to determine a function which is capable of generating protection-encoding data according to an input value that is protection-encoding data data ID. As such a function, there are functions using a pseudorandom number generator function or a hash function into both of which an input parameter can enter, for example. A part of the outputs of these functions, whose length corresponds to a necessary word length, may be appropriately taken as the protection-encoding data of a replaced RS block to be processed; or the outputs may be used repeatedly. As an input value, the protection-encoding data ID may be used, for example.

Such a function itself may be embedded into the closed information of the Structured-Append enhanced QR code A. This makes it possible to appropriately generate a unique protection-encoding data.

(2) Downloading Protection-Encoding Data

In determining the protection-encoding data (S104) shown in FIG. 4 mentioned above, the enhanced encoder can arbitrarily generate the protection-encoding data. And, the protection-encoding data and the protection-encoding data ID for identifying the data can be registered in a registration center. The protection-encoding data ID is embedded as closed information in the foregoing manner.

In extracting the hidden-object information, the enhanced decoder extracts the protection-encoding data ID. And the enhanced decoder accesses to the registration center and downloads the protection-encoding data corresponding to the protection-encoding data ID. Then, by protection-decoding protection-encoded codewords using the downloaded protection-encoding data, it is possible to obtain the replaced RS block.

(3) Using Biometrics Authentication

An input value which is entered into the function mentioned in the above section (1) may be generated based on biometric characteristics which are unique to a person who embeds the hidden-object information. Such biometric characteristics include fingerprint, voice, iris, and vein pattern, for example. The feature values of these characteristics are obtained, and they can be used as the input value.

<Protection-Encoding>

Concerning a protection-encoding step for preventing reading-out, an example in which the function mentioned in the above section (1) is used will be described. In this example, encryption functions (e.g. DES, AES) and mathematical functions (e.g. trigonometric functions, logarithmic function) may be used as well as the foregoing pseudorandom number generator function or hash function (e.g. SHA-1, MD5). Other functions except for them may also be used. An example of a trigonometric function (sine function) will be described below.

For example, the function used in this example is defined as follow.

"A function which outputs a hexadecimal number in the following manner: as an input value, obtained is a value of trigonometric function SIN(n) at a number n, the number n being a numeral character string in ASCII format and being treated as a decimal number; the absolute value of the foregoing value of sine function is obtained (since the output of sine function is within a range from −1 to +1); and from the digits of the absolute value to appear after the decimal point, a part is taken by necessary length and is outputted as a hexadecimal number"

For example, an information character string to be protection-encoded and the input value (protection-encoding data ID) are as follow.

Information character string to be protection-encoded (ASCII format): Hello

Information character string to be protection-encoded (HEX format): 0x48656C6C6F Input value (ASCII format): 7505

Here, the output value (protection-encoding data) is as follow. Output value: 8191520442 . . . (=sin(7505)=−0.8191520442 . . . )

The protection-encoding step using these values is as follow. The information character string "Hello" is "0x48656C6C6F" in HEX format. The output value (protection-encoding data) is "0x8191520442" in HEX format. The value obtained by XORing them is "0xC9F43E682D".

As a result of the foregoing protection-encoding step, information character string "Hello" is protection-encoded into the data codewords "0xC9F43E682D", which have no meaning. That is, concerning the information character string which has been subject to the protection-encoding step, its information is scrambled as viewed from a standard system, and the information character string cannot be read-out in a standard manner.

<Protection-Decoding>

Next, a protection-decoding step will be described. Here, described will be a method for protection-decoding the information character string which has been protection-encoded in the foregoing manner. Accordingly, the definitions of the functions used herein are the same as above.

The data codewords which have been protection-encoded and the input value (protection-encoding data ID) are as follow.
Data codewords which have been protection-encoded: 0xC9F43E682D
Input value (ASCII format): 7505

Here, the output value (protection-encoding data) is as follow.
Output value: 8191520442 . . . (=sin(7505)= −0.8191520442 . . . )

In the protection-decoding step using these values, the data codewords which have been protection-encoded is "0xC9F43E682D" in HEX format, and the output value (protection-encoding data) is "0x8191520442" in HEX format. The value obtained by XORing them is "0x48656C6C6F" in HEX format, that is, "Hello" in ASCII format.

As a result of the foregoing protection-decoding step, the data codewords "0xC9F43E682D", which have no meaning, are decoded into the information character string "Hello".

<Method for Embedding Closed Information>

There is described above methods for concealing the hidden-object information using the Structured-Append enhanced QR code and the protection-encoded Structured-Append enhanced QR code. However, as mentioned above, it has been assumed that a QR code can record both of open information and closed information. How to embed closed information in a QR code will be described in detail below.

For the purpose of detailed explanation, "closed information" is sometimes referred to as "closed-information words". This is because the description will be made on word-by-word basis which is finer than the foregoing description which is made on block-by-block basis.

In order to simplify the explanation, the description will be made without referring to the Structured-Append header block. This is because no processing trouble will actually occur even if the Structured-Append header block is contained in the original data. That is, in this example, the codewords of the original data are "TOKYO<cr>MINATO<cr>JPN" and the closed-information words are "0000000000009".

Figure 16:
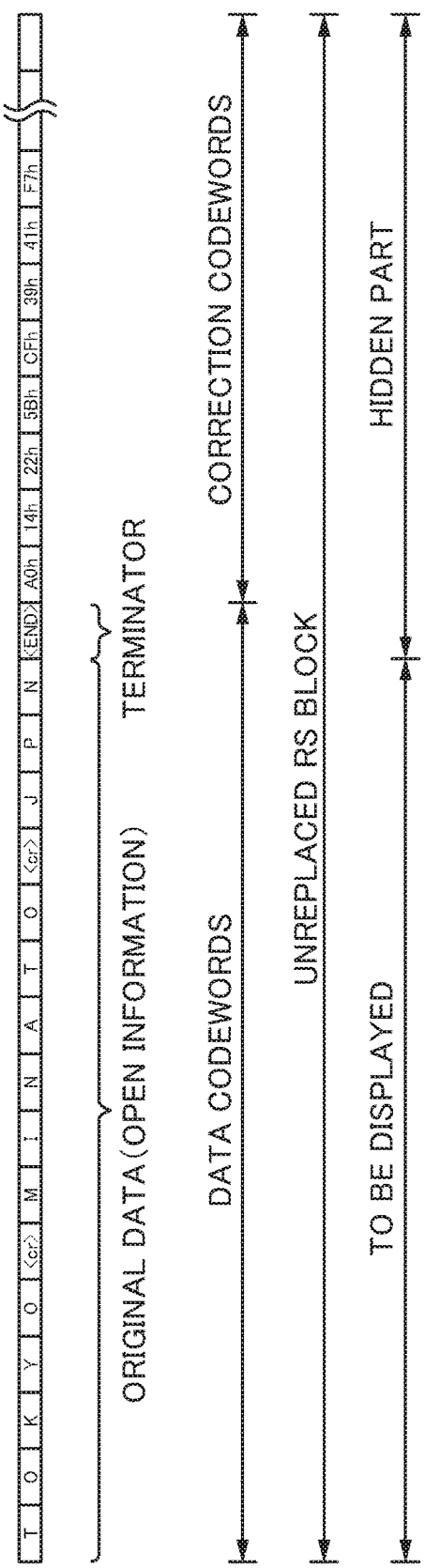
FIG. 16 is a diagram illustrating a RS block.
Figure 17:
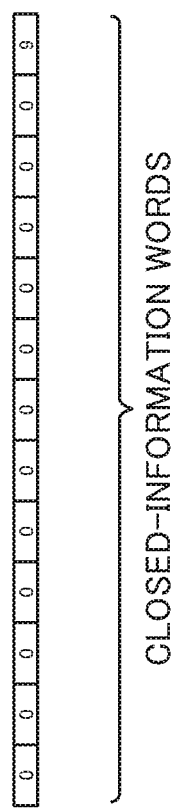
FIG. 17 is a diagram illustrating the closed-information word.

FIG. 16 is a diagram illustrating the RS block. FIG. 17 is a diagram illustrating the closed-information words. In the following description, unless otherwise stated, a procedure for encoding data to the QR code symbol 1 is a procedure in conformance with JIS is employed. Though a common QR code symbol 1 is composed of a plurality of RS blocks, one RS block will be described in this example for the purpose of explanation. Since the following description is given as examples in order to simplify the explanation, the lengths of the sets of codewords will be, in some cases, different from those of actual QR code symbols. Also, information contained therein will be, in some cases, different from that of actual QR code symbols.

The first embodiment assumes that the storage section 11b stores: "offset information" indicating the beginning position at which replacement with closed-information words starts (to be described later); and, "length (the number of words) information" of the closed-information words.

In this example, codewords of the original data is "TOKYO<cr>MINATO<cr>JPN" (FIG. 16), and closed-information words are "0000000000009" (FIG. 17). Retrieving the original data and the closed-information words may be performed via the input device 14, and also, information stored in advance in the storage section 11b may be used.

According to its version, the total number of the codewords in the QR code symbol 1 is determined. The total number of the codewords is the sum of the number of the correction codewords and the number of the data codewords; the number of the data codewords includes the number of the codewords of the original data. Also, according to the version of the QR code symbol 1, the size and the number of the RS blocks, consisting of the data codewords and the correction codewords, are determined. Error correction is made for each of the RS blocks.

For example, If error correction is "level H" and version is "4", the total number of the codewords is determined "100". It is also determined that a QR code symbol 1 includes four RS blocks. The number of the data codewords per RS block is "9", and the number of the correction codewords per RS block is "16".

The sum of the number of data codewords "9" and the number of correction codewords "16" is "25". Since there are four RS blocks like this, a QR code symbol of version "4" has 100 codewords in total: 25×4=100.

In this case, the number of error-correctable words per RS block is "8". This means a capability of correcting "8" data codewords of total "9" data codewords. Since there are four RS blocks, the QR code symbol has a correcting capability for 32 words in total: 4×8=32. It is possible to correct 32 words of 100 words, and this means that the QR code symbol has correcting capability of 32% in total.

The replacement with closed-information words is performed so that the number of the replace words in each RS block does not exceed the number of error-correctable words in the RS block. In the foregoing case, "8" codewords for each RS block can be replaced, and "32" codewords in total are allowed to be replaced (also referred to as "the total number of replaceable words").

If the lengths of the sets of codewords of the original data are long, the codewords of the original data is divided into a plurality of blocks. Error correction codewords are generated for each of the blocks, and the generated correction codewords are added next to the corresponding codewords. Then, RS blocks are generated. A procedure for generating correction codewords can be in conformance with JIS.

FIG. 16 shows an example of data codewords composed of original data and a terminator (corresponding to the open data codeword) and correction codewords. In this example, plain-text information is illustrated as the codewords of the original data. As the terminator, a sequence of bits "0000" may be employed, for example. A RS code which has been generated according to codewords including the original data is added to generate a RS block.

A part of the RS block generated as mentioned above is replaced with closed-information words (corresponding to closed data codeword).

Figure 18:
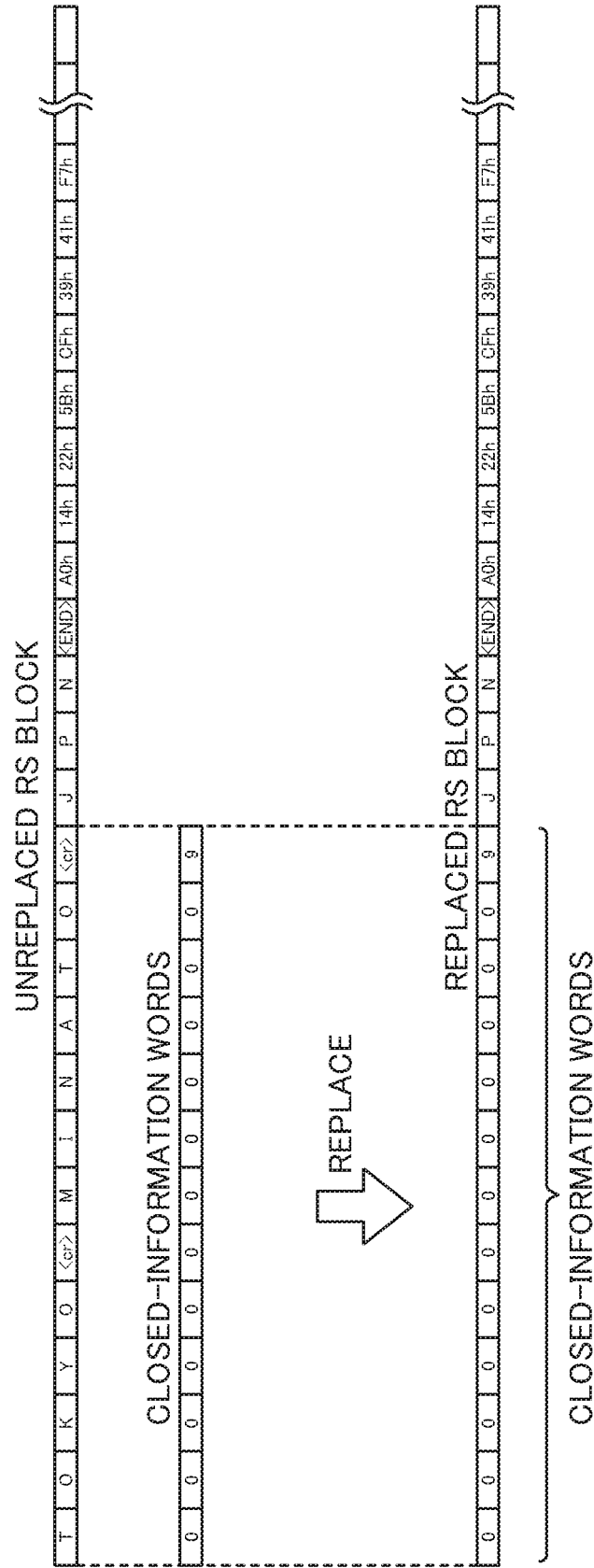
FIG. 18 is a first diagram illustrating how to replace a part of a RS block.

FIG. 18 is a first diagram illustrating how to replace a part of a RS block. FIG. 18 shows the foregoing RS block and closed-information words. As shown in FIG. 18, the RS block is replaced from its initial word with the closed-information words based on the length information and the offset information of the foregoing closed-information words.

If a part of a RS block is replaced with closed-information words as mentioned above, a part of the original data is lost. However, since correction can be made for each of the RS blocks, the standard decoder corrects, using a RS code, the original-data section which has been replaced. And, the original-data section can be appropriately read-out and displayed.

The part replaced with the closed-information words is treated as information which is considered as an error and which is discarded, the error being an error caused by contamination of the QR code symbol 1 or the like. Consequently, the standard decoder cannot display the closed-information words. On the other hand, the enhanced decoder 20 extracts the closed-information words from the replaced RS block, as described later. Thereafter, correction is made using the RS code, and the original-data section can be read-out.

As a procedure for generating the QR code symbol 1 based on the RS block, a procedure similar to a standard procedure for generating a QR code in conformance with JIS may be employed. This makes it possible to generate the QR code symbol 1.

Though, for the purpose of explanation, original data is plain-text data in the foregoing example, the data codewords of the original data themselves may be interleaved or encrypted. Unreplaced RS block may be generated by adding correction codewords to the original data which has been interleaved or the original data which has been encrypted. Interleaving and encrypting mentioned above may be performed for each bit of the original data, not for each codeword of the original data.

Also, the closed-information words may be interleaved or encrypted. The closed-information words may be encoded for the purpose of error detection or error correction (for example, coded into a RS code).

Next, a procedure for decoding the QR code symbol 1 generated as mentioned above will be described. This embodiment assumes that the storage section 21*b* of the decoder 20 stores the "length (the number of words) information" of closed-information words, and "offset information" indicating the beginning position at which replacement with the closed-information words starts.

Figure 19:
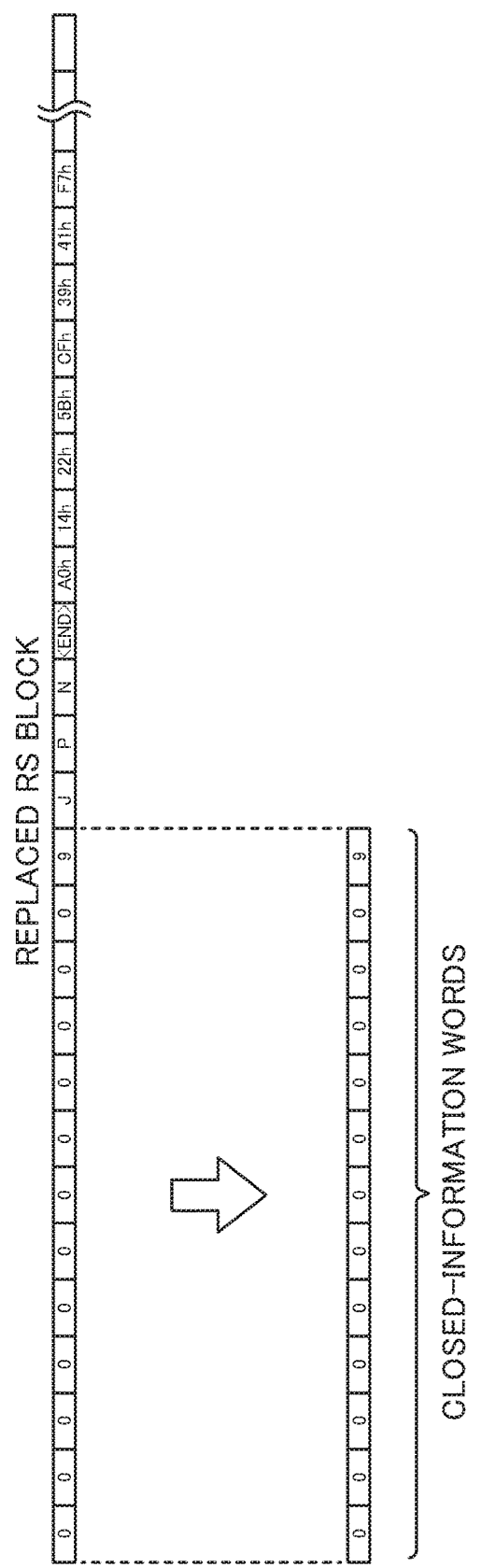
FIG. 19 is a diagram illustrating reading-out method for extracting closed-information words.

FIG. 19 is a diagram illustrating reading-out method for extracting closed-information words. FIG. 19 shows a replaced RS block and closed-information words.

The replaced RS block can be acquired by reading and expanding the QR code symbol in conformance with JIS. The decoder 20 identifies the positions of the closed-information words in the replaced RS block, based on the offset information and the length information of the closed-information words, both pieces of information being stored in the storage section 21*b*. The closed-information words are extracted from the identified positions.

Figure 20:
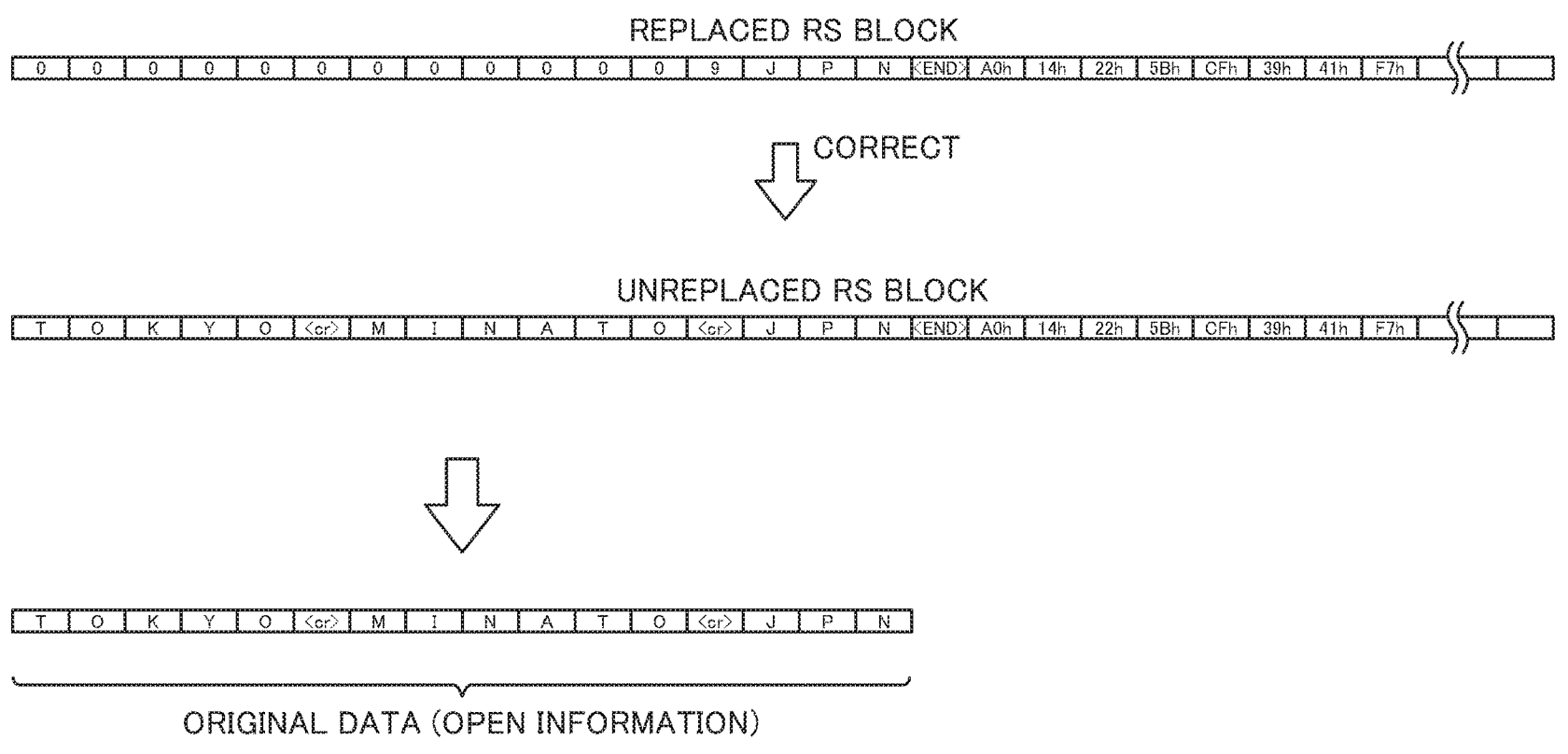

FIG. 20 is a diagram illustrating a method for reading-out original data. The decoder 20 acquires an unreplaced RS block by performing error correction of the replaced RS block. The decoder 20 reads-out information which is located from the initial end of the unreplaced RS block to a terminator, and the data which has been read-out will be treated as the original data.

If the data codewords of the original data themselves are interleaved as mentioned above, the data codewords are subsequently sorted in a certain procedure so as to be in its original order. If the data codewords of the original data are encrypted, the original data is decoded in a certain decoding method.

Next, as a comparative example, an output result will be described in a case in which the standard decoder reads an enhanced QR code symbol 1. When the standard decoder reads the QR code symbol 1, correction of the entire RS block is made according to the RS code of the replaced RS block. An original-data section is corrected, and the corrected original data is displayed by the standard decoder. Unlike the foregoing enhanced decoder 20, the standard decoder does not have a function to extract closed-information words from the replaced RS block. Accordingly, the standard decoder can read-out the original data only, and cannot extract the closed-information words.

Further, as a comparative example, an output result will be described in a case in which a common QR code symbol is read by the enhanced decoder 20. When the enhanced decoder 20 reads a common QR code symbol, RS blocks can be acquired based on this. A RS block acquired from a common QR code symbol does not include closed-information words. However, at the time of acquiring the RS block, the enhanced decoder 20 cannot judge whether or not the read symbol 1 is an enhanced QR code symbol or is a common QR code symbol.

Accordingly, as in the procedure according to the first embodiment, the enhanced decoder 20 extracts data codewords as closed-information words, from the positions where the closed-information words of a RS block are placed. Based on the RS code of the RS block, the entire RS block is subsequently corrected. Consequently, the original-data section is corrected, and the corrected original data is displayed by the enhanced decoder 20.

The codewords which have been read-out as closed-information words are judged whether or not they are closed-information words as follow. If the ratio of difference between a RS block before correction and a RS block after correction exceeds a predetermined value, it can be judged that the codewords which have been read are closed-information words (that is, it can be judged that the QR code symbol is an enhanced QR code symbol). If the ratio of difference does not exceed the predetermined value, it can be judged that the codewords are not closed-information words (that is, it can be judged that the QR code symbol is a common QR code symbol), and it is possible not to display closed-information words. This is because the ratio of difference between an unreplaced RS block and a replaced RS block always exceeds a predetermined value if replacement with closed-information words is performed.

Figure 21:
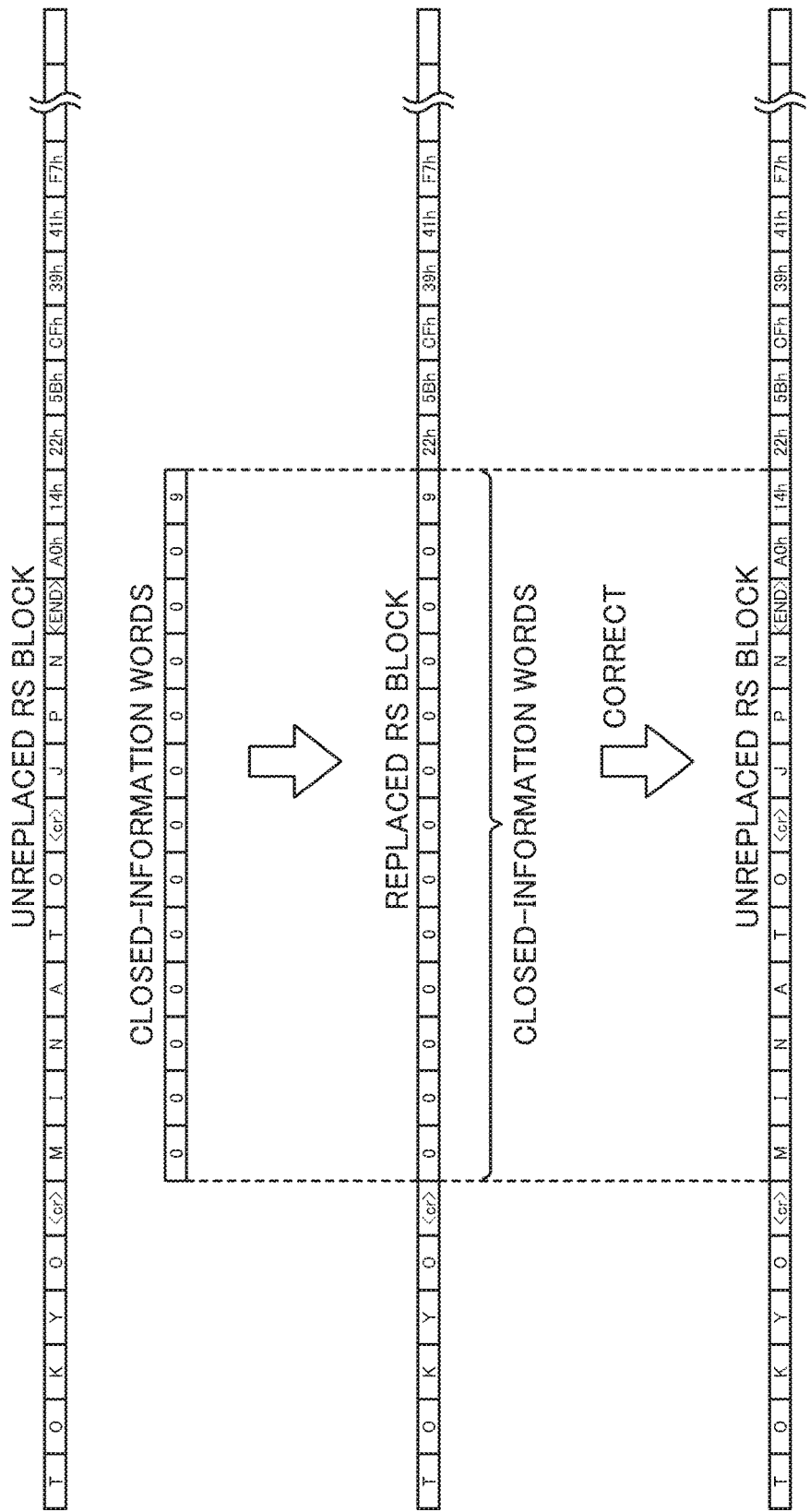
FIG. 21 is a second diagram illustrating how to replace a part of a RS block.

FIG. 21 is a second diagram illustrating how to replace a part of a RS block. In the foregoing procedure, the RS block is replaced sequentially from its initial word with closed-information words. However, taking into consideration the correcting capability of Reed-Solomon code, any positions in the RS block may be replaced with closed-information words.

In this case, it is possible to predetermine a position of the RS block at which replacement with the closed-information words starts (how many words from the initial word to the position). For example, as shown in FIG. 21, a RS block may be replaced with 13 closed-information words from the replacement start position, which is of the seventh word from the initial word. In this case, the storage section 11b of the enhanced encoder 10 and the storage section 21b of the enhanced decoder 20 store the offset information that the closed-information words starts from the position of seventh word in the replaced RS block, the position having been predetermined. Also, these storage sections store length information that the length of the closed-information words is 13 words. In this case, since the number of closed-information words is smaller than the number of words which can be corrected with the RS code, correcting makes it possible to appropriately acquire an unreplaced RS block. It is possible to read-out the original data from the unreplaced RS block.

In this case, the final end of the closed-information words with which the RS block has been replaced may be defined by adding a certain separator to the final word of closed-information words.

Figure 22:
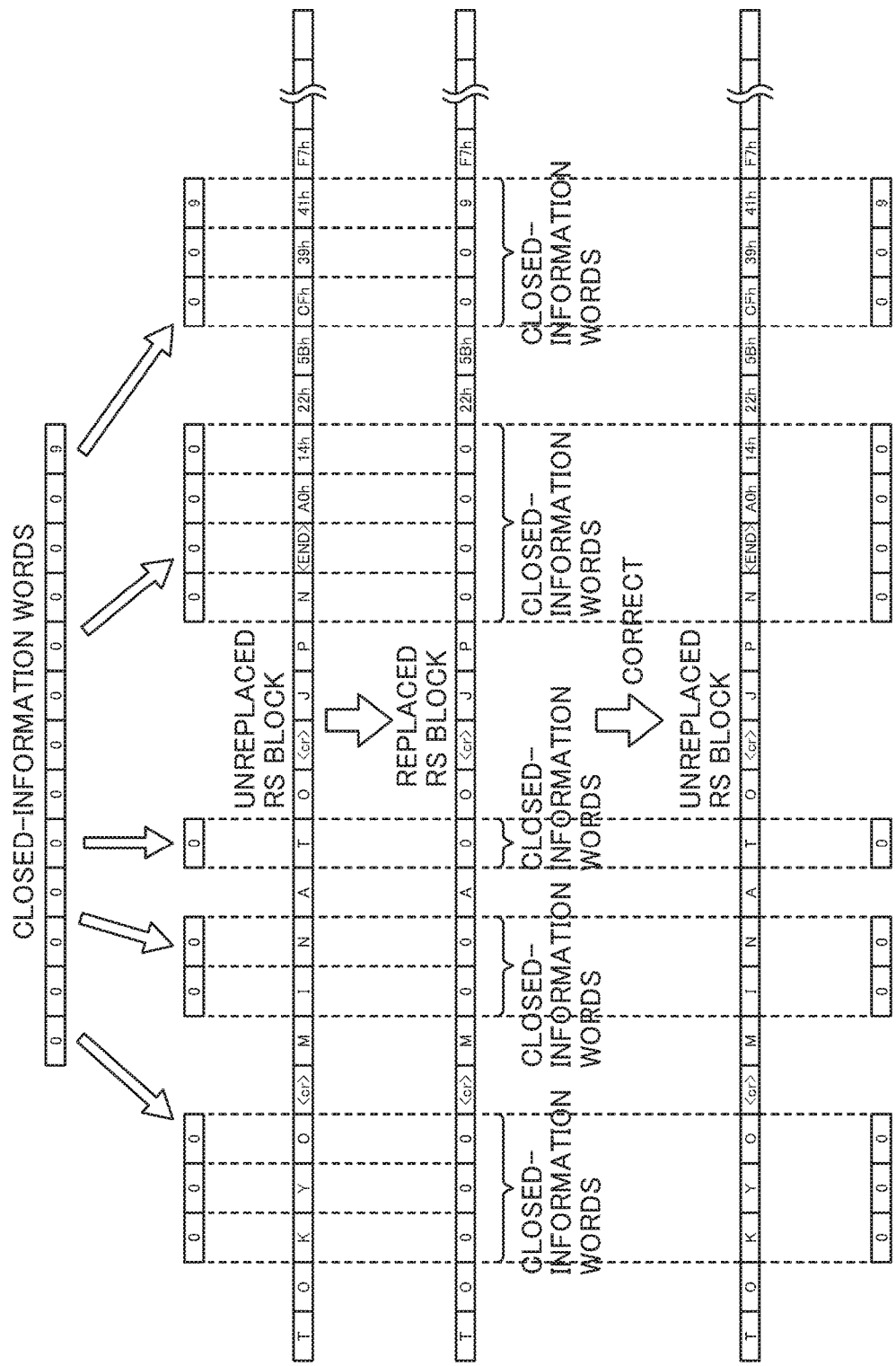
FIG. 22 is a third diagram illustrating how to replace a part of a RS block.

FIG. 22 is a third diagram illustrating how to replace a part of a RS block. In this example, parts of a RS block are replaced with closed-information words which are divided into multiple parts.

In this case, it is possible to predetermine a plurality of positions from which the RS block is to be replaced with the parts of closed-information words. For example, as shown in FIG. 22, the following replacements are acceptable. The RS block is replaced with three closed-information words from a replacement start position, which is of 3rd word from the initial word. And, the RS block is replaced with two closed-information words from a replacement start position, which is of eighth word from the initial word. And, the RS block is replaced with one closed-information word from a replacement start position, which is of 11th word from the initial word. And, the RS block is replaced with four closed-information words from a replacement start position, which is of 16th word from the initial word. And, the RS block is replaced with three closed-information words from a replacement start position, which is of 22th word from the initial word.

In this case, the storage section 11b of the enhanced encoder 10 and the storage section 21b of the enhanced decoder 20 stores the foregoing information as the offset information and as the length information. Accordingly, the enhanced decoder 20 can extract each part of the closed-information words from the corresponding positions, which are identified in advance. Also in this case, since the number of closed-information words is smaller than the number of words which can be corrected with the RS code, correction allows the unreplaced RS block to be appropriately acquired. It is possible to read-out the original data from the unreplaced RS block.

Second Embodiment

In the foregoing first embodiment, information of the positions of the offset information and the length information of closed-information words is stored in advance in the storage section 11b of the enhanced encoder 10 and in the storage section 21b of the enhanced decoder 20 (the information of the positions is hereinafter referred to as placement information). In the second embodiment, placement information is stored in header data codewords (a "header" in the drawings). In addition, the header data codewords are contained in a replaced RS block in the second embodiment.

Figure 23:
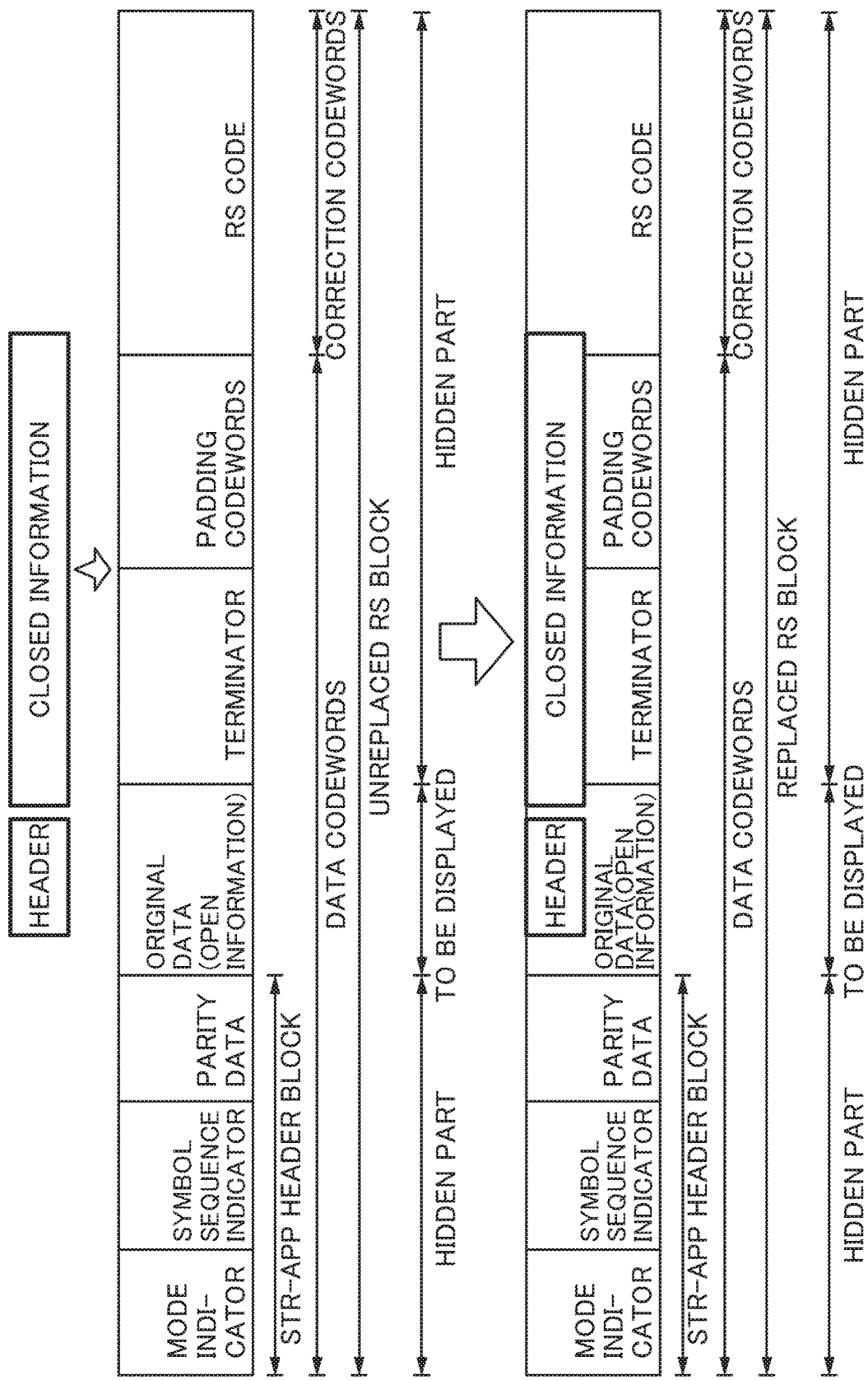
FIG. 23 is a conceptual diagram of a RS block according to the second embodiment.

FIG. 23 is a conceptual diagram of a RS block according to the second embodiment. As known from a comparison FIG. 23 with FIG. 5, which is according to the foregoing first embodiment, in the second embodiment, the enhanced encoder 10 replaces a part of an unreplaced RS block with header data codewords and closed-information words, and generates a replaced RS block.

In the second embodiment, a replacement with the header data codewords and a replacement with the closed-information words, both are performed so that the number of the replaced words does not exceed the number of error-correctable words in the RS block. That is, the total number of the header data codewords and the closed-information words does not exceed the number of error-correctable words in the RS block.

The header data codewords shown in FIG. 23 contains placement information of the closed-information words, as mentioned above. Accordingly, with reference to the header data codewords, it is possible to locate the beginning position of the closed-information words and its length (the number of words). The positions of the header data codewords are predetermined. In addition, the header data codewords can contain information related to the format of the closed-information words. Information related to the format of the closed-information words contains the following types of information: information of a cryptographic key which is used if the closed-information words are encrypted; and information of sorting which is performed if the closed-information words are interleaved. If the closed-information words are encoded for the purpose of error detection or error correction, information of a procedure for error detection or error correction is also contained.

Figure 24:
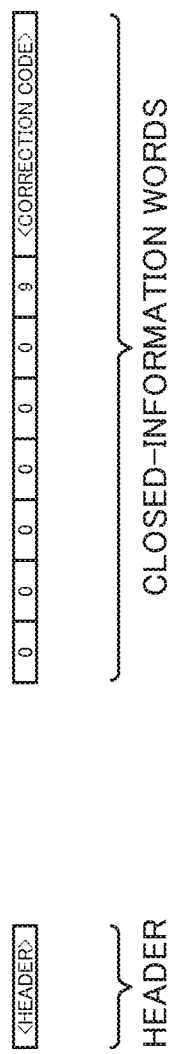
FIG. 24 is a diagram illustrating a header and closed-information words according to the second embodiment.

FIG. 24 is a diagram illustrating header data codewords and closed-information words according to the second embodiment. FIG. 24 shows the header data codewords and the closed-information words, and also shows that the closed-information words contain correction-code words.

Figure 25:
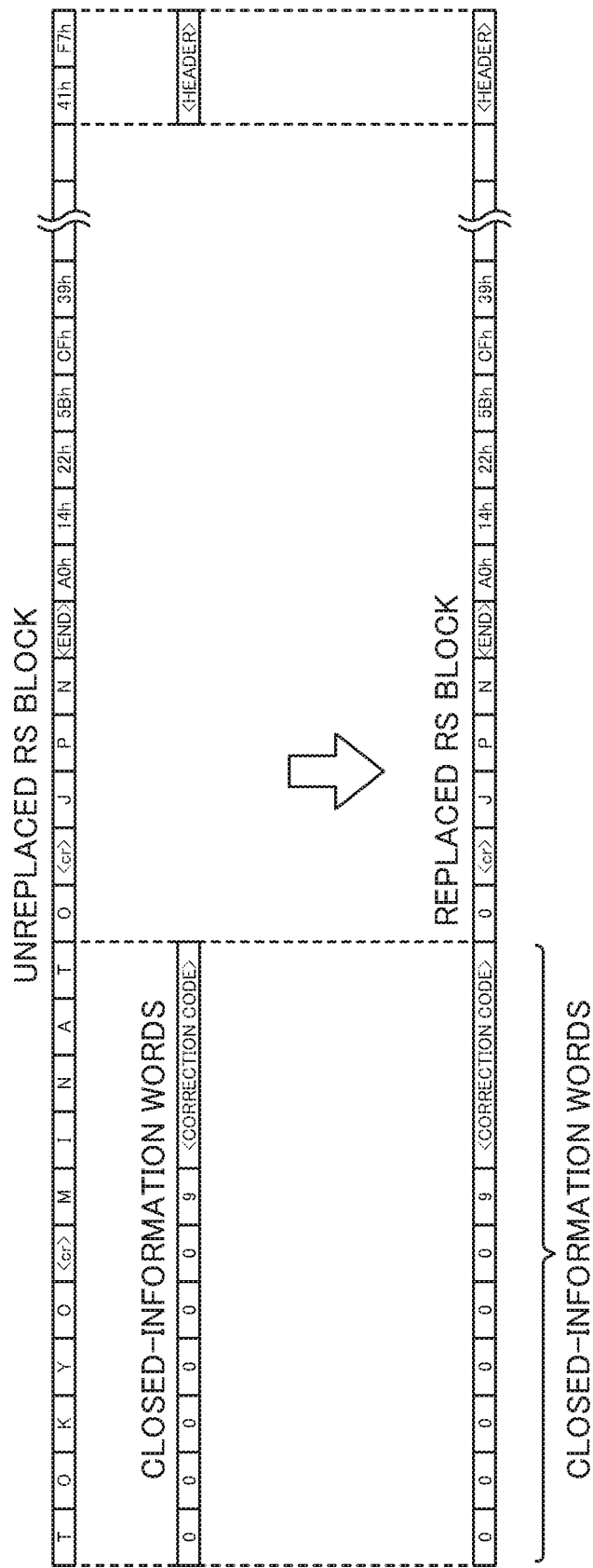
FIG. 25 is a first diagram illustrating how to replace a part of a RS block in a procedure according to the second embodiment.

FIG. 25 is a first diagram illustrating how to replace a part of a RS block in a procedure according to the second embodiment. FIG. 16 shows a RS block, closed-information words, and header data codewords. In this example, as shown in FIG. 25, the RS block is replaced from its initial word with the closed-information words by the enhanced encoder 10. The final end part of the RS block is replaced with the header data codewords. The header data codewords contains placement information of the closed-information words (in this case, information that the beginning of the closed-information words is the initial word of the RS block (zero offset), and information that the length is 11 words).

If a part of a RS block is replaced with the closed-information words as mentioned above, a part of the original data and a part of the correction codewords are lost. However, correction can be made for each of RS blocks. Accordingly, using a RS code, the standard decoder can correct the original-data section which has been replaced. And, the standard decoder can appropriately read-out and display the original-data section. The part which is replaced with the closed-information words is treated as information which is considered as an error and which is discarded, the error being an error caused by contamination of the QR code symbol 1 or the like. Consequently, the standard decoder cannot display the closed-information words.

On the other hand, the enhanced decoder 20 extracts the closed-information words from the replaced RS block. And, the enhanced decoder 20 acquires from the header data codewords, placement information which is for locating the positions of the closed-information words. Based on the placement information, the closed-information words are extracted. Since the correction-code words are added to the closed-information words, the contaminated closed-information words can be corrected using the correction-code words.

If the closed-information words are interleaved, the closed-information words can be sorted in its original order based on the information of an interleaving procedure contained in the header data codewords. Also, if the original data is interleaved, the original data can be sorted in its original order based on the information of an interleaving procedure contained in the header data codewords. If the closed-information words are encrypted, the closed-information words can be decoded based on a cryptographic key contained in the header data codewords or the like. As mentioned above, if the closed-information words are encoded for the purpose of error detection or error correction (for example, coded into a RS code), a procedure for correcting an error can be specified based on information contained in the header data codewords.

After the closed-information words are extracted as mentioned above, the enhanced decoder 20 corrects the replaced RS block and obtains an unreplaced RS block. Then, the original-data section contained in the unreplaced RS block is read-out. And, the closed-information words and the original-data section which have been read-out are displayed.

Figure 26:
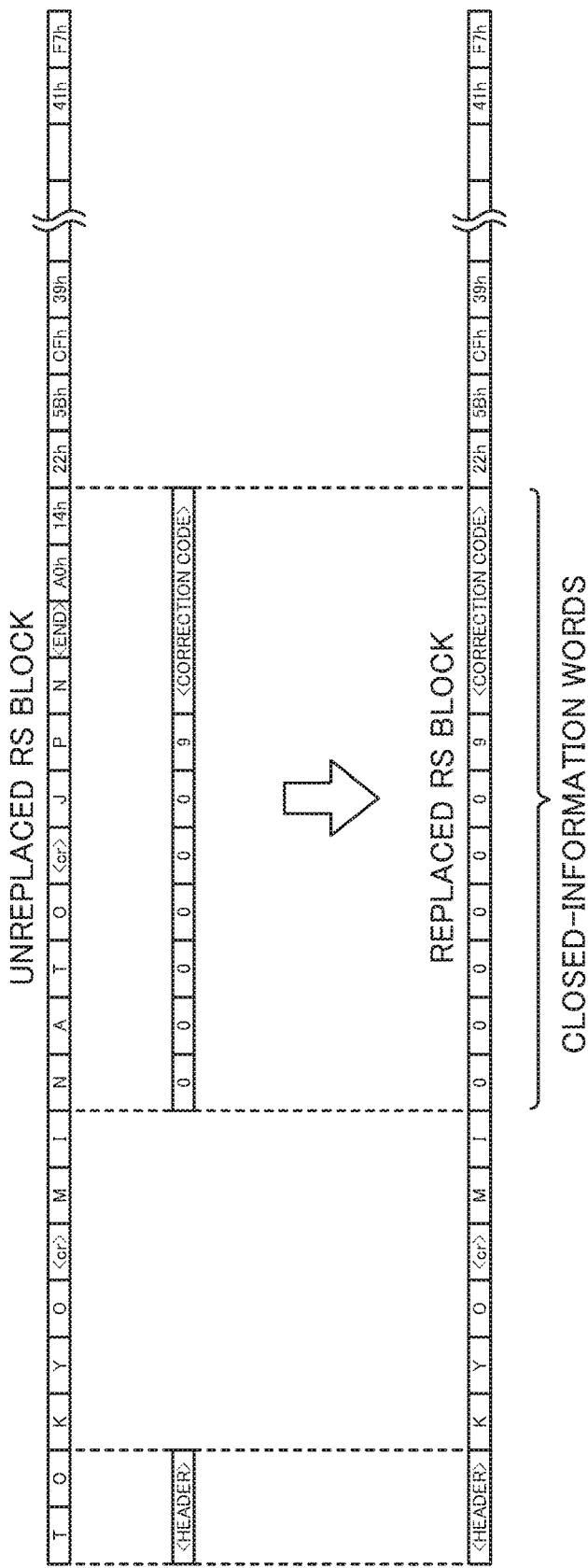
FIG. 26 is a second diagram illustrating how to replace a part of a RS block in a procedure according to the second embodiment.

FIG. 26 is a second diagram illustrating how to replace a part of a RS block in a procedure according to the second embodiment. In the procedure shown in FIG. 26, the RS block is replaced sequentially from its initial word with closed-information words. However, as shown in FIG. 26, the RS block may be replaced, from any position which is not of the initial word, with closed-information words.

In a case shown in FIG. 26, offset information in the header data codewords contains that the RS block is replaced with the closed-information words from the 9th word of the RS block. Also, length information in the header data codewords contains that the length of the closed-information words is 11 words. This makes it possible to appropriately extract the closed-information words by referring the header data codewords, as in the first embodiment.

This also can be applied to a case in which the RS block is replaced with separated closed-information words as shown in the foregoing FIG. 22.

Figure 27:
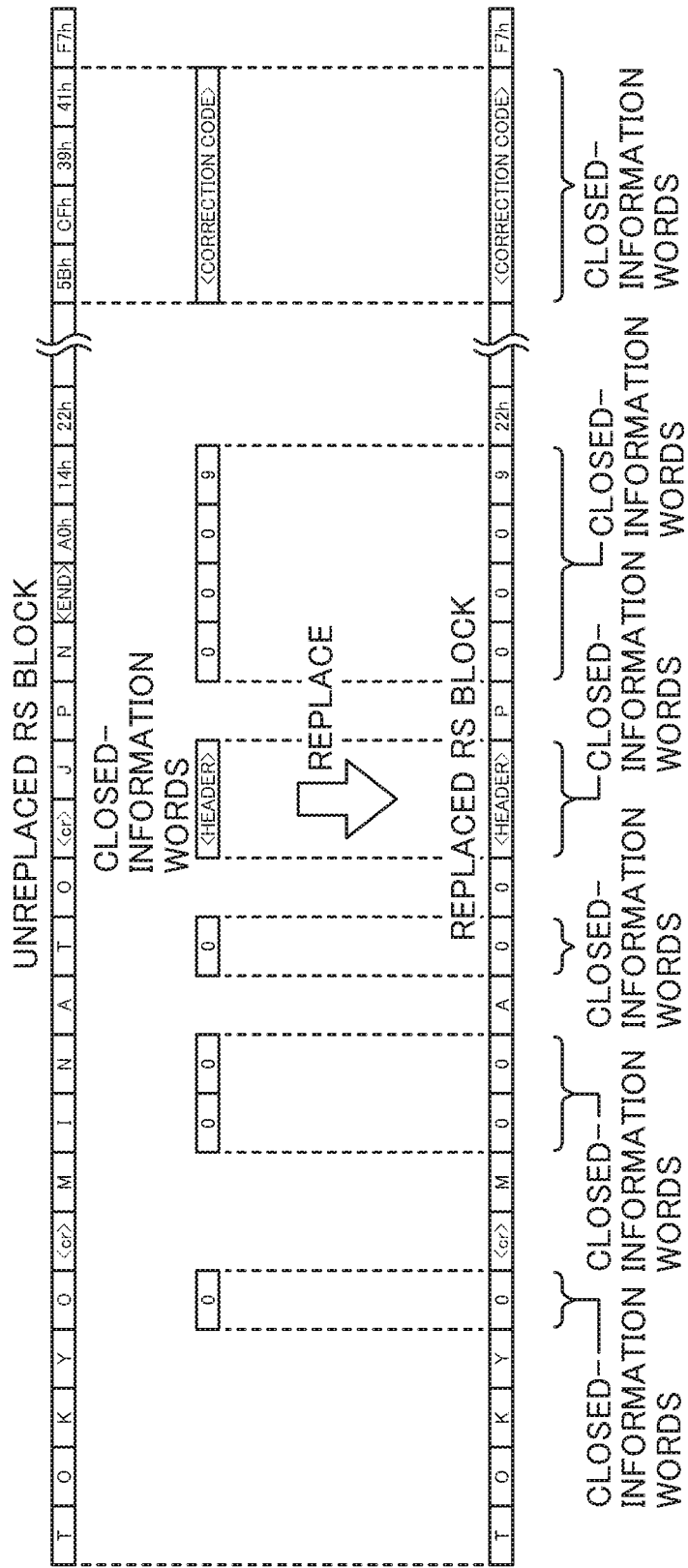
FIG. 27 is a third diagram illustrating how to replace a part of a RS block in a procedure according to the second embodiment.

FIG. 27 is a third diagram illustrating how to replace a part of a RS block in a procedure according to the second embodiment. In this example, it is predetermined that the beginning position of the header data codewords is the 13th word of the RS block, and it is predetermined that the length of the header data codewords is two words. If the RS block is replaced with the separated closed-information words as mentioned above, the header data codewords contain a plurality of pieces of placement information of the closed-information words. This makes it possible to appropriately extract the closed-information words with reference to the header data codewords.

In the foregoing description, the positions of the header data codewords are predetermined. However, the positions of the header data codewords may be indicated by delimiters which are respectively placed adjacent to the header data codewords on both sides of the header data codewords.

Concerning whether the read QR code symbol is a common QR code symbol or is a QR code symbol according to the second embodiment, the judgment can be made based on whether or not the extracted closed-information words include header data codewords. That is, since a QR code symbol according to the second embodiment contains header data codewords, the enhanced decoder 20 can display closed-information words. On the other hand, since a common QR code symbol does not contain a header data codeword, the enhanced decoder 20 can display only information to be displayed without displaying the closed-information words.

Third Embodiment

Figure 28:
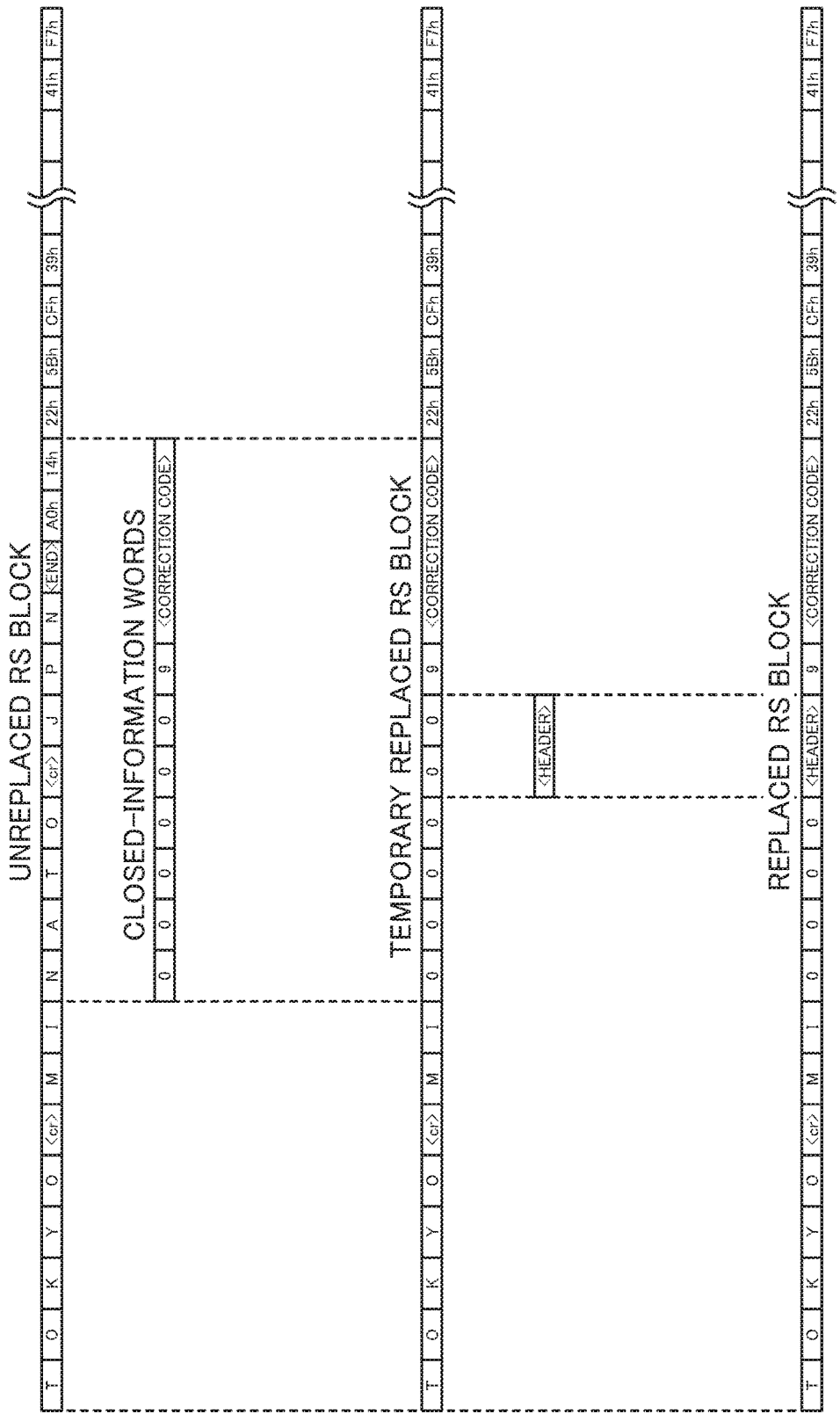
FIG. 28 is a diagram illustrating how to replace a part of a RS block in a procedure according to the third embodiment.

FIG. 28 is a diagram illustrating how to replace a part of a RS block in a procedure according to the third embodiment. FIG. 28 shows an unreplaced RS block, closed-information words, a temporary replaced RS block, header data codewords and a replaced RS block.

In the third embodiment, the enhanced encoder 10 replaces a part of the unreplaced RS block with the closed-information words, and generates the temporary replaced RS block. The closed-information words include the correction-code words, which have a correcting capability sufficiently to correct words replaced with the header data codewords, as described later.

Next, the enhanced encoder 10 replaces a part of the temporary replaced RS block with the header data codewords, the part of the temporary replaced RS block being a part of the replaced words which have been replaced with the closed-information words. And, the enhanced encoder 10 generates the replaced RS block. Subsequently, the enhanced encoder 10 generates a QR code symbol based on the generated replaced RS block.

Next, a decoding procedure will be described. The enhanced decoder 20 according to the third embodiment reads a QR code symbol generated as mentioned above, and expands a replaced RS block. Then, the enhanced decoder 20 reads-out the header data codewords. The positions of the header data codewords may be predetermined as in the first embodiment and the second embodiment. Also, the positions of the header data codewords may be indicated by delimiters which are respectively placed adjacent to the header data codewords on both sides of the header data codewords.

Based on placement information contained in the header data codewords which has been read-out as mentioned above, the positions of the closed-information words are identified, and then the closed-information words are extracted. Since the closed-information words contains correction-code words as mentioned above, correction based on the correction-code words allows to appropriately correct a part which has been replaced with the header data codewords. Thus, the closed-information words before being replaced with header data codewords are appropriately extracted.

This makes it possible to acquire a temporary replaced RS block. Next, the decoder 20 performs a correcting operation using correction-code words, the correction-code word being included in the unreplaced RS block. Thus, a part replaced with the closed-information word is appropriately corrected, and the unreplaced RS block can be acquired. Then, the enhanced decoder 20 can read-out the original data from the unreplaced RS block.

In the third embodiment, the number of closed-information words does not exceed the number of words which can be corrected with correction-code words included in the unreplaced RS block. In the third embodiment, the number of header data codewords does not exceed the number of words which can be corrected with correction-code words contained in the closed-information words. This makes it possible to read-out appropriately the closed-information word and the original data.

In the third embodiment, a part of replaced words which have been replaced with the closed-information words is replaced with header data codewords. For this reason, the header data codewords overlap the closed-information words. Accordingly, the total length of the header data codewords and the closed-information words can be reduced. This makes it possible to increase reserve capability for detecting and correcting an error of the QR code symbol.

In the third embodiment, as in the second embodiment, concerning whether the read QR code symbol is a common QR code symbol or is a QR code symbol according to the third embodiment, the judgment can be made based on whether or not the extracted closed-information words include header data codewords. That is, since a QR code symbol according to the third embodiment contains header data codewords, the enhanced decoder 20 can display closed-information words. On the other hand, since a common QR code symbol does not contain header data codewords, the enhanced decoder 20 can display only information to be displayed without displaying closed-information words.

Fourth Embodiment

Figure 29:
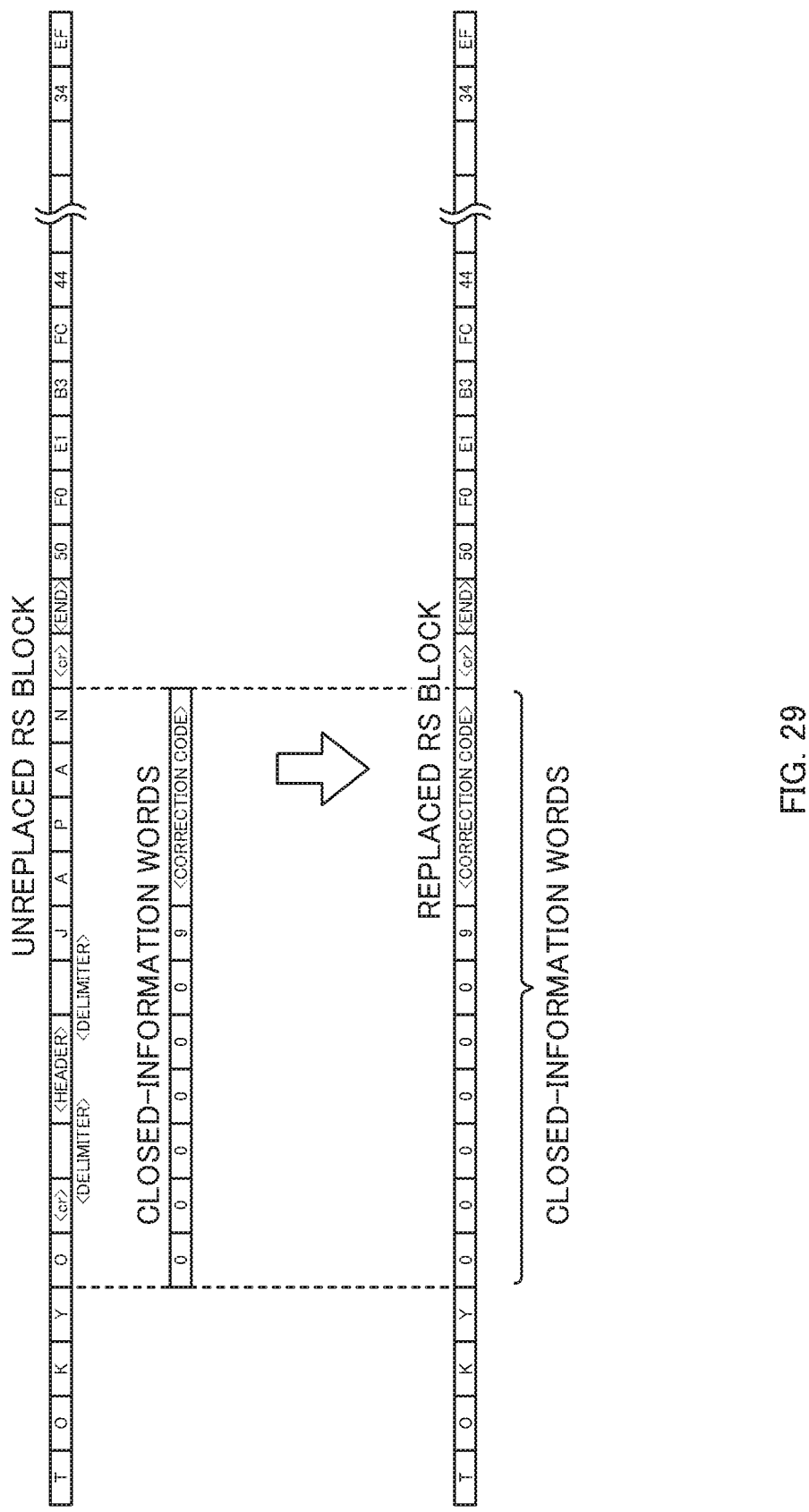
FIG. 29 is a diagram illustrating how to replace a part of a RS block in a procedure according to the fourth embodiment.

FIG. 29 is a diagram illustrating how to replace a part of a RS block in a procedure according to the fourth embodiment. FIG. 29 shows an unreplaced RS block, closed-information words and a replaced RS block.

In the fourth embodiment, the original data of the unreplaced RS block contains header data codewords. Delimiters (each indicated as "<deli>" in FIG. 29) are placed adjacent to the header data codewords on both sides of the header data codewords. These delimiters separate information to be displayed and the header data codewords in the original data.

In order to generate the foregoing unreplaced RS block, in the fourth embodiment, the enhanced encoder 10 generates original data, which includes information to be displayed, header data codewords, and delimiters. The header data codewords contain the placement information of closed-information words (to be described later). The enhanced encoder 10 generates the correction codewords based on the original data composed of them (including padding codewords, if any). And, the enhanced encoder 10 generates the unreplaced RS block.

Next, the enhanced encoder 10 replaces a part of the unreplaced RS block with the closed-information words. The replacement positions are positions corresponding to the placement information, which is contained in the header data codewords. The enhanced encoder 10 generates the replaced RS block. Subsequently, the enhanced encoder 10 generates a QR code symbol based on the replaced RS block.

Next, a decoding procedure will be described. The enhanced decoder 20 according to the fourth embodiment reads a QR code symbol generated as mentioned above, and expands a replaced RS block. Then, the enhanced decoder 20 corrects the replaced RS block based on the correction-code words which are included in the unreplaced RS block, and thereby an unreplaced RS block can be acquired. The unreplaced RS block includes the header data codewords separated by the delimiters, as mentioned above. The enhanced decoder 20 locates the positions of the closed-information words and extracts the closed-information words from the replaced RS block based on the placement information, the placement information being included in the header data codewords. The extracted closed-information words may be corrected using the correction-code words which are included in the closed-information words.

Header data codewords, which contain the placement information of closed-information words, are replaced with closed-information words as mentioned above, and the replaced RS block is consequently generated. This makes it difficult to locate the positions of closed-information words in the replaced RS block. This can make it more difficult for a third party to extract closed-information words.

In the fourth embodiment, concerning whether the read QR code symbol is a common QR code symbol or is a QR code symbol according to the fourth embodiment, the judgment can be made based on whether or not the unreplaced RS block which has been read-out includes header data codewords. That is, since the unreplaced RS block according to the fourth embodiment includes header data codewords, the enhanced decoder 20 can display closed-information words. On the other hand, since a common QR code symbol does not include header data codewords, the enhanced decoder 20 can display only information to be displayed without displaying the closed-information words.

Fifth Embodiment

Figure 30:
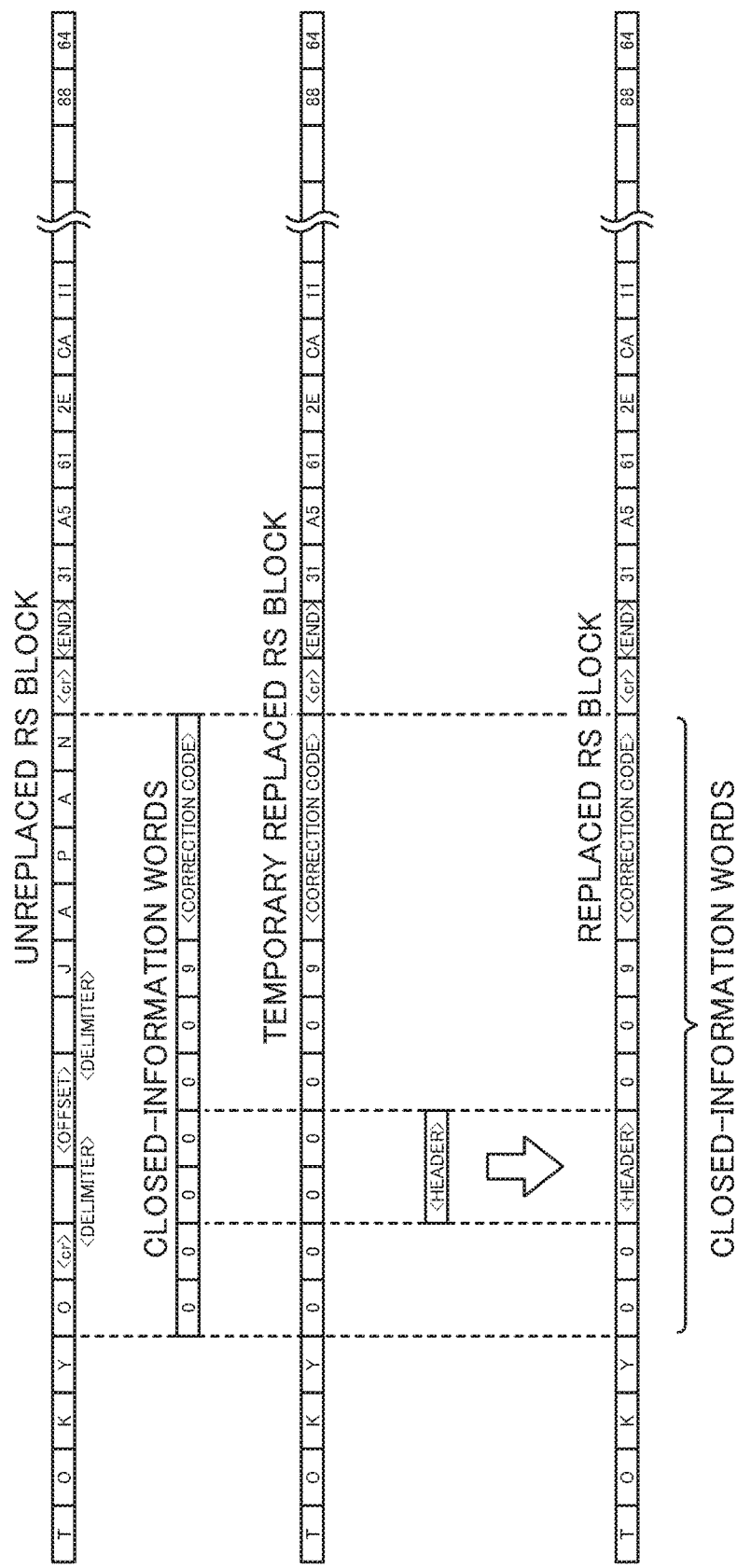
FIG. 30 is a diagram illustrating how to replace a part of a RS block in a procedure according to the fifth embodiment.

FIG. 30 is a diagram illustrating how to replace a part of a RS block in a procedure according to the fifth embodiment. FIG. 30 shows an unreplaced RS block, closed-information words, header data codewords and a replaced RS block.

In the fifth embodiment, the original data of the unreplaced RS block contains header-offset-position-information words, which contain the position information of header data codewords (indicated as "<OFFSET>" in FIG. 30 and corresponding to the "header-position-data codeword"). Delimiters are respectively placed adjacent to the header-offset-position-information words on both sides of the header-offset-position-information words. These delimiters separate information to be displayed and the header-offset-position-information words in the original data.

In order to generate the foregoing unreplaced RS block, in the fifth embodiment, the enhanced encoder 10 generates original data, which includes information to be displayed, header-offset-position-information words, and delimiters. The enhanced encoder 10 generates the correction codewords based on the original data composed of them (including padding codewords, if any). And, the enhanced encoder 10 generates the unreplaced RS block.

Next, the enhanced encoder 10 replaces a part of an unreplaced RS block with closed-information words. The replacement positions are positions corresponding to the placement information of the closed-information words, the placement information being contained in the header data codewords. In this example, the placement information of closed-information words contains information that replacement with the closed-information words starts from the fifth word of the RS block, and that the length of the closed-information words is 11 words. And, the enhanced encoder 10 generates a temporary replaced RS block.

Next, the enhanced encoder 10 replaces with the header data codewords a part of the closed-information words in the temporary replaced RS block. The replacement positions are positions corresponding to the position information of the header data codewords, the position information being contained in the header-offset-position-information words. In this example, the header-offset-position-information words contain information that replacement is performed from the seventh word of the RS block. The length of the header data codewords is set to two words in advance. Based on these pieces of information, the enhanced encoder 10 replaces the RS block with the header data codewords, and the enhanced encoder 10 generates the replaced RS block. Subsequently, the enhanced encoder 10 generates a QR code symbol based on the replaced RS block.

Next, a decoding procedure will be described. The enhanced decoder 20 according to the fifth embodiment reads a QR code symbol generated as mentioned above, and expands a replaced RS block. Then, the enhanced decoder 20 corrects the replaced RS block based on correction-code words which are included in the RS block, and thereby an unreplaced RS block can be acquired. The unreplaced RS block includes the header-offset-position-information words separated by the delimiters, as mentioned above.

Based on the header-offset-position-information words, the enhanced decoder 20 locates the positions of the header data codewords in the replaced RS block. The enhanced decoder 20 reads-out the header data codewords from the located positions in the replaced RS block, and thereby the placement information of the closed-information word can be acquired.

The enhanced decoder 20 extracts the closed-information words from the replaced RS block based on the placement information of the closed-information words. However, a part of the closed-information words is replaced with the header data codewords. Accordingly, the enhanced decoder 20 performs correction based on the correction-code words, the correction-code words being contained in the closed-information words. Consequently, the closed-information words before being replaced with the header data codewords can be acquired. This makes it possible to acquire appropriately closed-information words.

Further, the enhanced decoder 20 acquires information words which are obtained by removing the header-offset-position-information words and delimiters from the original data of the unreplaced RS block.

Thus, the header-offset-position-information words, which indicate the positions of the header data codewords, are contained in the original data. In addition, the header-offset-position-information words are replaced with the closed-information words. These make it more difficult to locate the positions of the closed-information words. Accordingly, it can be more difficult for a third party to extract the closed-information words.

As in the foregoing second embodiment, any positions in the RS block may be replaced with the closed-information words based on the placement information of the closed-information words, the placement information being contained the header data codewords. In addition, the RS block may be replaced with the closed-information words which are divided into multiple parts. It is possible to encrypt or interleave the closed-information words, based on information of the header data codewords.

Though the positions of the header data codewords is located based on "offset", the positions of the header data codewords may be located in another procedure.

In the fifth embodiment, as in the second embodiment, concerning whether the read QR code symbol is a common QR code symbol or is a QR code symbol according to the fifth embodiment, the judgment can be made based on whether or not the extracted closed-information words include header data codewords. That is, since a QR code symbol according to the fifth embodiment contains header data codewords, the enhanced decoder 20 can display closed-information words. On the other hand, since a common QR code symbol does not contain header data codewords, the enhanced decoder 20 can display only information to be displayed without displaying the closed-information words.

Sixth Embodiment

Figure 31:
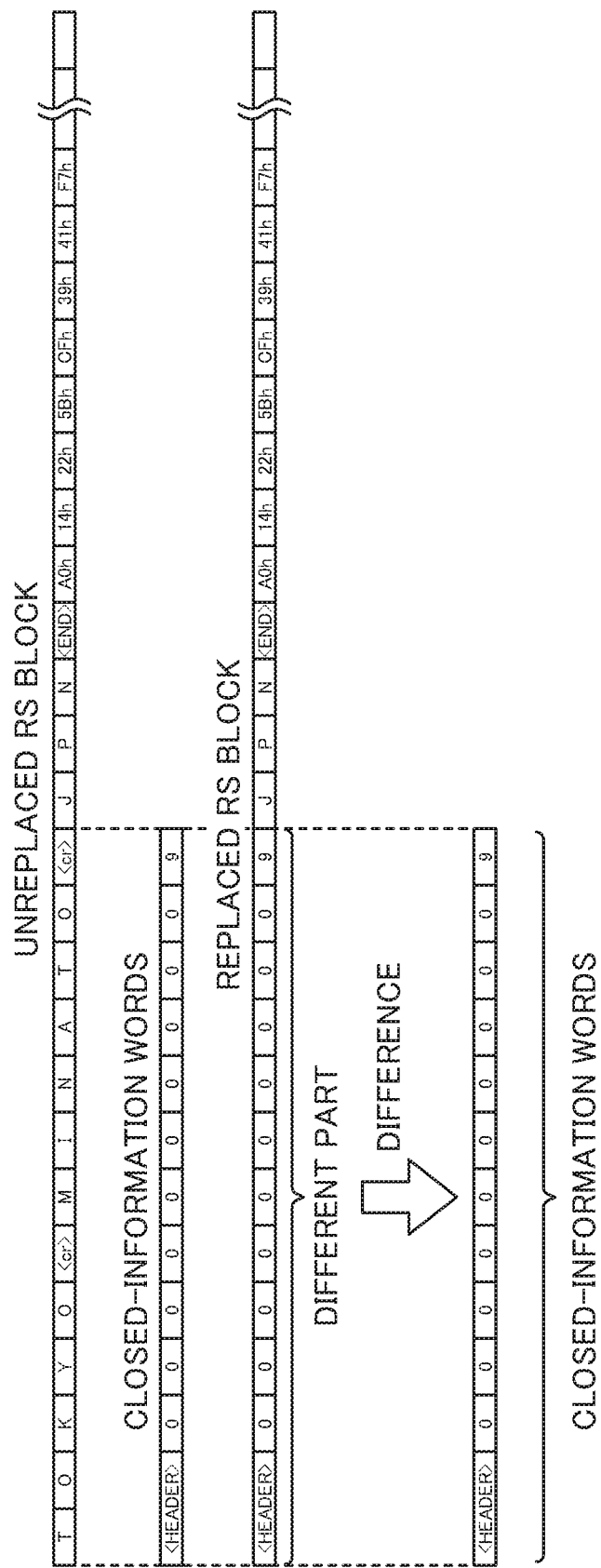
FIG. 31 is a first diagram illustrating how to replace a part of a RS block in a procedure according to the sixth embodiment.

FIG. 31 is a first diagram illustrating how to replace a part of a RS block in a procedure according to the sixth embodiment. FIG. 31 shows an unreplaced RS block, closed-information words and a replaced RS block.

In the sixth embodiment, the enhanced encoder 10 generates the correction codewords based on original data (including padding codewords, if any). And, the enhanced encoder 10 generates the unreplaced RS block. Next, the enhanced encoder 10 replaces a part of the unreplaced RS block with the closed-information words. Then, the enhanced encoder 10 generates the replaced RS block, and generates a QR code symbol based on the replaced RS block. Thus, in the sixth embodiment, a method for generating a QR code symbol has almost the same procedure as in the first embodiment.

Next, a decoding procedure will be described. The enhanced decoder 20 according to the sixth embodiment reads the QR code symbol generated as mentioned above, and expands the replaced RS block. The enhanced decoder 20 corrects the replaced RS block based on the correction-code words, which is included in the RS block, and thereby the unreplaced RS block is acquired.

The enhanced decoder 20 compares the unreplaced RS block with the replaced RS block. Then, the enhanced decoder 20 reads-out a part of the replaced RS block, the part being different from the unreplaced RS block. The information words, which have been read-out as mentioned above, serve as the closed-information words. The original data is read-out from the unreplaced RS block. Since a terminator is placed in the unreplaced RS block between the original data and the correction-code words, the decoder 20 can separate the original data and the correction-code words according to the terminator.

This makes it possible to read-out the closed-information words and the original data. With a procedure according to the sixth embodiment, it is sufficient that a comparison is merely made between the unreplaced RS block and the replaced RS block to read-out a part having a difference. Accordingly, it is not advantageously necessary to provide the placement information of the closed-information words. That is, if the header data codewords are used, the number of the header data codewords can decrease.

Figure 32:
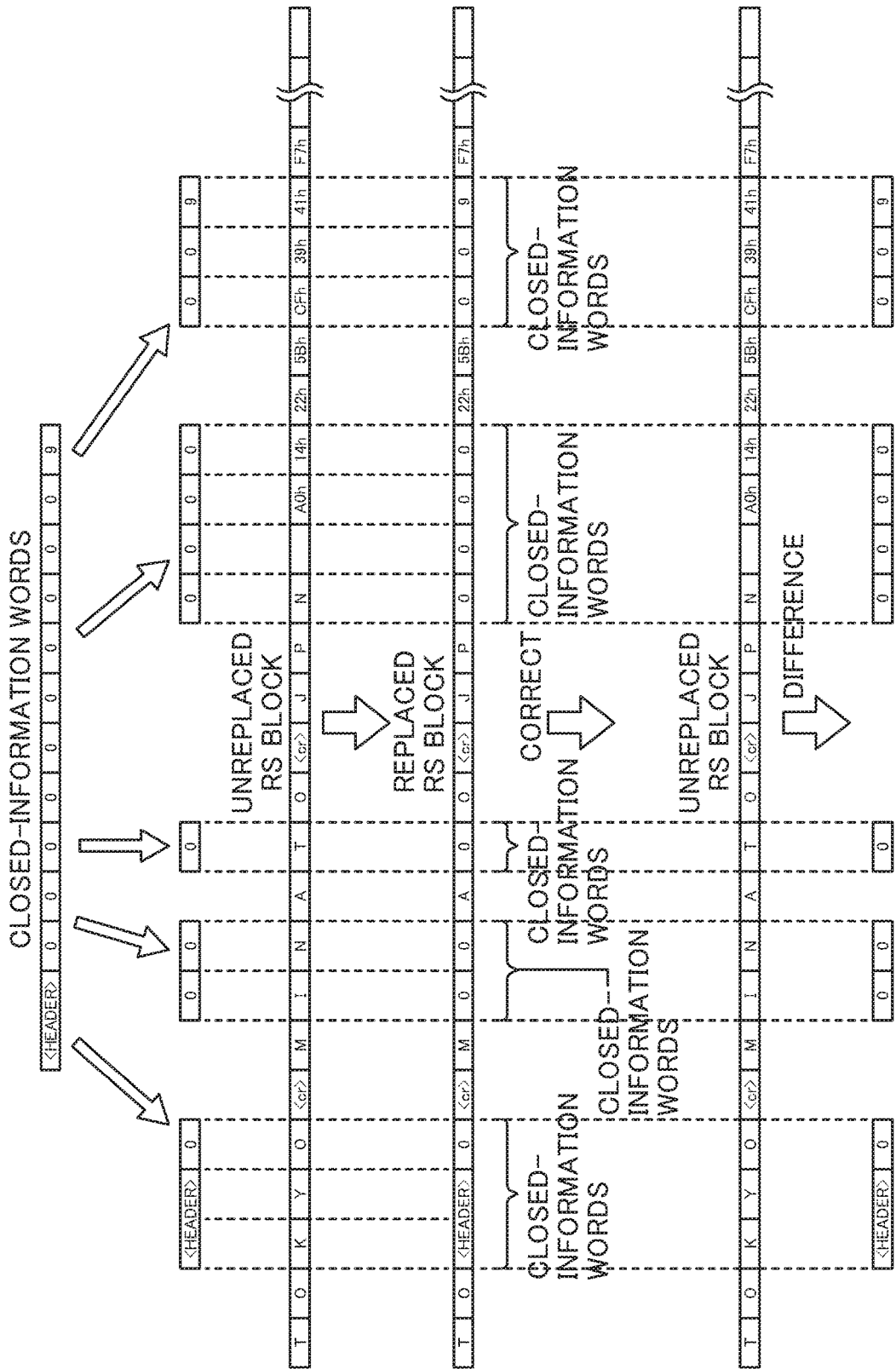
FIG. 32 is a second diagram illustrating how to replace a part of a RS block in a procedure according to the sixth embodiment.

FIG. 32 is a second diagram illustrating how to replace a part of a RS block in a procedure according to the sixth embodiment. In this example, parts of a RS block are replaced with closed-information words which are divided into multiple parts.

For example, as shown in FIG. 32, the closed-information words can be divided into five parts and parts of RS block can be replaced with them. In this case, since the number of the closed-information words is smaller than the number of words which can be corrected with the RS code, it is possible to appropriately acquire the unreplaced RS block by performing correction. In this case, it is possible to acquire the closed-information words by obtaining the difference between the unreplaced RS block and the replaced RS block. And, the original data can be acquired by reading-out data words from the positions in the unreplaced RS block, which are identified in advance.

The foregoing procedure in which the closed-information words are extracted based on the difference is effective, in particular, in cases in which a QR code symbol and its RS blocks are less likely to be contaminated. For example, in cases in which an image data file of a QR code symbol is generated and then the file is retrieved to read-out closed-information words, the QR code symbol will not be contaminated because there is no chance that the QR code symbol is exposed outside.

The foregoing procedure has an advantage that closed-information words can be identified without providing a header data codeword or the like. This makes it possible to replace a RS block with more closed-information words.

As in the first embodiment, the codewords which have been read as closed-information words are judged whether or not they are closed-information words as follow. If the ratio of difference between a RS block before correction and a RS block after correction exceeds a predetermined value, it can be judged that the codewords which have been read are closed-information words (that is, it can be judged that the QR code symbol is a QR code symbol according to the sixth embodiment). If the ratio of difference does not exceed the predetermined value, it can be judged that the codewords are not closed-information words (that is, it can be judged that the QR code symbol is a common QR code symbol), and it is possible not to display closed-information words. This is because the ratio of difference between an unreplaced RS block and a replaced RS block always exceeds a predetermined value if replacement with closed-information words is performed.

If decoding is performed based on the difference in the foregoing procedure, there is a problem that a part of an unreplaced data block will not be read-out as a difference, which is accidentally identical to a part of a replaced data block which has been replaced with closed-information words (but, this is extremely rare). In this case, it is assumed that the words contained in header data codewords and in closed-information words are always replaced without being separated.

Figure 33:
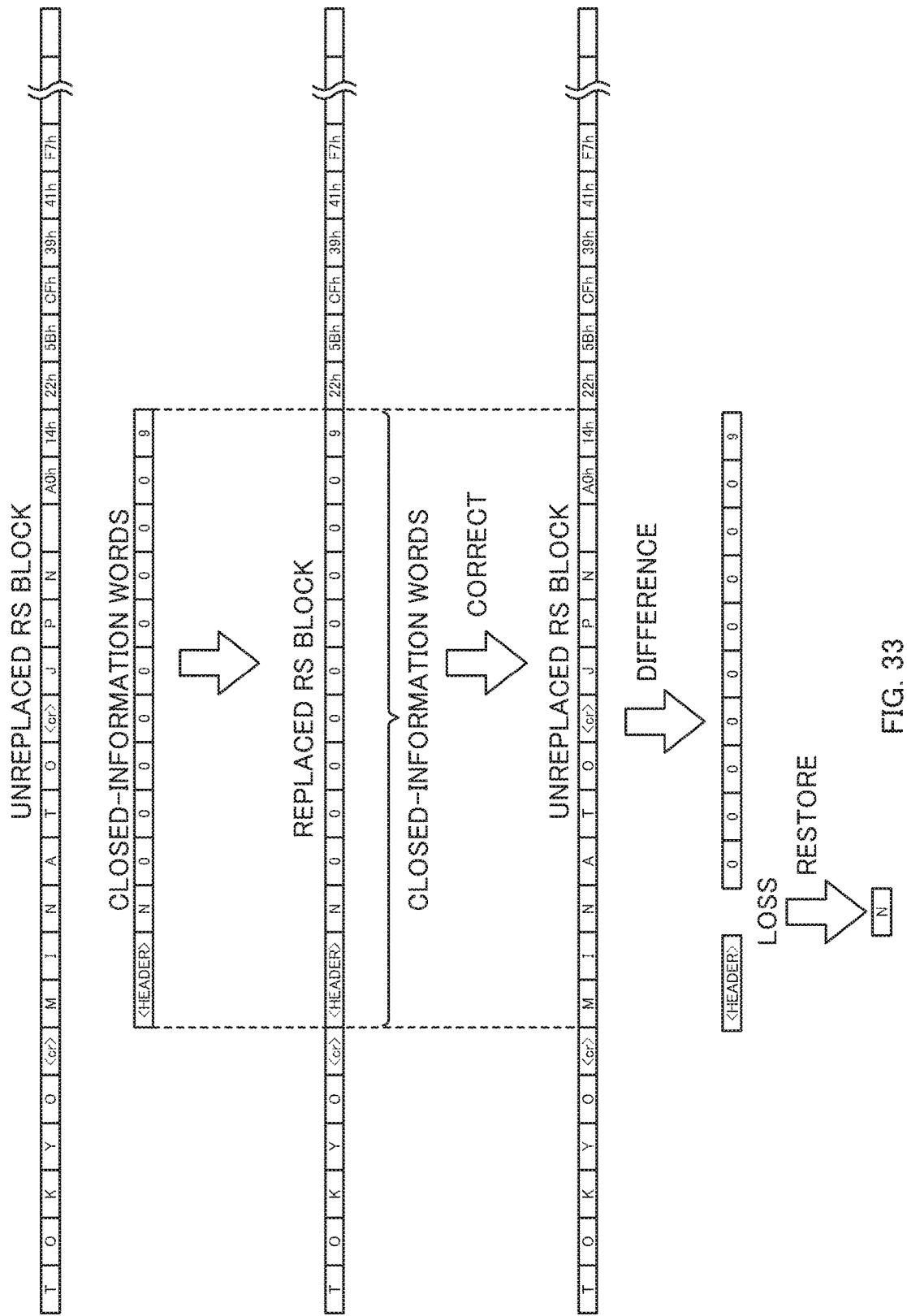
FIG. 33 is a third diagram illustrating how to replace a part of a RS block in a procedure according to the sixth embodiment.

FIG. 33 is a third diagram illustrating how to replace a part of a RS block in a procedure according to the sixth embodiment. In this example, the rule that the header data codewords and the closed-information words are placed continuously is applied. Because of this rule, these words are always replaced continuously. Accordingly, even if accidentally-identical words are lost, the information can be restored by filling the lost part with the accidentally-identical words.

It is sufficient that, if codewords which are located at positions except for the ends of a RS block are lost, the lost parts are filled with the data codewords which are located at corresponding positions. However, if codewords which are located at an end of a RS block are lost, it is difficult to identify whether the loss has occurred at the initial end or at the final end. In this case, several restorations are performed for the end and are verified, as to be mentioned below.

Figure 34:
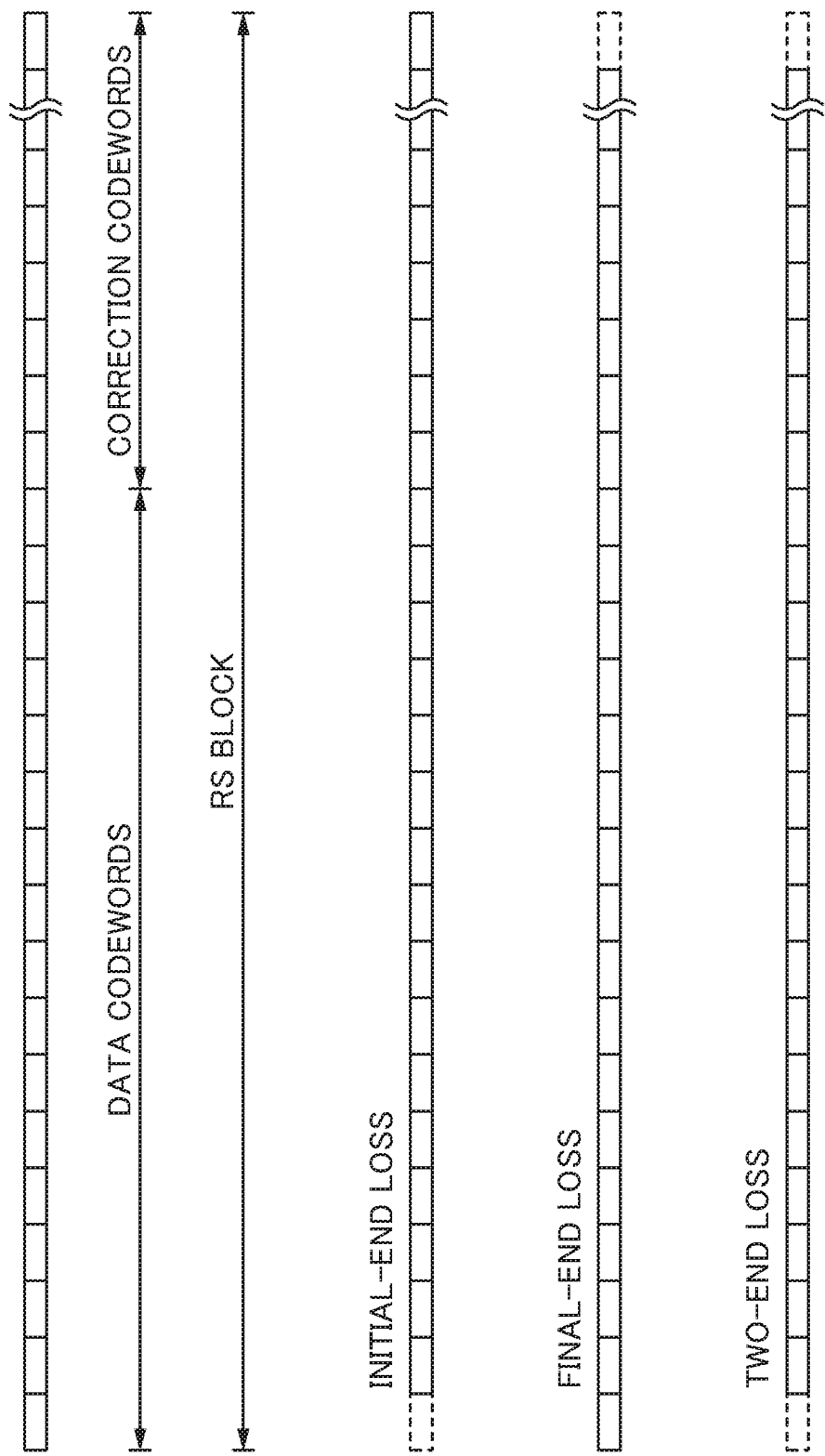
FIG. 34 is a diagram illustrating RS blocks having a data loss.

FIG. 34 is a diagram illustrating RS blocks a part of which is lost. FIG. 34 shows the following four types of RS blocks: a RS block without any loss; a RS block having a loss at the initial end of the data codewords (hereinafter referred to as an initial-end-loss RS block); a RS block having a loss at the final end of correction codewords (hereinafter referred to as a final-end-loss RS block); and a RS block having losses at both ends (hereinafter referred to as a two-end-loss RS block). For the purpose of explanation, there is no codeword in each cell. In these figures, the lost codewords are indicated by dashed lines. Thus, concerning the cases in which loss occurs at an end or ends of a RS block, there are three types.

For the initial end and the final end of such a RS block, there are possible combinations of restoration patterns. All restoration combinations are performed and are verified as follow: (1) whether correction can be processed for the restored RS block and (2) if the correction is processed, whether a result of the correction has correct block syntax.

Figure 35:
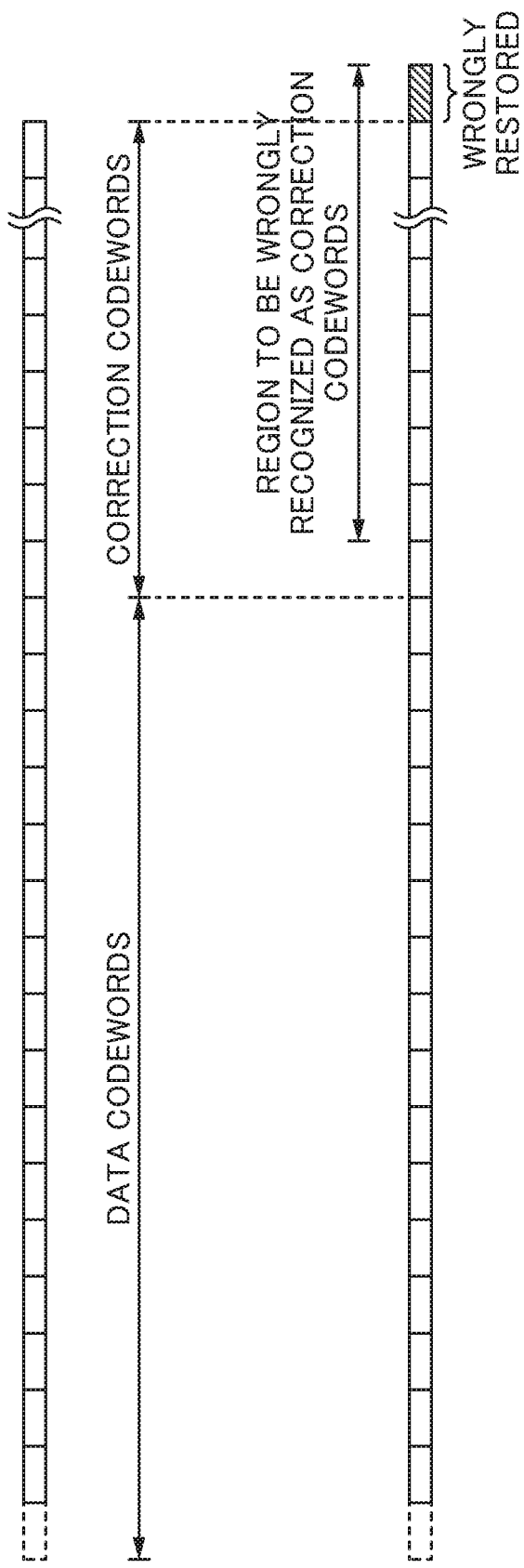
FIG. 35 is a diagram illustrating how to restore an initial-end-loss RS block.

FIG. 35 is a diagram illustrating how to restore an initial-end-loss RS block. FIG. 35 shows the initial-end-loss RS block which is wrongly restored. In the initial-end-loss RS block, the initial end of the RS block should be restored. But, from appearance of a RS block having a loss, it cannot be judged that whether the loss occurs at the initial end or at the final end. Accordingly, a RS block whose initial end is restored is generated, and also a RS block whose final end is restored is generated. These two RS blocks which have been restored will undergo correction using correction codewords.

Since the RS block whose initial end is restored is a correct RS block, correction is appropriately processed, and a result of the correction has a correct block syntax.

On the other hand, as shown in FIG. 35, in a RS block whose final end is restored, the positions of correction codewords are estimated based on the expected length of words. As a result, the wrong positions are identified as the positions of correction codewords. Correction is performed based on the codewords in a region which is wrongly recognized as correction codewords in the foregoing way. Accordingly, correction is not appropriately processed.

In this example, it is assumed that a loss of one codeword occurs. But, if a plurality of codewords are lost, the wrong positions are identified as the positions of correction codewords. Accordingly, correction is not appropriately processed.

Figure 36:
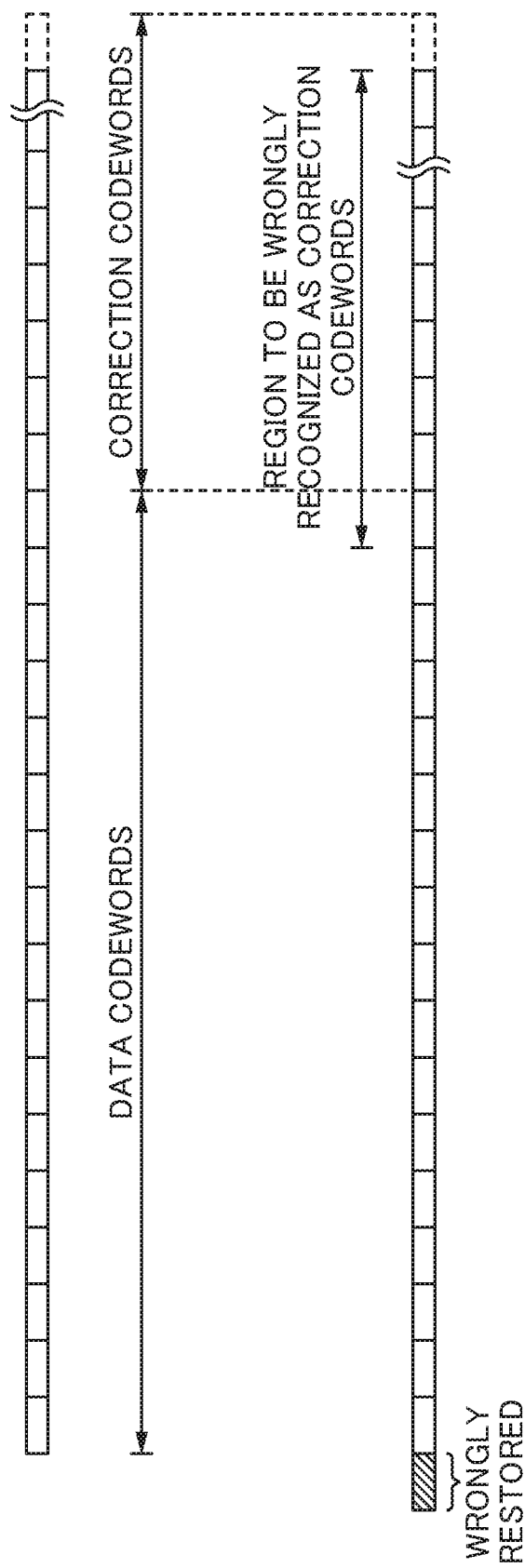
FIG. 36 is a diagram illustrating how to restore a final-end-loss RS block.

FIG. 36 is a diagram illustrating how to restore the final-end-loss RS block. FIG. 36 shows the final-end-loss RS block which is wrongly restored. In the final-end-loss RS block, the final end of the RS block should be restored. But, from appearance of a RS block having a loss, it cannot be judged that whether the loss occurs at the initial end or at the final end. Also in this case, a RS block whose initial end is restored is generated, and a RS block whose final end is restored is generated. These two RS blocks which have been restored will undergo correction using correction codewords.

Since the RS block whose final end is restored as a correct RS block, correction is appropriately processed, and a result of the correction has correct block syntax.

On the other hand, as shown in FIG. 36, in a RS block whose initial end is restored, the positions of correction codewords are estimated based on the expected length of words. As a result, the wrong positions are identified as the positions of correction codewords. Correction is performed based on the codewords in a region which is wrongly recognized as correction codewords in the foregoing way. Accordingly, correction is not appropriately processed.

In this example, it is assumed that a loss of one codeword occurs. But, if a plurality of codewords are lost, the wrong positions are identified as the positions of correction codewords. Accordingly, correction is not appropriately processed.

Figure 37:
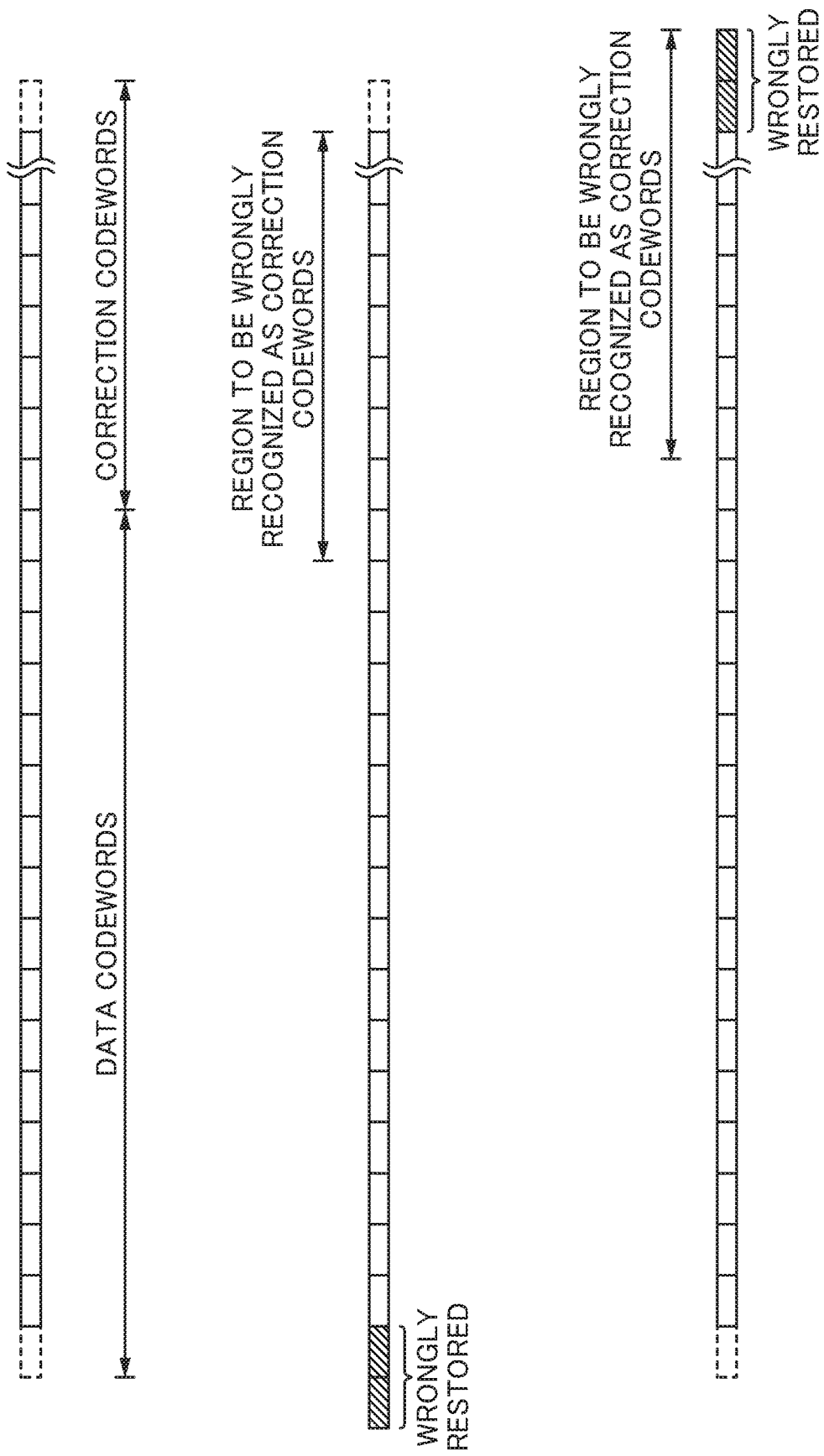
FIG. 37 is a diagram illustrating how to restore a two-end-loss RS block.

FIG. 37 is a diagram illustrating how to restore the two-end-loss RS block. FIG. 37 shows two-end-loss RS blocks which are wrongly restored. In this example, it is assumed that a loss of one codeword occurs at each end. In the two-end-loss RS block of these types, each of one-word losses at the initial end and at the final end should be restored. But, also in this case, from appearance of a RS block having losses, it cannot be judged how the loss occurs.

Accordingly, in this case, the following RS blocks are generated: a RS block in which two words at the initial end are restored; a RS block in which two words at the final end are restored; and a RS block in which two words respectively located at the initial and final ends are restored. For each of the restored RS blocks, correction is performed using a correcting block. A method for verification, which is subsequently performed, is the same as in a case in which the initial-end-loss RS block is restored and as in a case in which the final-end-loss RS block is restored. The description thereof will therefore be omitted.

As mentioned above, by restoring in all possible patterns and verifying the restoring, it is possible to acquire a RS block which has been appropriately restored.

In this example, though the foregoing three types of the cases are described, the number of times of verifications changes depending on the number of lost data codewords.

For example, if one data codeword is lost as mentioned above, there are two possible cases: a case in which one codeword at the initial end is lost; and a case in which one codeword at the final end is lost.

If two data codewords are lost, there are three possible cases: a case in which two codewords at the initial end are lost; a case in which two codewords at the initial end are lost and one codeword at the final end is lost; and a case in which two codewords at the final end are lost.

If three data codewords are lost, there are four possible cases: a case in which three data codewords at the initial end are lost; a case in which two codewords at the initial end are lost and one codeword at the final end is lost; a case in which one codeword at the initial end is lost and two codewords at the final end are lost; a case in which three data codewords at the final end are lost.

According to this regularity, if N codewords are lost at the ends in total, (N+1) types of verifications are performed. As a result of (N+1) types of verifications, it is possible to employ a RS block which has been appropriately corrected.

Thus, even if a case in which loss occurs at the initial end or at the final end, it is possible to appropriately restore the correct RS block by generating and verifying RS blocks which have been restored corresponding to the case. There is extremely rarely possible that a RS block which has been wrongly restored is corrected without trouble. In this case, however, the corrected block has a problem such that it is not satisfy the predetermined format. Accordingly, based on this, it can be judged that the block is not appropriately restored.

Seventh Embodiment

It is possible to embed closed information in a RS block as follow.

Figure 38:
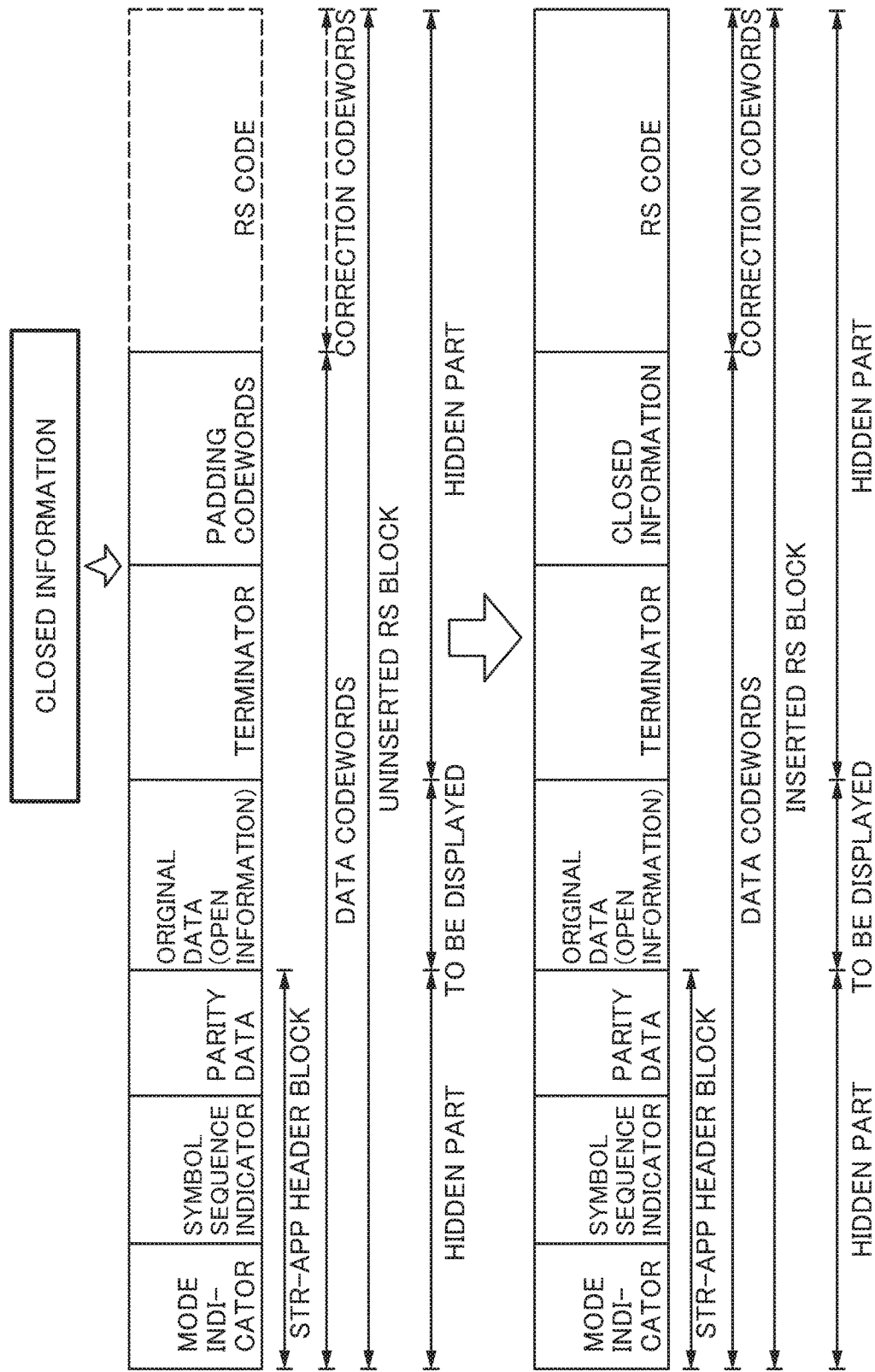
FIG. 38 is a schematic diagram of a RS block according to the seventh embodiment.

FIG. 38 is a schematic diagram of a RS block according to the seventh embodiment. FIG. 38 shows closed information, a mode indicator, a symbol sequence indicator, parity data, original data, a terminator, padding codewords and a RS code, as in FIG. 5 mentioned above. However, FIG. 38 is different from FIG. 5 in that the padding codewords are replaced with the closed information, and in that the RS code, which serves as the correction codewords, is generated after embedding the closed information.

If the total number of the obtained data codewords in a RS block does not reach the capacity of the RS block in conformance with JIS, a terminator, which indicates the end of the codewords of original data, is placed at the end of the codewords. In addition, padding codewords which does not represent data are placed in empty positions in the codeword region (the upper figure of FIG. 38). In the seventh embodiment, the closed information is changed to a part or the whole of padding codes and is placed after the terminator (the lower figure of FIG. 38). Afterward, the RS code, which serves as the correction codewords, is generated.

An inserted RS block is generated in the foregoing manner (in order to clarify the difference from the "replaced RS block", it is referred to as an "inserted RS block" in this example). A common decoder neglects the inserted RS block, and the codewords after the terminator is interpreted and discarded as padding codes not presenting data. And, only the original data can be read-out. On the other hand, an enhanced decoder which supports this format can extract, as closed information, data following the terminator.

Other Embodiments

In the foregoing embodiment, a standard QR code and an enhanced QR code are provided as an example of a 2D barcode. However, no matter of course this invention may be applied to other types of the 2D barcode. Masking a part of a 2D barcode with any type of protection masks (except for the masks in which a different use is defined; e.g. the foregoing standard mask patterns set forth in JIS) is within the scope of protection-encoding in the foregoing embodiments. Similarly, removing such a protection mask is within the scope of protection-decoding in the foregoing embodiments.

The above-described embodiments are merely for facilitating the understanding of the invention, but is not meant to be interpreted in a manner limiting the scope of the invention. The invention can of course be altered and improved without departing from the gist thereof, and equivalents are intended to be embraced therein.

REFERENCE SIGNS LIST 10 enhanced encoder,
11 control section, 11a operation section, 11b storage section,
13 display device, 14 printing device, 15 input device,
20 enhanced decoder,
21 control section, 21a operation section, 21b storage section,
22 imaging device, 23 display device, 24 printing device, 25 input device

The invention claimed is:

1. A method for concealing hidden-object information using a first 2D barcode and a second 2D barcode,
the first 2D barcode containing first open information and first closed information,
the second 2D barcode containing second open information and second closed information,
the method, comprising:
generating the first 2D barcode,
the first closed information of the first 2D barcode containing an identifier,
the identifier being for identifying a protection mask pattern,
the protection mask pattern being for protection-encoding the second 2D barcode; and
generating a protection-encoded second 2D barcode by applying the protection mask pattern to at least a part of the second 2D barcode in accordance with an XOR operation, the second closed information of the second 2D barcode containing the hidden-object information,
the open information being information that can be read-out with a standard decoder,
the closed information being information that cannot be read-out with the standard decoder but that can be extracted by an enhanced decoder.

2. A method for concealing hidden-object information according to claim 1, wherein
the first 2D barcode is generated based on a first replaced data block,
the first replaced data block being obtained by replacing a part of a data block with a first closed data codeword,
the data block containing a first open data codeword and a first correction codeword,
the first closed data codeword containing the first closed information,
the first open data codeword containing the first open information,
the first correction codeword being capable of correcting an error of the first open data codeword.

3. A method for concealing hidden-object information according to claim 2, wherein
the number of the first closed data codewords is not greater than the number of words that are corrected with the first correction codewords.

4. A method for concealing hidden-object information according to claim 2, wherein
the first open data codeword contains first parity information,
the first parity information is parity information of information in which the first open information and the second open information are concatenated in a predetermined method.

5. A method for concealing hidden-object information according to claim 4, wherein
the second 2D barcode is generated based on a second replaced data block,
the second replaced data block being obtained by replacing a part of a data block with a second closed data codeword,
the data block containing a second open data codeword and a second correction codeword,
the second closed data codeword containing the second closed information,
the second open data codeword containing the second open information,
the second correction codeword being capable of correcting an error of the second open data codeword.

6. A method for concealing hidden-object information according to claim 5, wherein
the number of the second closed data codewords is not greater than the number of words that are corrected with the second correction codewords.

7. A method for concealing hidden-object information according to claim 5, wherein
the second open data codeword contains second parity information, and
the second parity information is parity information of information in which the first open information and the second open information are concatenated in the predetermined method.

8. A method for concealing hidden-object information according to claim 1, wherein the method further comprises:
printing the first 2D barcode with a first ink; and
printing the protection-encoded second 2D barcode with a second ink,
the first ink and the second ink having different optical properties,
the printings are performed so that either one of the first 2D barcode and the protection-encoded second 2D barcode is superposed on the other 2D barcode.

9. A device for concealing hidden-object information using a first 2D barcode and a second 2D barcode,
the first 2D barcode containing first open information and first closed information,
the second 2D barcode containing second open information and second closed information,
the device, comprising:
generating the first 2D barcode,
the first closed information of the first 2D barcode containing an identifier,
the identifier being for identifying a protection mask pattern,
the protection mask pattern being for protection-encoding the second 2D barcode; and
generating a protection-encoded second 2D barcode by applying the protection mask pattern to at least a part of the second 2D barcode in accordance with an XOR operation,
the second closed information of the second 2D barcode containing the hidden-object information,
the open information being information that can be read-out with a standard decoder,
the closed information being information that cannot be read-out with the standard decoder but that can be extracted by an enhanced decoder.

10. A program causing a computer to perform a method for concealing hidden-object information using a first 2D barcode and a second 2D barcode,
the first 2D barcode containing first open information and first closed information,
the second 2D barcode containing second open information and second closed information,
the program causing a computer to perform the following processes:
generating the first 2D barcode,
the first closed information of the first 2D barcode containing an identifier,
the identifier being for identifying a protection mask pattern,
the protection mask pattern being for protection-encoding the second 2D barcode; and
generating a protection-encoded second 2D barcode by applying the protection mask pattern to at least a part of the second 2D barcode in accordance with an XOR operation,
the second closed information of the second 2D barcode containing the hidden-object information,
the open information being information that can be read-out with a standard decoder,
the closed information being information that cannot be read-out with the standard decoder but that can be extracted by an enhanced decoder.

11. A method for extracting hidden-object information for extracting the hidden-object information from a first 2D barcode and a protection-encoded second 2D barcode,
the first 2D barcode containing first open information and first closed information,
the first closed information containing an identifier, the protection-encoded second 2D barcode having been protection-encoded by applying a protection mask pattern to a second 2D barcode in accordance with an XOR operation,
the second 2D barcode containing second open information and second closed information,
the second closed information containing hidden-object information,
the protection mask pattern being identified by the identifier,
the method comprising:
reading the first 2D barcode and the protection-encoded second 2D barcode;
identifying the protection mask pattern based on the identifier;
protection-decoding a protection-encoded codeword of the protection-encoded second 2D barcode in accordance with an XOR operation using data protection mask pattern; and
extracting the hidden-object information from the second 2D barcode that has been obtained by protection-decoding the protection-encoded codeword.

12. A method for extracting hidden-object information according to claim 11, wherein
the first 2D barcode contains first parity information,
the second 2D barcode contains second parity information, and
under a condition that the first parity information coincides with the second parity information,
the hidden-object information contained in the second closed information is extracted from the second 2D barcode which has been obtained by protection-decoding the protection-encoded codeword.

13. A method for extracting hidden-object information according to claim 12, wherein
both of the first parity information and the second parity information are parity information of information in which the first open information and the second open information are concatenated in a predetermined method.

14. A method for extracting hidden-object information according to claim 13, wherein
the first 2D barcode is generated based on a first replaced data block,
the first replaced data block being obtained by replacing a part of a data block with a first closed data codeword,
the data block containing a first open data codeword and a first correction codeword,
the first closed data codeword containing the first closed information,
the first open data codeword containing the first open information,
the first correction codeword being capable of detecting and correcting an error of the first open data codeword.

15. A method for extracting hidden-object information according to claim 14, wherein
concerning identifying the protection mask pattern that is applied to the second 2D barcode based on the first closed information contained in the first 2D barcode,
the identifying further comprises:
extracting the first closed data codeword from a predetermined position in the first replaced data block; and
identifying the protection mask pattern based on the the identifier contained in the first closed data codeword.

16. A method for extracting hidden-object information according to claim 14, wherein
the number of the first closed data codewords is not greater than the number of words that are corrected with the first correction codewords.

17. A method for extracting hidden-object information according to claim 13, wherein
the second 2D barcode is generated based on a second replaced data block,
the second replaced data block being obtained by replacing a part of a data block with a second closed data codeword,
the data block containing a second open data codeword and a second correction codeword,
the second closed data codeword containing the second closed information,
the second open data codeword containing the second open information,
the second correction codeword being capable of detecting and correcting an error of the second open data codeword.

18. A method for extracting hidden-object information according to claim 17, wherein
concerning extracting the hidden-object information from the second 2D barcode that has been obtained by protection-decoding the protection-encoded codeword, the hidden-object information being contained in the second closed information,
the extracting further comprises:
extracting the second closed data codeword from a predetermined position in the second replaced data block; and
extracting the hidden-object information contained in the second closed data codeword.

19. A method for extracting hidden-object information according to claim 17, wherein
the number of the second closed data codewords is not greater than the number of words that are corrected with the second correction codewords.

20. A method for extracting hidden-object information according to claim 11, wherein
when the first 2D barcode and the protection-encoded second 2D barcode are printed so that either one of the first 2D barcode and the protection-encoded second 2D barcode is superposed on the other 2D barcode, and
when the first 2D barcode is printed with a first ink and the protection-encoded second 2D barcode is printed with a second ink,
the first ink and the second ink having different optical properties,
the first 2D barcode is read using a first light source that is for reading a subject printed with the first ink, and
the protection-encoded second 2D barcode is read using a second light source that is for reading a subject printed with the second ink.

21. A device for extracting the hidden-object information from a first 2D barcode and a protection-encoded second 2D barcode,
the first 2D barcode containing first open information and first closed information,
the first closed information containing an identifier,
the protection-encoded second 2D barcode having been protection-encoded by applying a protection mask pattern to a second 2D barcode in accordance with an XOR operation,
the second 2D barcode containing second open information and second closed information, the second closed information containing hidden-object information, the protection mask pattern data being identified by the identifier, the device comprising:

reading the first 2D barcode and the protection-encoded second 2D barcode;

identifying the protection mask pattern based on the identifier;

protection-decoding a protection-encoded codeword of the protection-encoded second 2D barcode in accordance with an XOR operation using the protection mask pattern; and extracting the hidden-object information from the second 2D barcode that has been obtained by protection-decoding the protection-encoded codeword.

22. A program causing a computer to perform a method for extracting the hidden-object information from a first 2D barcode and a protection-encoded second 2D barcode, the first 2D barcode containing first open information and first closed information, the first closed information containing an identifier, the protection-encoded second 2D barcode having been protection-encoded by applying a protection mask pattern to a second 2D barcode in accordance with an XOR operation, the second 2D barcode containing second open information and second closed information, the second closed information containing hidden-object information, the protection mask pattern being identified by the identifier, the program causing a computer to perform the following processes:

reading the first 2D barcode and the protection-encoded second 2D barcode;

identifying the protection mask pattern based on the identifier;

protection-decoding a protection-encoded codeword of the protection-encoded second 2D barcode in accordance with an XOR operation using the protection mask pattern; and extracting the hidden-object information from the second 2D barcode that has been obtained by protection-decoding the protection-encoded codeword.

* * * * *